US007882626B2

(12) United States Patent
Murayama et al.

(10) Patent No.: US 7,882,626 B2
(45) Date of Patent: Feb. 8, 2011

(54) METHOD OF MANUFACTURING WIRING BOARD HAVING A SEMICONDUCTOR THEREON

(75) Inventors: Kei Murayama, Nagano (JP); Mitsutoshi Higashi, Nagano (JP); Masahiro Sunohara, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 46 days.

(21) Appl. No.: 12/393,478

(22) Filed: Feb. 26, 2009

(65) Prior Publication Data

US 2009/0223046 A1 Sep. 10, 2009

(30) Foreign Application Priority Data

Feb. 29, 2008 (JP) ............................. 2008-050910

(51) Int. Cl.
*H05K 3/30* (2006.01)
(52) U.S. Cl. .............................. 29/832; 29/840; 29/846; 29/852; 257/698; 438/698
(58) Field of Classification Search .................. 29/825, 29/830, 832, 840, 846, 852; 257/698; 438/698
See application file for complete search history.

(56) References Cited

U.S. PATENT DOCUMENTS

| 6,796,024 | B2 * | 9/2004 | Katoh et al. | 29/832 |
| 2004/0154163 | A1 * | 8/2004 | Miyazaki et al. | 29/832 |
| 2004/0231141 | A1 * | 11/2004 | Nishinaka et al. | 29/609 |
| 2008/0245549 | A1 * | 10/2008 | Kodani et al. | 174/126.1 |
| 2009/0314525 | A1 * | 12/2009 | Kajino et al. | 174/255 |

FOREIGN PATENT DOCUMENTS

JP           2000-323613           11/2000

* cited by examiner

*Primary Examiner*—C. J Arbes
(74) *Attorney, Agent, or Firm*—Drinker Biddle & Reath LLP

(57) ABSTRACT

A method of manufacturing a wiring board having a semiconductor chip mounting surface for mounting a semiconductor chip thereon which is manufactured by a process including a step of forming a wiring layer and an insulating layer on a support board and a step of removing the support board, including a peeling layer forming step of forming a peeling layer on the support board formed by a material having a coefficient of thermal expansion which is equal to that of a semiconductor substrate constituting the semiconductor chip, and a support board removing step of removing the support board by carrying out a predetermined treatment over the peeling layer.

20 Claims, 49 Drawing Sheets

METHOD OF MANUFACTURING WIRING BOARD HAVING A SEMICONDUCTOR THEREON

TECHNICAL FIELD

The present disclosure relates to a method of manufacturing a wiring board and a method of manufacturing a semiconductor package. More particularly, the present disclosure relates to a method of manufacturing a wiring board having a semiconductor chip mounting surface mounting a semiconductor chip thereon, and a method of manufacturing a semiconductor package in which the semiconductor chip is mounted on the wiring board.

RELATED ART

For example, as a method of manufacturing a wiring board having a semiconductor chip mounting surface on which a semiconductor chip is to be mounted, there has been proposed a method of sequentially forming a predetermined wiring layer on a support board formed of Cu to form a buildup wiring layer and then removing the support board, thereby obtaining the wiring board.

Referring to the wiring board manufacturing method of this type, the support board is present in the formation of the buildup wiring layer. Therefore, the buildup wiring layer can be reliably formed with high precision. After the buildup wiring layer is formed, moreover, the support board is removed. Therefore, it is possible to reduce a thickness of the wiring board to be manufactured and to enhance an electrical characteristic.

FIGS. 1A and B are sectional views illustrating a wiring board 100 having a buildup wiring layer according to the related art. FIG. 1A shows a state in which the buildup wiring layer is not supported on a support board 111 and FIG. 1B shows a state in which the buildup wiring layer is supported on the support board 111. The buildup wiring layer is formed on the support board 111 as shown in FIG. 1B and the support board 111 is finally removed so that the wiring board 100 is obtained as shown in FIG. 1A.

With reference to FIG. 1A, the wiring board 100 includes the buildup wiring layer having a first insulating layer 160, a second insulating layer 210, a third insulating layer 240, a first wiring layer 170, a second wiring layer 200, a third wiring layer 230, a fourth wiring layer 260 and a solder resist 270.

The first insulating layer 160 is formed on the first wiring layer 170 and the second wiring layer 200 is formed on the first insulating layer 160. Furthermore, the second insulating layer 210 is formed to cover the second wiring layer 200 and the third wiring layer 230 is formed on the second insulating layer 210. In addition, the third insulating layer 240 is formed to cover the third wiring layer 230 and the fourth wiring layer 260 is formed on the third insulating layer 240.

The first wiring layer 170 is constituted to be exposed from the first insulating layer 160 and a surface of the first wiring layer 170 which is exposed from the first insulating layer 160 serves as a semiconductor chip mounting surface on which a semiconductor chip is to be mounted. The first wiring layer 170 functions as an electrode pad and is electrically connected to a corresponding electrode of the semiconductor chip. P1 denotes a pitch of the first wiring layer 170.

The first wiring layer 170 and the second wiring layer 200 are electrically connected to each other through a first via hole 160x formed on the first insulating layer 160. Moreover, the second wiring layer 200 and the third wiring layer 230 are electrically connected to each other through a second via hole 210x formed on the second insulating layer 210. Furthermore, the third wiring layer 230 and the fourth wiring layer 260 are electrically connected to each other through a third via hole 240x formed on the third insulating layer 240.

The solder resist 270 is formed on the fourth wiring layer 260. The solder resist 270 has an opening portion 270x on the fourth wiring layer 260. A portion of the fourth wiring layer 260 which corresponds to the opening portion 270x functions as an electrode pad to be electrically connected to a mother board, for example.

FIG. 2 is a sectional view illustrating a semiconductor package 800 in which a semiconductor chip 810 is mounted on the wiring board 100. With reference to FIG. 2, the semiconductor package 800 has the wiring board 100, a solder bump 290, the semiconductor chip 810, and an underfill resin 830. The semiconductor chip 810 has a structure in which a semiconductor integrated circuit (not shown) and an electrode pad (not shown) are formed on a semiconductor substrate (not shown) having a thickness reduced, and a ball-shaped terminal 820 serving as an electrode is formed on the electrode pad (not shown). P2 denotes a pitch of the ball-shaped terminal 820.

The solder bump 290 (a bonding metal) is formed on the first wiring layer 170 of the wiring board 100. The ball-shaped terminal 820 of the semiconductor chip 810 is electrically connected to the solder bump 290 of the wiring board 100. The underfill resin 830 is filled between the semiconductor chip 810 and the first insulating layer 160 (for example, see Patent Document 1).

[Patent Document 1] JP-A-2000-323613 Publication

As shown in FIG. 1A, the wiring board 100 has a structure in which the wiring layer and the insulating layer are formed. In a process for manufacturing the wiring board 100, the wiring layer and the insulating layer are formed on the support board formed of Cu and the support board is finally removed. The support board formed of Cu has a coefficient of thermal expansion of approximately 18 ppm/° C. In the case in which Cu is used for each wiring layer, for example, the coefficient of thermal expansion is approximately 18 ppm/° C. In the case in which an epoxy based resin is used for each insulating layer, the coefficient of thermal expansion is approximately 55 ppm/° C.

In the process for manufacturing the wiring board 100, the step of forming the wiring layer and the insulating layer on the support board formed of Cu is carried out at a high temperature of approximately 190° C. When the step of forming the wiring layer and the insulating layer is ended, moreover, subsequent steps are carried out at an ordinary temperature and the support board formed of Cu is removed by wet etching at a final step.

Thus, heating and cooling are repeated in the process for manufacturing the wiring board 100. As a result, a warpage or a distortion is caused by a thermal stress due to a difference in the coefficient of thermal expansion between the wiring layer and the insulating layer. However, the coefficient of thermal expansion of the support board for supporting the wiring layer and the insulating layer is also equal to that of the wiring layer. For this reason, it is impossible to suppress a generation of the warpage or the distortion. As a result, in some cases, the pitch P1 of the first wiring layer 170 serving as the electrode pad to be electrically connected to a corresponding electrode of the semiconductor chip is shifted from a desirable pitch in the completion of the wiring board 100.

On the other hand, the semiconductor chip 810 in the semiconductor package 800 shown in FIG. 2 has the structure in which the semiconductor integrated circuit (not shown) and the electrode pad (not shown) are formed on the semiconductor substrate (not shown) having the thickness reduced and the ball-shaped terminal 820 serving as an electrode is formed on the electrode pad (not shown). For example, in the case in which silicon is used for the semiconductor substrate, it has a low coefficient of thermal expansion, that is, approximately 3 to 4 ppm/° C. and the pitch P2 of the ball-shaped terminal 820 serving as an electrode is not greatly shifted from a desirable pitch.

In some cases in which the solder bump 290 is formed on the first wiring layer 170 of the wiring board 100 and the solder bump 290 of the wiring board 100 is electrically connected to the ball-shaped terminal 820 of the semiconductor chip 810, accordingly, the pitch is shifted between the solder bump 290 and the ball-shaped terminal 820.

The shift of the pitch is not a great problem when the related-art wiring board 100 and the semiconductor chip 810, in which the pitches P1 and P2 are comparatively large, that is, approximately 100 μm to 200 μm as represented by a C4 bump pitch, are electrically connected to each other. When a wiring board and a semiconductor chip, in which the pitches P1 and P2 are smaller than 100 μm and a solder bump and a ball-shaped terminal which are to correspond thereto also have sizes reduced, are to be electrically connected to each other, however, there is a problem in that it is hard to connect desirable portions to each other.

SUMMARY

Exemplary embodiments of the present invention provide a method of manufacturing a wiring board which can reduce a shift, from a desirable pitch, of a pitch of an electrode pad to be electrically connected to a semiconductor chip and a method of manufacturing a semiconductor package which can reduce a shift of the pitch of the electrode pad of the wiring board from a pitch of an electrode of the semiconductor chip to be electrically connected to the electrode pad.

A first aspect of the invention is directed to a method of manufacturing a wiring board having a semiconductor chip mounting surface for mounting a semiconductor chip thereon, the method comprising:

a peeling layer forming step of forming a peeling layer on a support board formed by a material having a coefficient of thermal expansion which is equal to that of a semiconductor substrate constituting the semiconductor chip;

a wiring layer and insulating layer forming step of forming a wiring layer and an insulating layer on the support board; and a support board removing step of removing the support board by carrying out a treatment over the peeling layer.

A second aspect of the invention is directed to a method of manufacturing a semiconductor package including a semiconductor chip mounting step of mounting the semiconductor chip on the semiconductor chip mounting surface in the wiring board manufactured by the manufacturing method according to the first aspect of the invention, and a resin filling step of filling a resin between the semiconductor chip mounting surface and the semiconductor chip.

According to the invention, it is possible to provide a method of manufacturing a wiring board which can reduce a shift, from a desirable pitch, of a pitch of an electrode pad to be electrically connected to a semiconductor chip and a method of manufacturing a semiconductor package which can reduce a shift of the pitch of the electrode pad from a pitch of an electrode of the semiconductor chip to be electrically connected to the electrode pad.

Other features and advantages may be apparent from the following detailed description, the accompanying drawings and the claims.

DETAILED DESCRIPTION

The best mode for carrying out the invention will be described below with reference to the drawings.

First Embodiment

Figure 1A:
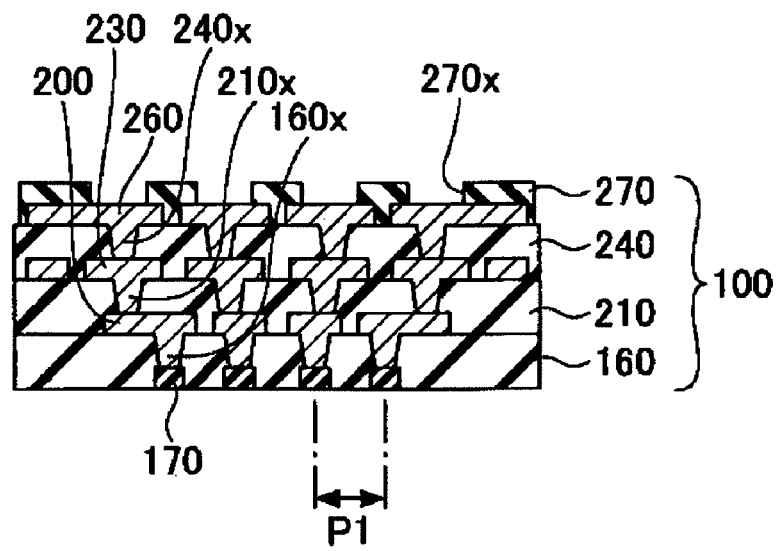
FIGS. 1A and 1B are sectional views illustrating a wiring board 100 having a buildup wiring layer according to the related art.
Figure 1B:
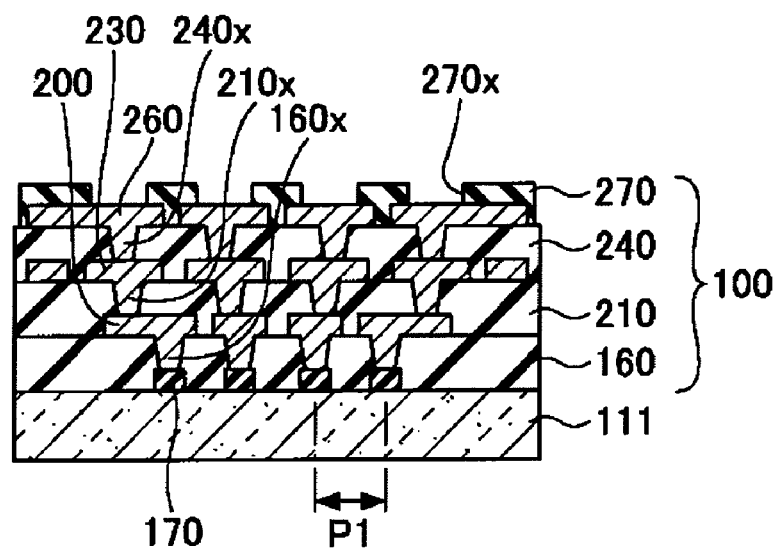
Figure 2:
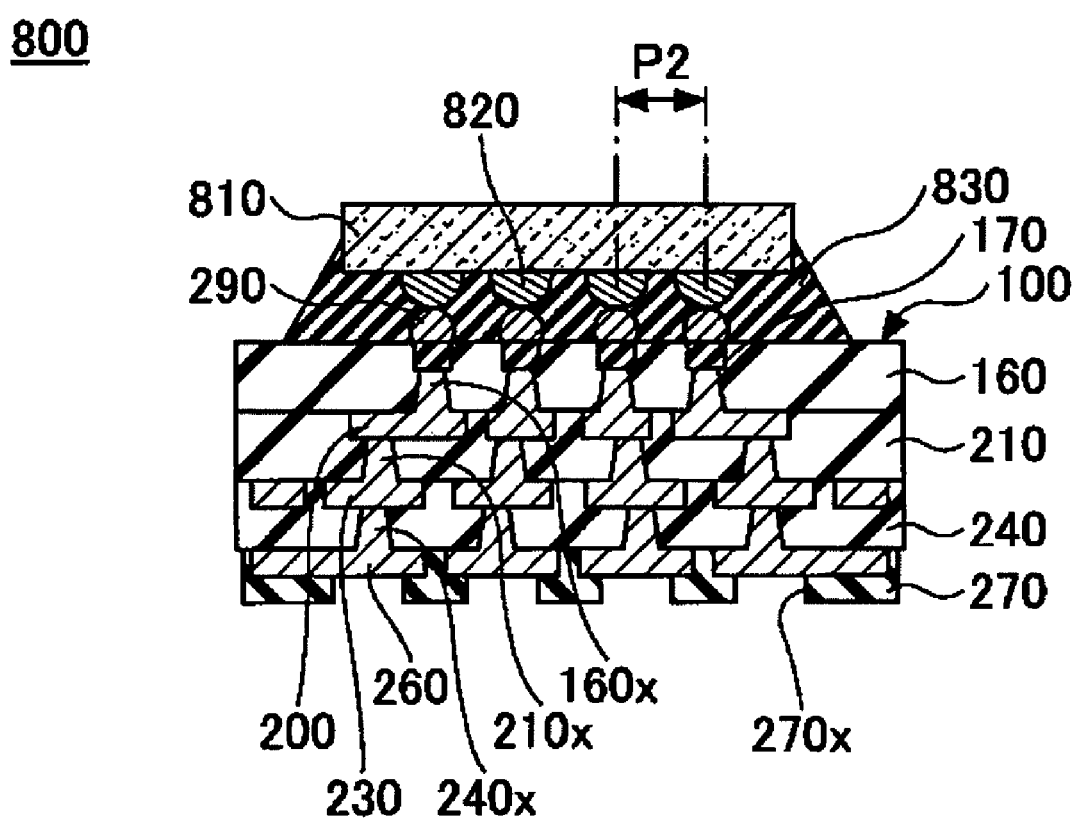
FIG. 2 is a sectional view illustrating a semiconductor package 800 mounting a semiconductor chip 810 on the wiring board 100.
Figure 3:
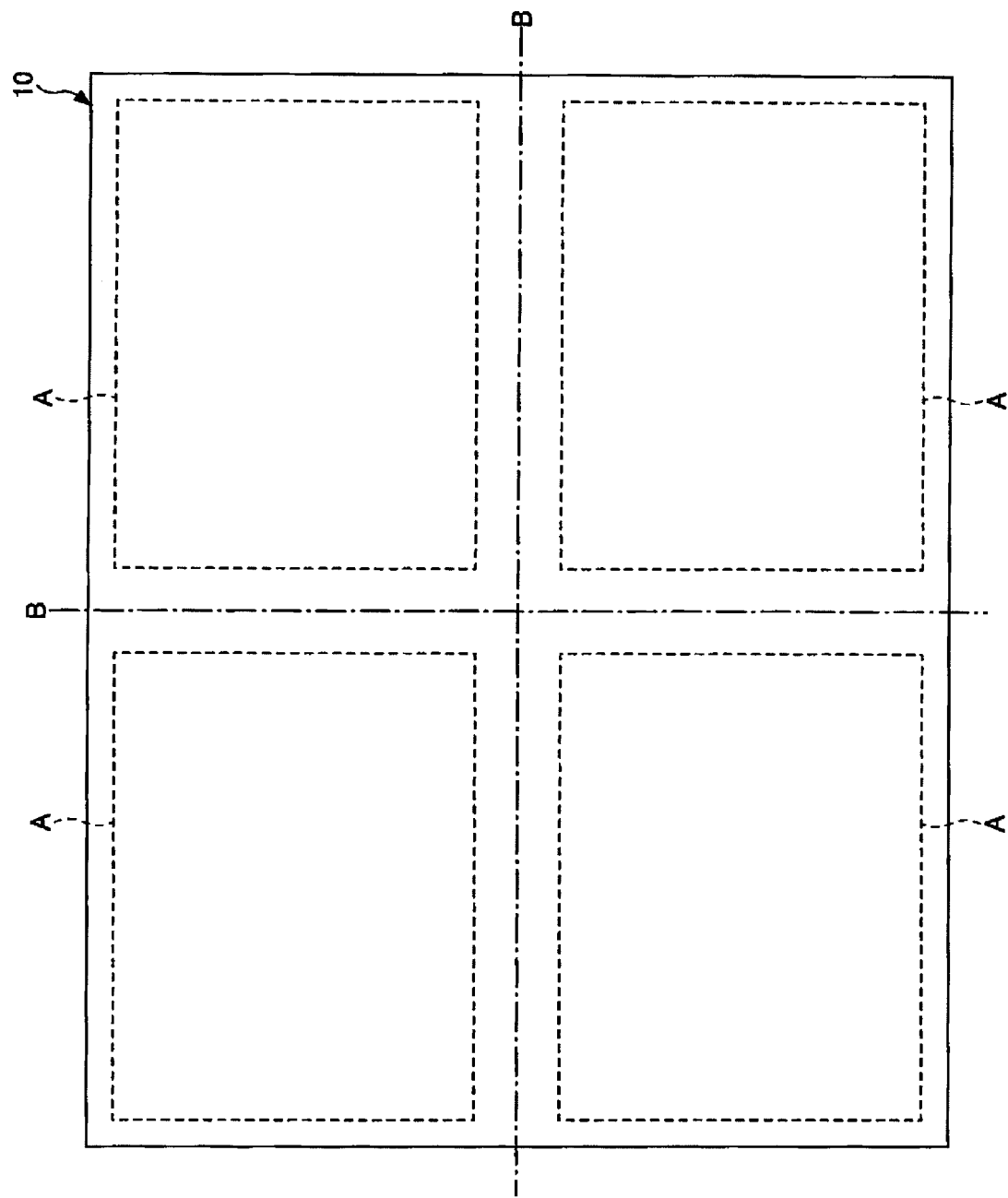
FIG. 3 is a plan view illustrating an assembly wiring board 10 having a buildup wiring layer according to a first embodiment of the invention.
Figure 4:
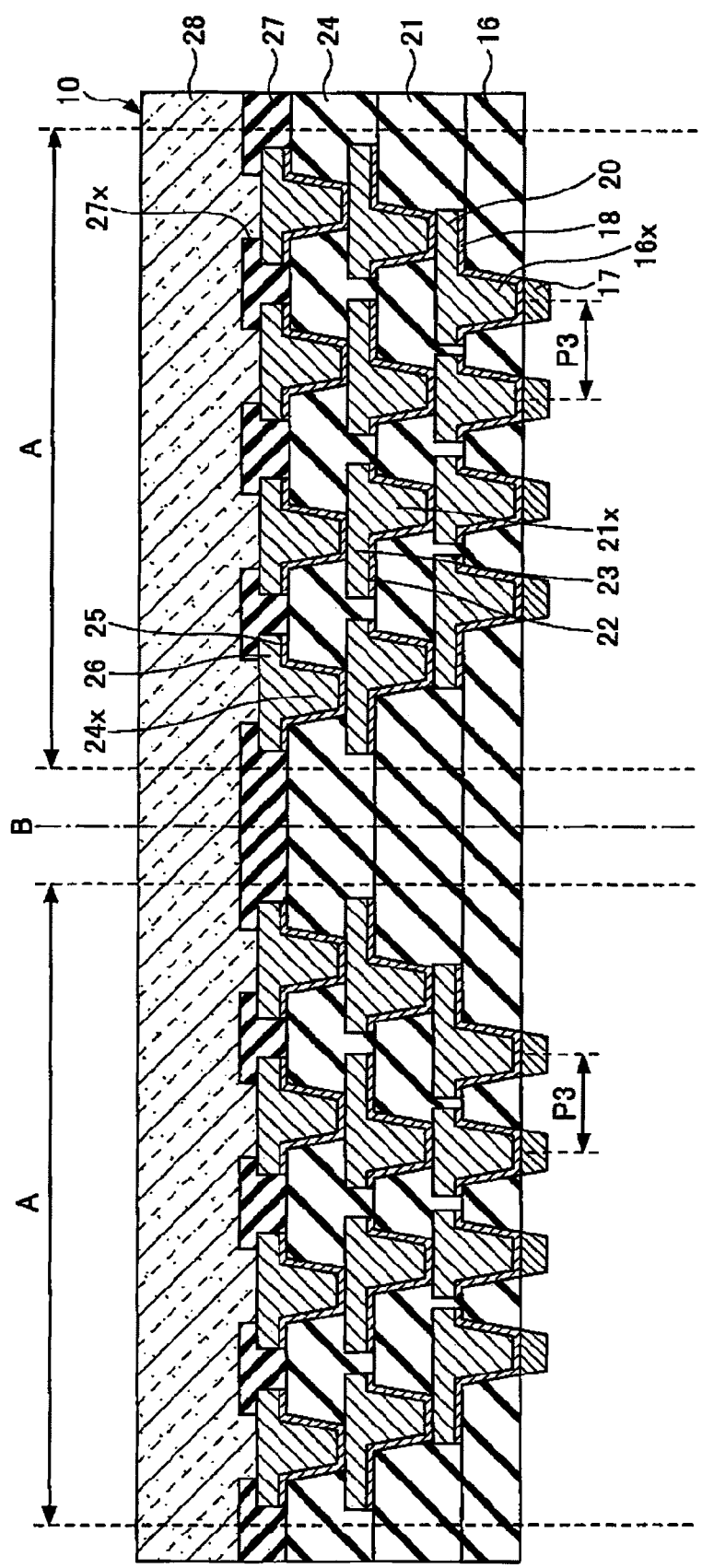
FIG. 4 is a sectional view illustrating the assembly wiring board 10 having the buildup wiring layer according to the first embodiment of the invention.

FIG. 3 is a plan view illustrating an assembly wiring board 10 having a buildup wiring layer according to a first embodiment of the invention. FIG. 4 is a sectional view illustrating the assembly wiring board 10 having the buildup wiring layer according to the first embodiment of the invention.

With reference to FIG. 3, the assembly wiring board 10 has a plurality of buildup wiring layer forming regions A. The wiring board having the buildup wiring layer forming regions A will be referred to as an assembly wiring board for convenience. B denotes a position in which the assembly wiring board 10 is to be cut by means of a dicing blade (which will be hereinafter referred to as a "cutting position B")

The assembly wiring board 10 is cut in the cutting position B and is thus divided into individual pieces so that a wiring board 10a is obtained. An outside dimension of the assembly wiring board 10 can be set to be W 400 mm×D 300 mm×H 2 mm, for example. FIG. 3 shows an example of the assembly wiring board in which a single assembly wiring board 10 is cut into individual pieces so that four wiring boards 10a are manufactured, and the number of the assemblies is not restricted thereto.

With reference to FIG. 4, the assembly wiring board 10 has a buildup wiring layer constituted by a first insulating layer 16, a second insulating layer 21, a third insulating layer 24, a first wiring layer 17, a second wiring layer 20, a third wiring layer 23, a fourth wiring layer 26, a second metal layer 18, a third metal layer 22, a fourth metal layer 25, a solder resist 27 and an auxiliary board 28. In the assembly wiring board 10, the auxiliary board 28 may be removed.

The second metal layer 18 and the second wiring layer 20 are formed on the first insulating layer 16. Furthermore, the second insulating layer 21 is formed to cover the second wiring layer 20, and the third metal layer 22 and the third wiring layer 23 are formed on the second insulating layer 21. In addition, the third insulating layer 24 is formed to cover the third wiring layer 23 and the fourth metal layer 25 and the fourth wiring layer 26 are formed on the third insulating layer 24.

The first insulating layer 17 is exposed from the first insulating layer 16, and a surface where the first wiring layer 17 is exposed from the first insulating layer 16 serves as a semiconductor chip mounting surface on which a semiconductor chip is to be mounted. The first wiring layer 17 functions as an electrode pad and is electrically connected to a corresponding electrode of the semiconductor chip. P3 denotes a pitch of the first wiring layer 17.

The first wiring layer 17 and the second metal layer 18 and second wiring layer 20 are electrically connected to each other through a first via hole 16x formed on the first insulating layer 16. Moreover, the second wiring layer 20 and the third metal layer 22 and third wiring layer 23 are electrically connected to each other through a second via hole 21x formed on the second insulating layer 21. Furthermore, the third wiring layer 23 and the fourth metal layer 25 and fourth wiring layer 26 are electrically connected to each other through a third via hole 24x formed on the third insulating layer 24.

The solder resist 27 having an opening portion 27x is formed to cover the fourth wiring layer 26. The auxiliary board 28 is provided on the solder resist 27. The auxiliary board 28 is provided to increase a mechanical strength of the assembly wiring board 10 and is removed after a step of mounting the semiconductor chip on the assembly wiring board 10, for example. After the auxiliary board 28 is removed, a portion of the fourth wiring layer 26 which corresponds to the opening portion 27x functions as an electrode pad to be electrically connected to a mother board, for example.

Next, description will be given to a method of manufacturing the assembly wiring board 10 and the wiring board 10a. FIGS. 5 to 24 are views illustrating a process for manufacturing the assembly wiring board 10 and the wiring board 10a according to the first embodiment of the invention. In FIGS. 5 to 24, the same components as those in FIGS. 3 and 4 have the same reference numerals and description thereof will be omitted.

Figure 5:
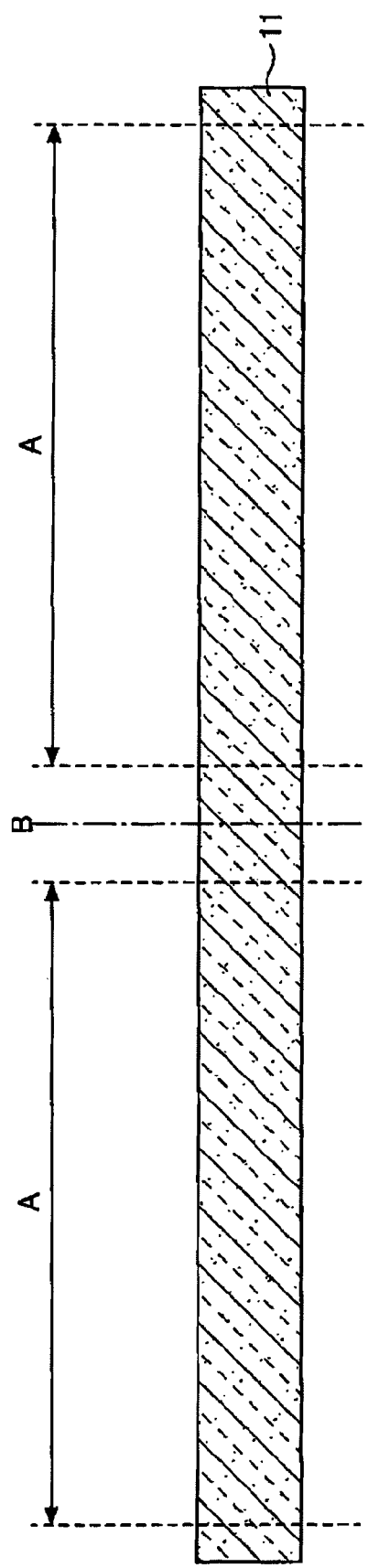
FIG. 5 is a view (No. 1) illustrating a process for manufacturing the assembly wiring board 10 and a wiring board 10*a* according to the first embodiment of the invention.

First of all, at a step shown in FIG. 5, a support board 11 is prepared. As the support board 11, for example, it is possible to use silicon (a coefficient of thermal expansion: approximately 3 to 4 ppm/° C.) or a material having a coefficient of thermal expansion which is equal to that of the silicon. A range of the coefficient of thermal expansion of the material which can be used as the support board 11 (a range of the coefficient of thermal expansion which is equal to that of the silicon constituting a semiconductor substrate) is 0 to 6 ppm/° C., and a suitable range of the coefficient of thermal expansion is 3 to 4 ppm/° C.

Moreover, a corresponding region to a semiconductor chip mounting region C (see FIG. 36 which will be described below) on which the semiconductor chip is to be mounted, that is, a part of the buildup wiring layer forming region A is constituted by the silicon or the material having the coefficient of thermal expansion which is equal to that of the silicon, and the other regions may be constituted by other materials.

In addition, the corresponding region to the semiconductor chip mounting region C (see FIG. 36 which will be described below) on which the semiconductor chip is to be mounted, that is, a part of the buildup wiring layer forming region A is constituted by the silicon and the other regions may be constituted by the materials having the coefficient of thermal expansion which is equal to that of the silicon.

As the material having the coefficient of thermal expansion which is equal to that of the silicon, for example, it is possible to use a borosilicate glass. The borosilicate glass contains boric acid ($B_2O_3$) and silicic acid ($SiO_2$) as main components and has a coefficient of thermal expansion of approximately 3 ppm/° C. A thickness of the support board 11 can be set to be 200 μm to 2000 μm, for example.

The reason why the silicon or the material having the equal coefficient of thermal expansion to that of the silicon is used as the silicon board 11 is that the semiconductor substrate constituting the semiconductor chip to be mounted after a completion of the assembly wiring board 10 or the wiring board 10a is formed of the silicon. More specifically, by using, as the support board 11, the material having the equal coefficient of thermal expansion to that of the semiconductor substrate constituting the semiconductor chip to form the buildup wiring layer on the support board 11, a warpage or a distortion is caused by a thermal stress with difficulty over the buildup wiring layer supported on the support board 11 formed of the silicon having a low coefficient of thermal expansion even if heating and cooling are repeated in a process for manufacturing the assembly wiring board 10 and the wiring board 10a.

As a result, in the completion of the assembly wiring board 10 and the wiring board 10a, the pitch P3 of the first wiring layer 17 serving as an electrode pad to be electrically connected to a corresponding electrode of the semiconductor chip is not greatly shifted from a desirable pitch but can be controlled to be almost equal to a shift, from a desirable pitch, of a pitch of the electrode provided on the electrode pad of the semiconductor substrate formed of the silicon.

At a step shown in FIG. 6, subsequently, a resist film 12 is formed on an upper surface of the support board 11. As the resist film 12, for example, it is possible to use a dry film. At a step shown in FIG. 7, next, a patterning treatment such as an exposure is carried out over the resist film 12 to form an opening portion 12x in a corresponding part to a position in which a concave portion 13 is to be formed (see FIG. 8 which will be described below). It is also possible to previously form the opening portion 12x for the resist film 12 taking a shape of a dry film and to dispose, on the support board 11, the resist film 12 having the opening portion 12x formed thereon.

Figure 8:
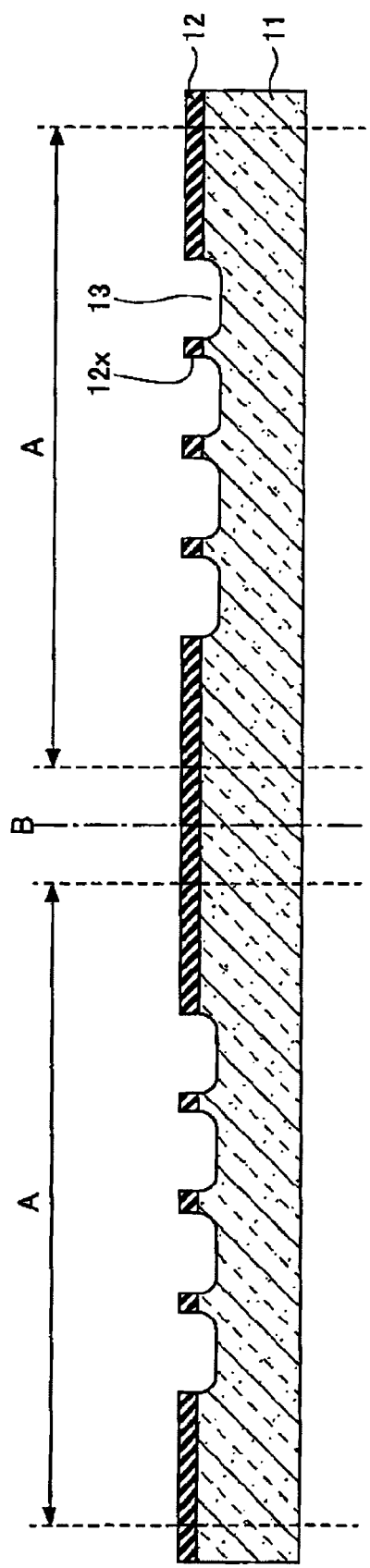
FIG. 8 is a view (No. 4) illustrating the process for manufacturing the assembly wiring board 10 and the wiring board 10*a* according to the first embodiment of the invention.

At a step shown in FIG. 8, then, a concave portion 13 is formed by anisotropic dry etching or anisotropic wet etching in a corresponding position to the opening portion 12x provided on the upper surface of the support board 11. A depth of the concave portion 13 can be set to be 0.5 μm to 20 μm, for example. Moreover, the concave portion 13 takes an almost circular shape seen on a plane and can be set to have a diameter of 1 μm to 50 μm and a pitch of 2 μm to 100 μm, for example. The concave portion 13 is a dent for forming a first wiring layer 17 at a step shown in FIG. 15 which will be described below.

Figure 9:
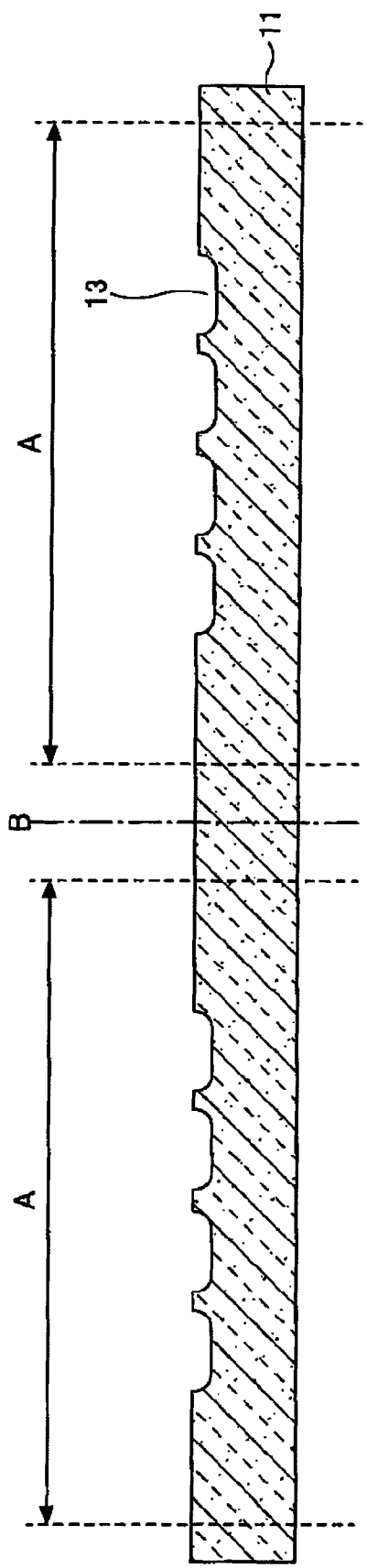
FIG. 9 is a view (No. 5) illustrating the process for manufacturing the assembly wiring board 10 and the wiring board 10*a* according to the first embodiment of the invention.

At a step shown in FIG. 9, thereafter, the resist film 12 shown in FIG. 8 is removed. At a step shown in FIG. 10, subsequently, a first metal layer 14 is formed on the upper surface of the support board 11 by an electroless plating method or a sputtering method. The first metal layer 14 serves as a plated feeding layer (a seed layer) when the first wiring layer 17 is to be formed by an electrolytic plating method (see FIG. 15 which will be described below).

As a material of the first metal layer 14, for example, it is possible to use Ti or Ti/Cu (a structure in which a Cu layer is laminated on a Ti layer). In case of Ti, the first metal layer 14 can be set to have a thickness of 0.5 μm to 1.0 μm, for example. In case of Ti/Cu (a structure in which the Cu layer is laminated on the Ti layer), for example, Ti can be set to have a thickness of 0.1 μm to 1.0 μm and Cu can be set to have a thickness of 0.1 μm to 1.0 μm. As a material of the first metal layer 14, moreover, it is also possible to use Pt, Au, Cr, Cr/Au (a structure in which an Au layer is laminated on a Cr layer), and Ti/Au (a structure in which the Au layer is laminated on the Ti layer).

By selecting, as the first metal layer 14, a metal having a low adhesion to the first wiring layer 17, it is easy and suitable to peel the first wiring layer 17 from the first metal layer 14 when removing the support board 11.

Figure 11:
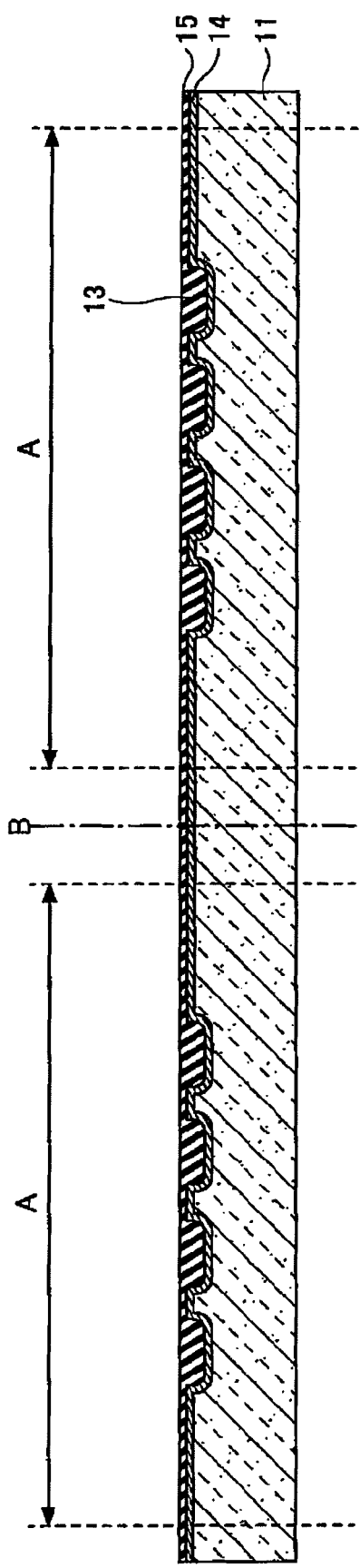
FIG. 11 is a view (No. 7) illustrating the process for manufacturing the assembly wiring board 10 and the wiring board 10*a* according to the first embodiment of the invention.

At a step shown in FIG. 11, next, a peeling layer 15 is formed on the first metal layer 14. The peeling layer 15 is used for removing the support board 11 (see FIG. 23 which will be described below). The peeling layer 15 can be formed by sticking a pressure sensitive adhesive double coated tape of a thermal foaming type which has an adhesive strength at an ordinary temperature and is peeled easily with a reduction in the adhesive strength by heating (applying a thermal energy), for example.

Moreover, it is also possible to form the peeling layer 15 by sticking a pressure sensitive adhesive double coated tape of a UV (ultraviolet) foaming type which has an adhesive strength under a natural light and is peeled easily with a reduction in the adhesive strength by irradiating ultraviolet rays (applying a light energy having a specific strength) or a pressure sensitive adhesive double coated tape of a solvent dissolving type which is peeled easily with a reduction in an adhesive strength by a dissolution in a solvent. Furthermore, it is also possible to form the peeling layer 15 by coating a fluororesin. The peeling layer 15 can be set to have a thickness of 0.5 μm to 100 μm, for example.

Figure 12:
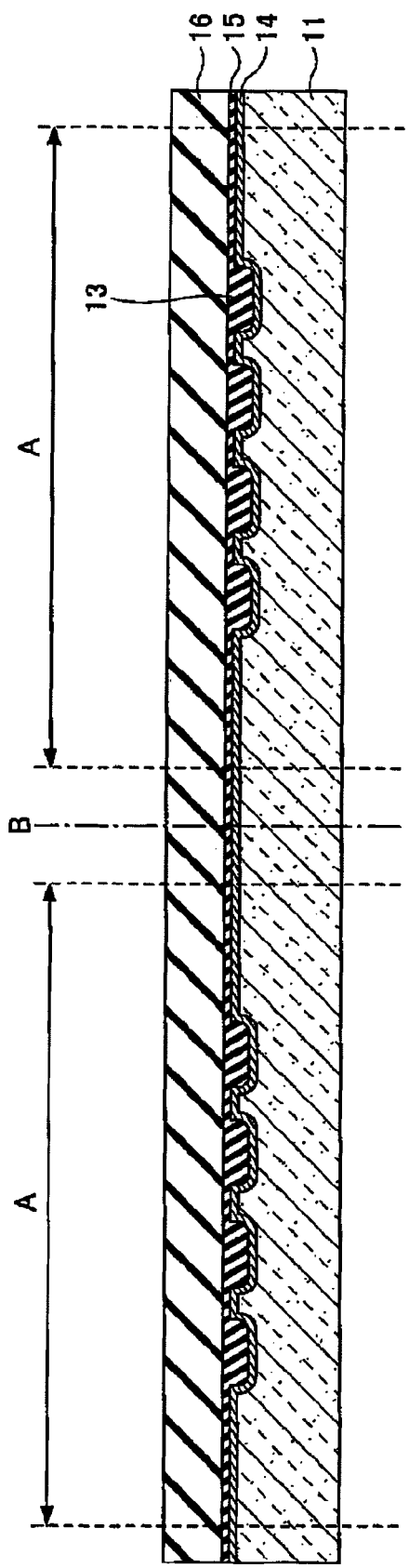
FIG. 12 is a view (No. 8) illustrating the process for manufacturing the assembly wiring board 10 and the wiring board 10*a* according to the first embodiment of the invention.

At a step shown in FIG. 12, then, a first insulating layer 16 is formed on the peeling layer 15. As a material of the first insulating layer 16, it is possible to use a resin material such as an epoxy based resin or a polyimide based resin. As an example of a method of forming the first insulating layer 16, a resin film is provided on the peeling layer 15 and is then pressed, and is thereafter cured by a heat treatment at a temperature of approximately 190° C. Thus, the first insulating layer 16 can be obtained.

Figure 13:
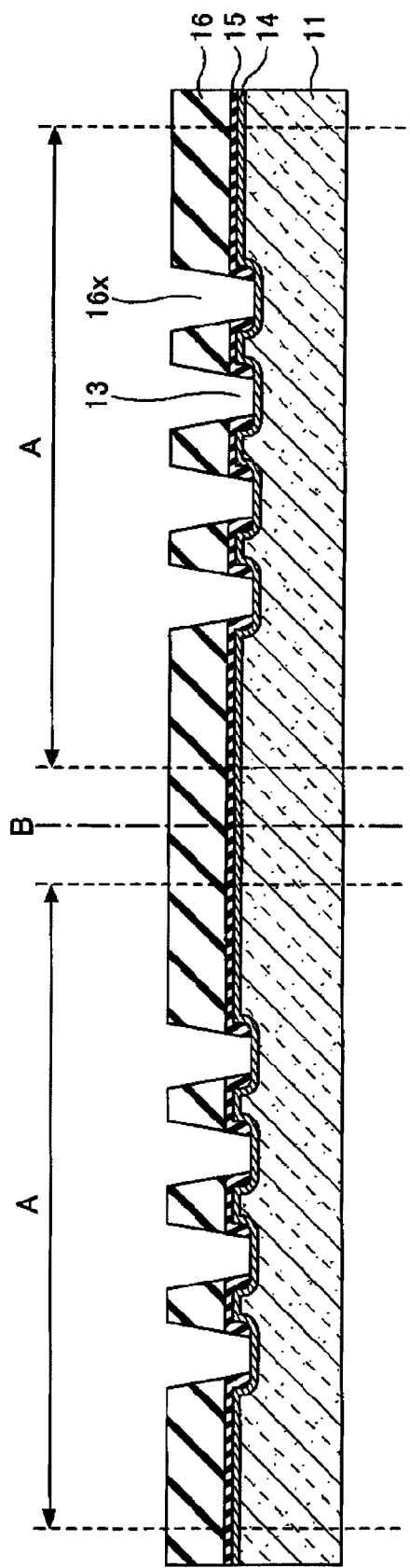
FIG. 13 is a view (No. 9) illustrating the process for manufacturing the assembly wiring board 10 and the wiring board 10*a* according to the first embodiment of the invention.

At a step shown in FIG. 13, subsequently, a first via hole 16x to be a through hole penetrating the peeling layer and the first insulating layer 16 is formed by a laser processing method in such a manner that the first metal layer in a corresponding position to the concave portion 13 is exposed. As a laser, for example, it is possible to use a $CO_2$ laser or a YAG laser.

Figure 14:
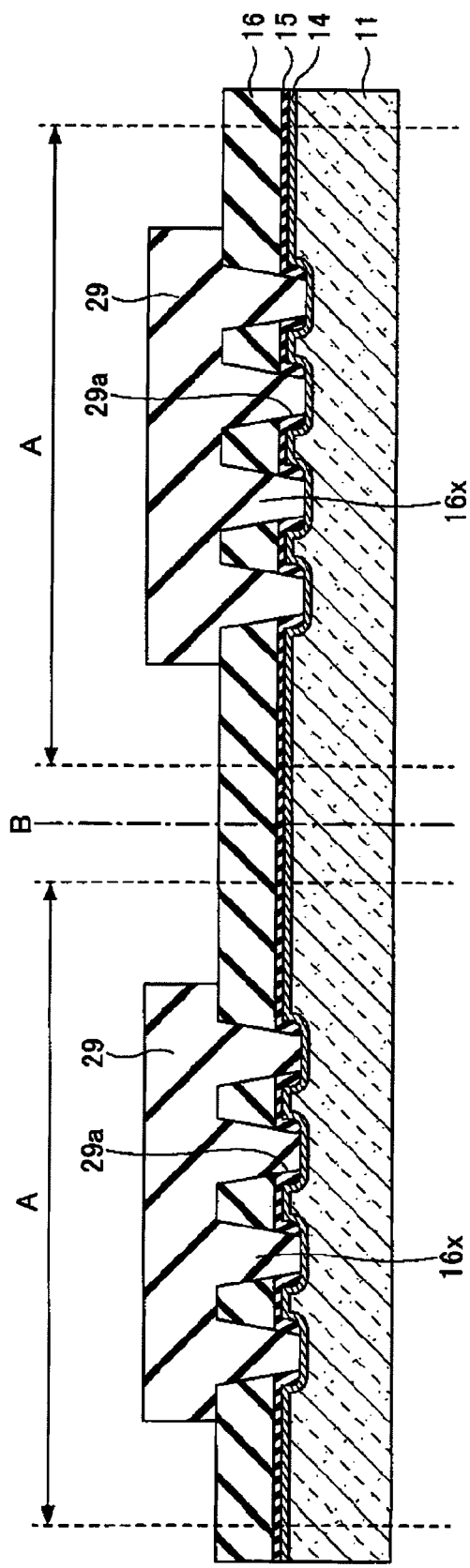
FIG. 14 is a view (No. 10) illustrating the process for manufacturing the assembly wiring board 10 and the wiring board 10*a* according to the first embodiment of the invention.

As shown in FIG. 14, the first via hole 16x may be formed by using a method of carrying out an imprint utilizing a stamper 29 having a surface on which a convex shape 29a corresponding to the first via hole 16x is formed and transferring the convex shape 29a. As the imprint, for example, it is possible to use a thermal imprint for heating a transferred member to approximately 120° C. and pressing the stamper 29, thereby transferring a predetermined shape onto the transferred member.

Although FIG. 14 shows the example in which the first via hole 16x is formed in the single buildup wiring layer forming region A by using the single stamper 29 provided with the convex shape 29a corresponding to the single buildup wiring layer forming region A, it is also possible to form the first via hole 16x in the buildup wiring layer forming regions A by using a single stamper provided with convex shapes corresponding to the buildup wiring layer forming regions A.

Figure 15:
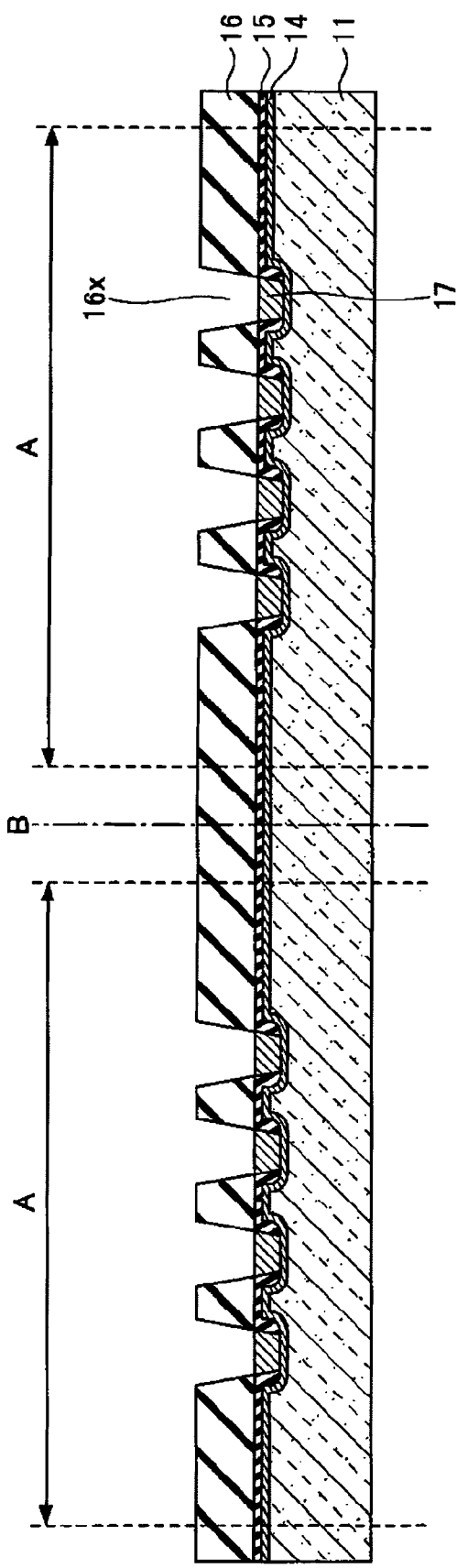
FIG. 15 is a view (No. 11) illustrating the process for manufacturing the assembly wiring board 10 and the wiring board 10*a* according to the first embodiment of the invention.

At a step shown in FIG. 15, next, the first wiring layer 17 constituted by a solder is formed on the first metal layer 14 opened through the first via hole 16x by an electrolytic plating method utilizing the first metal layer 14 for a plated feeding layer (a seed layer). The first wiring layer 17 may be formed by supplying a fused solder through an ink jet method. Moreover, the first wiring layer 17 constituted by a surface plated layer and a first wiring layer body may be formed by an electrolytic plating method or a electroless plating method which utilizes the first metal layer 14 for the plated feeding layer (the seed layer).

The surface plated layer can have a structure in which a layer exposed to an outside is formed of Au in the completion of the assembly wiring board 10 and the wiring board 10a, for example, a structure in which only an Au film is formed on the first metal layer 14, a structure in which an Au film and an Ni film are sequentially laminated or a structure in which an Au film, a Pd film and an Ni film are sequentially laminated. The Au film constituting the surface plated layer can be set to have a thickness of 0.01 μm to 1 μm, for example. Subsequently, the first wiring layer body formed of Cu can be provided on the surface plated layer by plating. The first wiring layer 17 functions as an electrode pad to be electrically connected to the corresponding electrode of the semiconductor chip.

Figure 16:
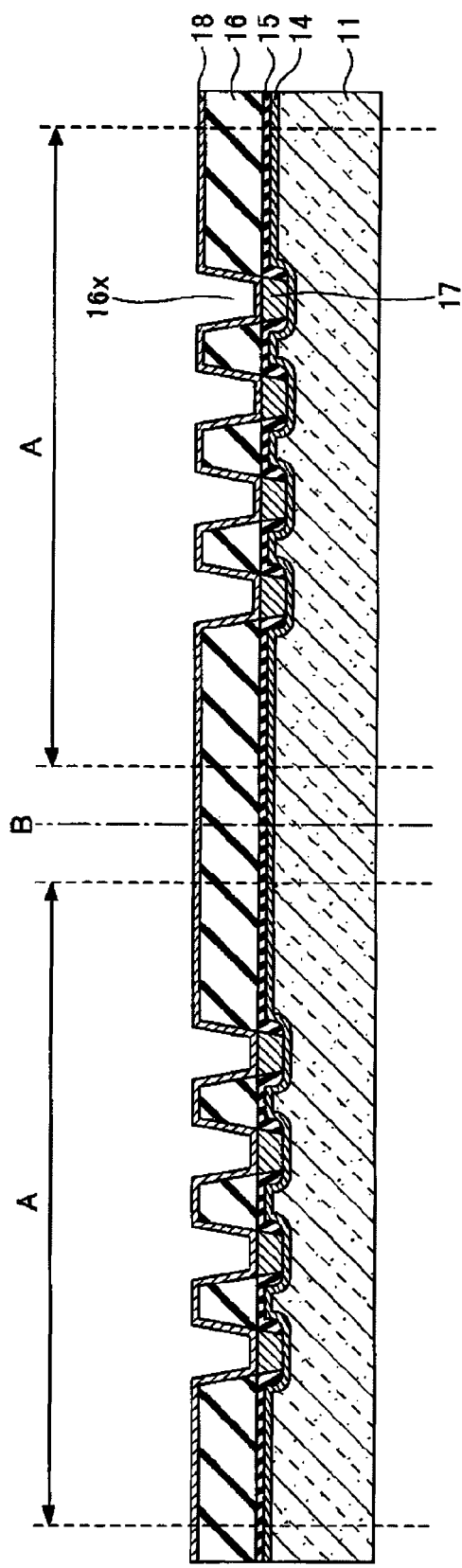
FIG. 16 is a view (No. 12) illustrating the process for manufacturing the assembly wiring board 10 and the wiring board 10*a* according to the first embodiment of the invention.

At a step shown in FIG. 16, then, a second metal layer 18 is formed on the first insulating layer 16 and the first wiring layer 17 by using the electroless plating method. The second metal layer 18 serves as a plated feeding layer (a seed layer) when forming a second wiring layer 20 by the electrolytic plating method (see FIG. 19 which will be described below). As a material of the second metal layer 18, for example, it is possible to use Cu. The second metal layer 18 can be set to have a thickness of 0.5 μm to 1.0 μm, for example.

Figure 17:
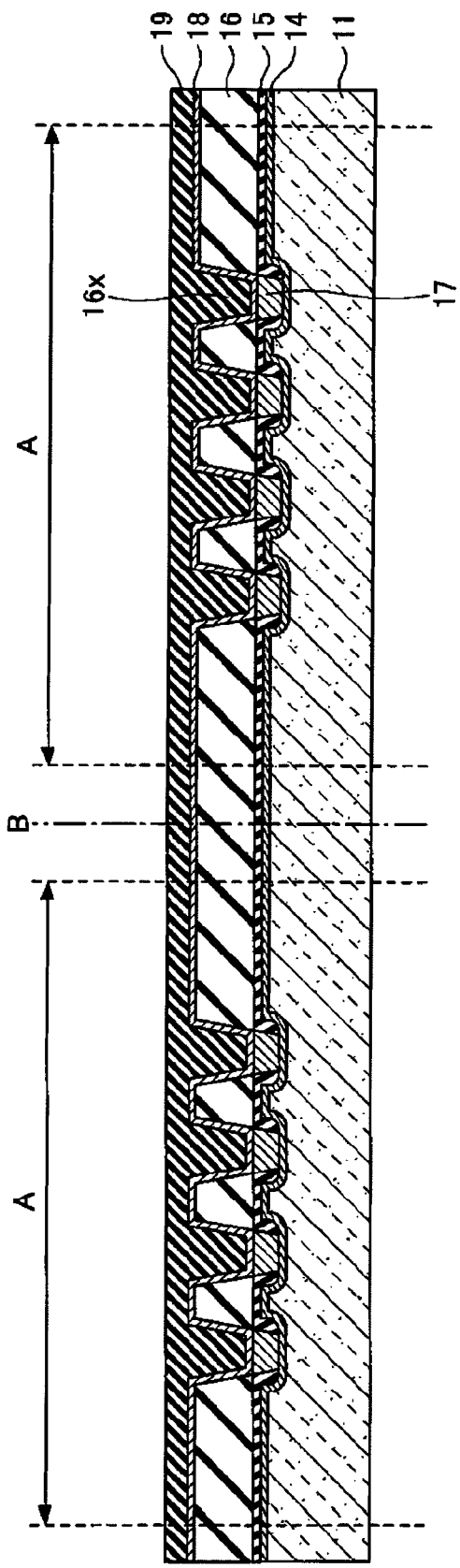
FIG. 17 is a view (No. 13) illustrating the process for manufacturing the assembly wiring board 10 and the wiring board 10*a* according to the first embodiment of the invention.
Figure 18:
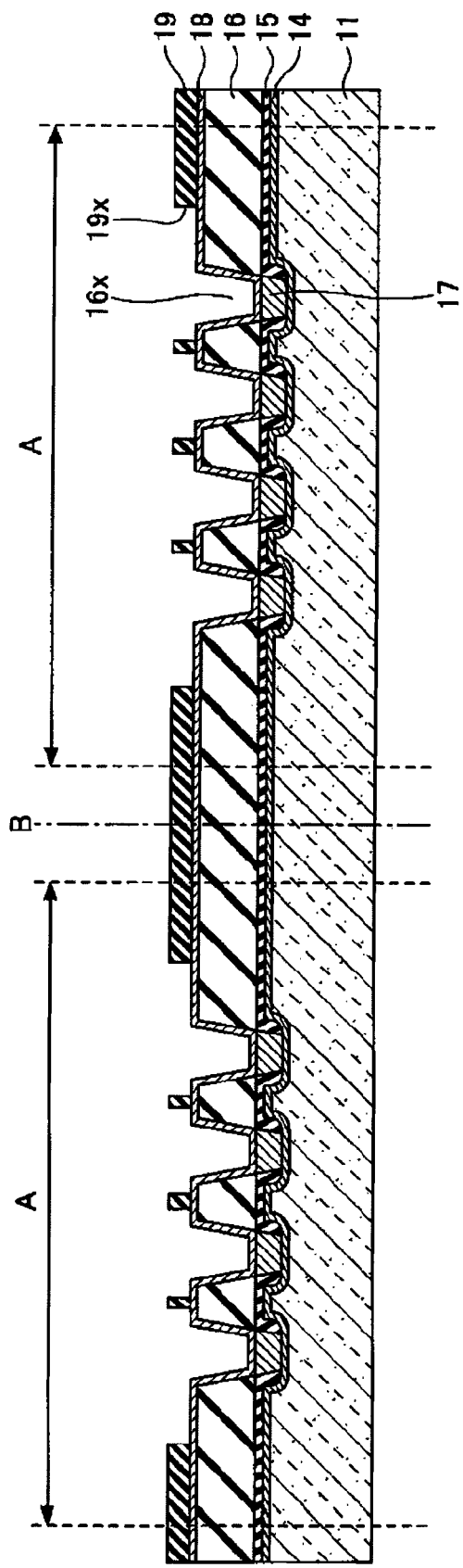
FIG. 18 is a view (No. 14) illustrating the process for manufacturing the assembly wiring board 10 and the wiring board 10*a* according to the first embodiment of the invention.

At a step shown in FIG. 17, thereafter, a resist film 19 is formed on the second metal layer 18. As the resist film 19, for example, it is possible to use a dry film. As a step shown in FIG. 18, subsequently, a patterning treatment such as an exposure is carried out over the resist film 19 to form an opening portion 19x in a corresponding portion to a position in which a second wiring layer 20 is to be formed (see FIG. 19 which will be described below). It is also possible to previously form the opening portion 19x for the resist film 19 taking a shape of a dry film and to dispose, on the second metal layer 18, the resist film 19 provided with the opening portion 19x.

Figure 19:
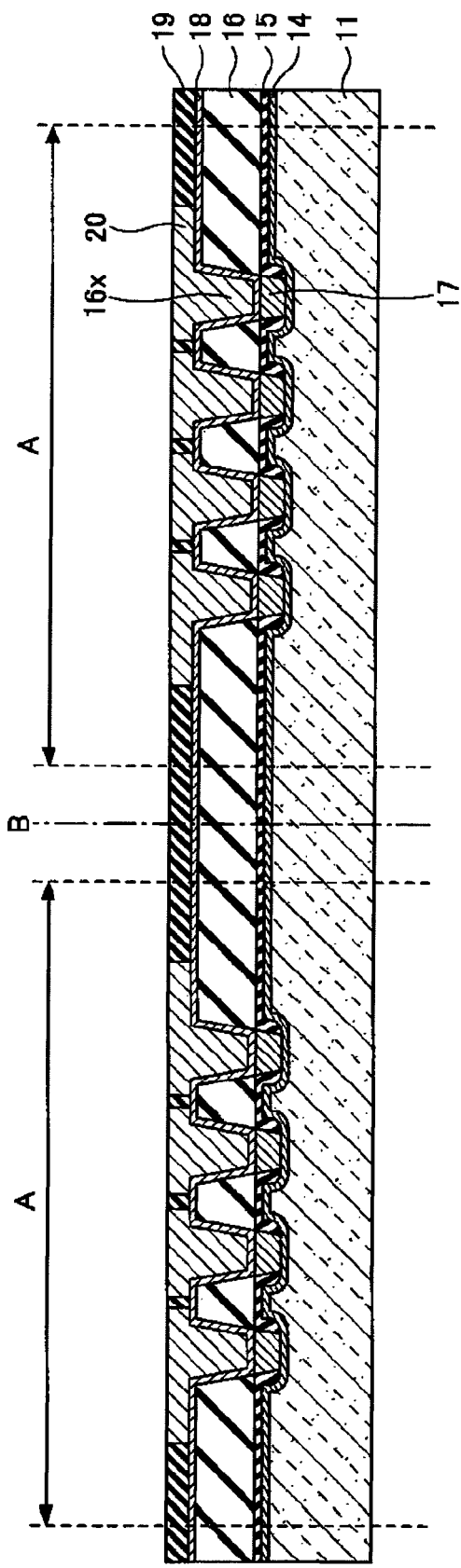
FIG. 19 is a view (No. 15) illustrating the process for manufacturing the assembly wiring board 10 and the wiring board 10*a* according to the first embodiment of the invention.
Figure 20:
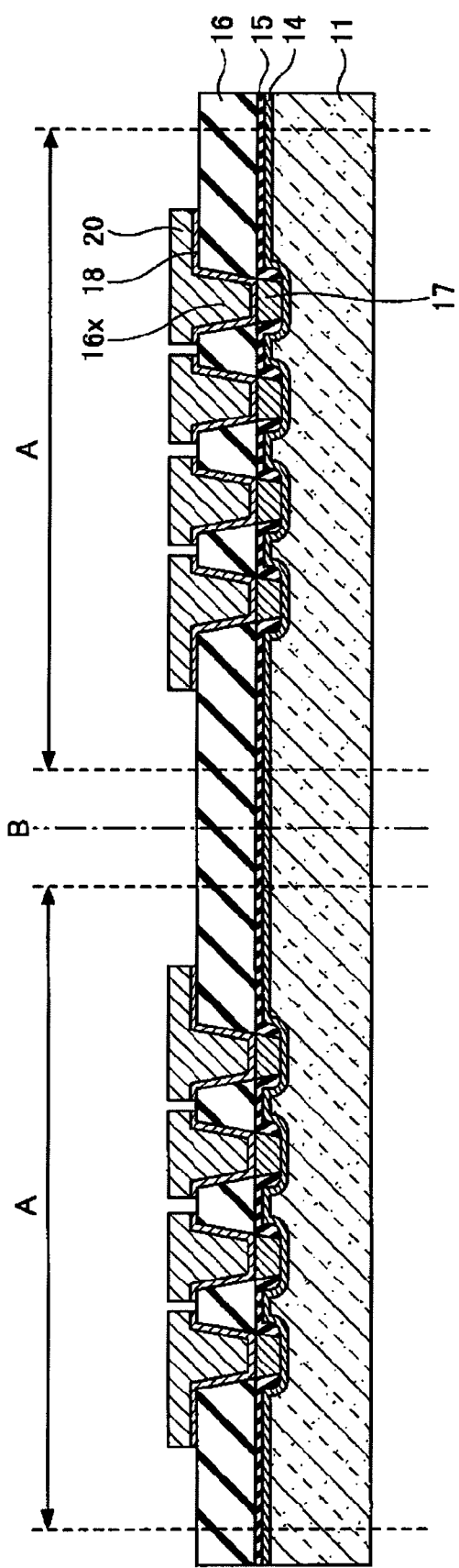
FIG. 20 is a view (No. 16) illustrating the process for manufacturing the assembly wiring board 10 and the wiring board 10*a* according to the first embodiment of the invention.

At a step shown in FIG. 19, next, the second wiring layer 20 is formed in a portion of the second metal layer 18 which corresponds to the opening portion 19x of the resist film 19 by an electrolytic plating method utilizing the second metal layer 18 for a plated feeding layer (a seed layer). The second metal layer 18 and the second wiring layer 20 are electrically connected to the first wiring layer 17 through the first via hole 16x. As a material of the second wiring layer 20, for example, it is possible to use Cu. At a step shown in FIG. 20, then, the resist film 19 shown in FIG. 19 is removed, and furthermore, a portion of the second metal layer 18 in which the second wiring layer 18 is not formed is removed.

Figure 21:
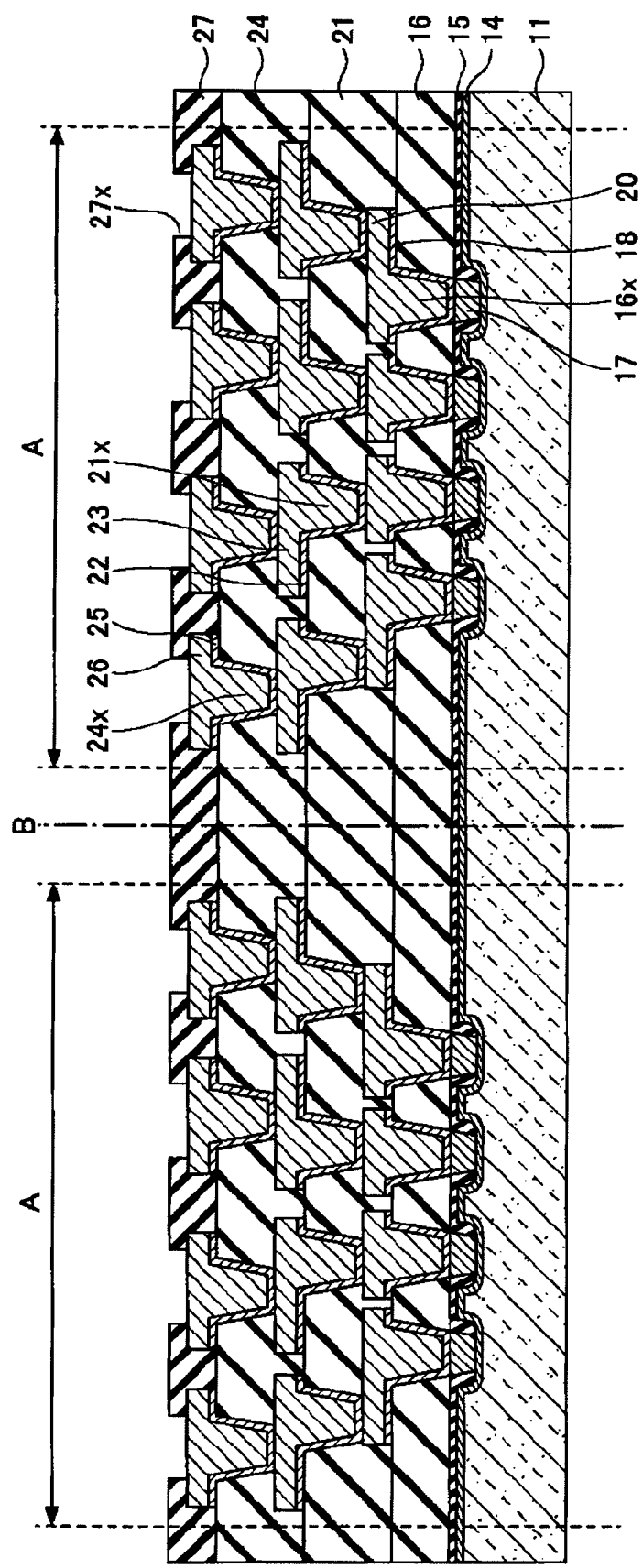
FIG. 21 is a view (No. 17) illustrating the process for manufacturing the assembly wiring board 10 and the wiring board 10a according to the first embodiment of the invention.

At a step shown in FIG. 21, thereafter, the same steps as described above are repeated to sequentially form a second insulating layer 21, a third metal layer 22, a third wiring layer 23, a third insulating layer 24, a fourth metal layer 25 and a fourth wiring layer 26. More specifically, the second insulating layer 21 covering the second wiring layer 20 is formed and a second via hole 21x is then formed in a portion of the second insulating layer 21 which is provided on the second wiring layer 20.

In addition, the third wiring layer 23 to be electrically connected to the second wiring layer 20 is formed on the second insulating layer 21 through the third metal layer 22 and the second via hole 21x. As materials of the third metal layer 22 and the third wiring layer 23, for example, it is possible to use Cu.

Moreover, a third via hole 24x is formed in a portion of the third insulating layer 24 which is provided on the third wiring layer 23 after the third insulating layer 24 covering the third wiring layer 23 is formed. Furthermore, the fourth wiring layer 26 to be electrically connected to the third wiring layer 23 is formed on the third insulating layer 24 through the fourth metal layer 25 and the third via hole 24x. As materials of the fourth metal layer 25 and the fourth wiring layer 26, for example, it is possible to use Cu.

Subsequently, the solder resist 27 provided with the opening portion 27x is formed on the fourth wiring layer 26. Consequently, the fourth wiring layer 26 is exposed into the opening portion 27x of the solder resist 27 and functions as an electrode pad to be connected to a mother board. A contact layer such as an Ni/Au plated layer having an Ni plated layer and an Au plated layer laminated in this order may be formed on the fourth wiring layer 26 in the opening portion 27x of the solder resist 27 if necessary.

Thus, a predetermined buildup wiring layer is formed on the support board 11. Although a buildup wiring layer having four layers (first to fourth wiring layers) is formed in the example, it is also possible to form a buildup wiring layer having n layers (n is an integer which is equal to or greater than one).

Figure 22:
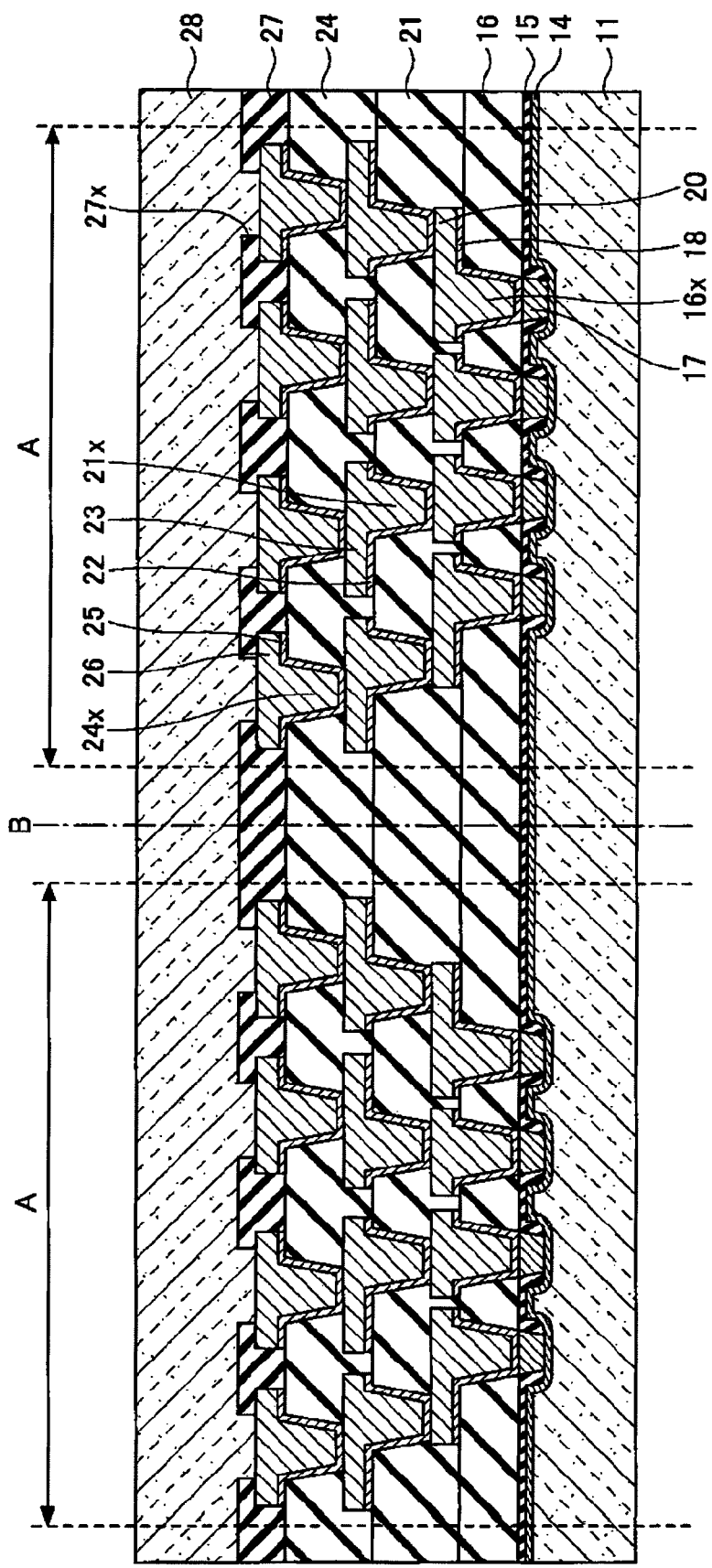
FIG. 22 is a view (No. 18) illustrating the process for manufacturing the assembly wiring board 10 and the wiring board 10a according to the first embodiment of the invention.

At a step shown in FIG. 22, next, an auxiliary board 28 is provided on the solder resist 27 formed on a surface of the structure shown in FIG. 21 at an opposite side to the surface on which the semiconductor chip is to be mounted. It is possible to provide the auxiliary board 28 by sticking with a pressure sensitive adhesive double coated tape, for example. In this case, it is also possible to use a pressure sensitive adhesive double coated tape of a thermal foaming type or a pressure sensitive adhesive double coated tape of a UV (ultraviolet) foaming type in the same manner as the peeling layer 15.

The auxiliary board 28 is provided to increase the mechanical strength of the assembly wiring board 10 and is removed after a step of mounting the semiconductor chip on the assembly wiring board 10, for example. As a material of the auxiliary board 28, it is possible to use silicon or a borosilicate glass in the same manner as the support board 11. The auxiliary board 28 can be set to have a thickness of 2 mm, for example.

Figure 23:
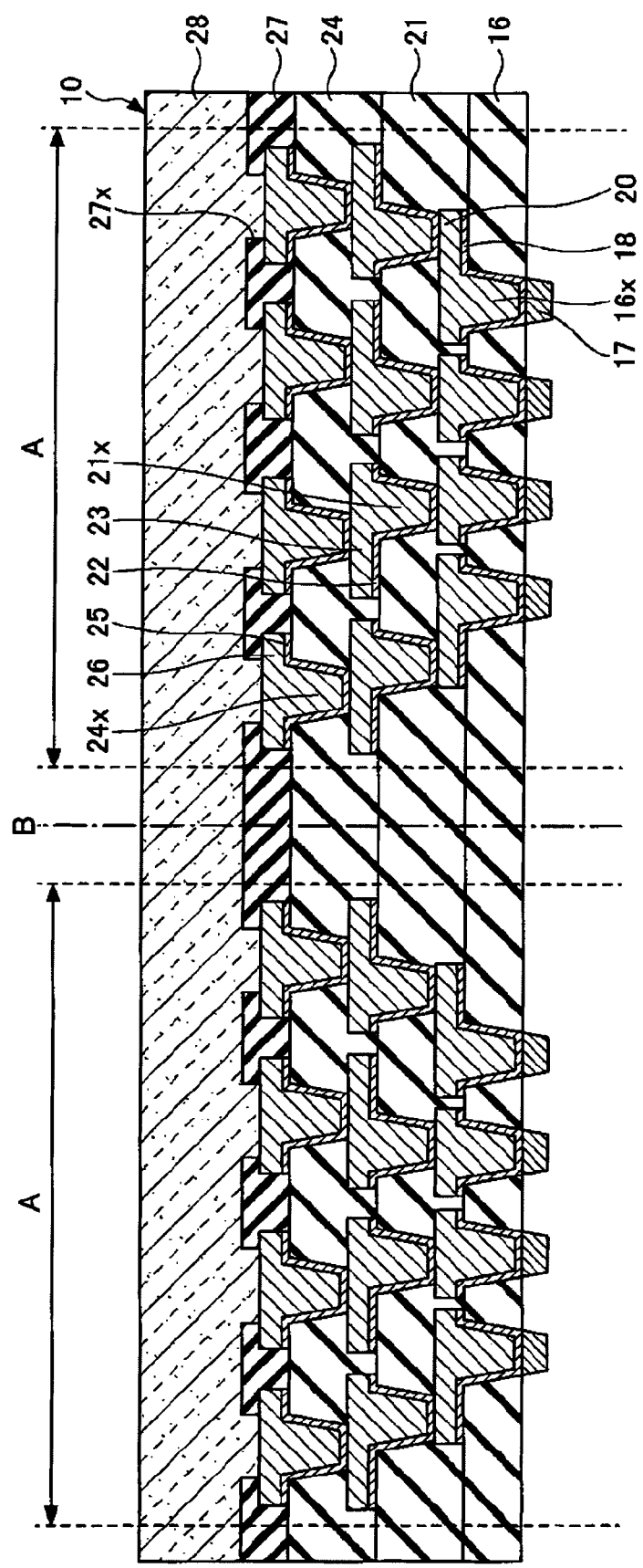
FIG. 23 is a view (No. 19) illustrating the process for manufacturing the assembly wiring board 10 and the wiring board 10a according to the first embodiment of the invention.

At a step shown in FIG. 23, next, a predetermined treatment is carried out over the peeling layer 15 shown in FIG. 22 to remove the support board 11, the first metal layer and the peeling layer 15 so that the assembly wiring board is completed. The predetermined treatment indicates a treatment for carrying out heating to a predetermined temperature (applying a thermal energy) in the case in which the pressure sensitive adhesive double coated tape of the thermal foaming type is stuck as the peeling layer 15 at the step shown in FIG. 11, for example.

In the case in which the pressure sensitive adhesive double coated tape of the UV (ultraviolet) foaming type is stuck as the peeling layer 15 at the step shown in FIG. 11, for example, ultraviolet rays are irradiated (a light energy having a specific wavelength is applied). By the execution of the predetermined treatment, the adhesive strength of the peeling layer 15 is reduced. Consequently, it is possible to easily remove the support board 11, the first metal layer 14 and the peeling layer 15.

At a step shown in FIG. 24, subsequently, the assembly wiring board 10 illustrated in FIG. 23 is cut in a cutting position B by using a dicing blade so that the assembly wiring board 10 is divided into individual pieces. Next, the auxiliary board 28 is removed after the division into the individual pieces so that a plurality of wiring boards 10a is completed. It is also possible to cut the assembly wiring board 10 shown in FIG. 23 into individual pieces in the cutting position B by using the dicing blade after removing the auxiliary board 28 from the assembly wiring board 10, thereby fabricating the wiring boards 10a. Thus, there are manufactured the assembly wiring board 10 and the wiring board 10a according to the first embodiment of the invention.

According to the assembly wiring board 10 and the wiring board 10a in accordance with the first embodiment of the invention, the concave portion 13 is formed on the upper surface of the support board 11 formed of silicon having a low coefficient of thermal expansion and the first wiring layer 17 serving as the electrode pad to be electrically connected to the corresponding electrode of the semiconductor chip is provided in the concave portion 13, and furthermore, the buildup wiring layer is provided. Even if heating and cooling are repeated in the process for manufacturing the assembly wiring board 10 and the wiring board 10a, consequently, a warpage or a distortion is caused by a thermal stress with difficulty over the buildup wiring layer supported on the support board 11 formed of the silicon having a low coefficient of thermal expansion. In the completion of the assembly wiring board 10 and the wiring board 10a, therefore, the pitch P3 of the first wiring layer 17 can be prevented from being greatly shifted from a desirable pitch.

Since the support board formed of Cu which is used in the process for manufacturing the wiring board 100 according to the related art is removed by wet etching at a final step, moreover, it can be used only once. However, the support board 11 formed of the silicon according to the invention is provided with the peeling layer 15. Consequently, the support board 11 can easily be removed even if the wet etching is not carried out. In the case in which the support board 11 is removed before the assembly wiring board 10 is cut into individual pieces by using the dicing blade, therefore, the support board 11 can be used repetitively. Thus, it is possible to reduce a manufacturing cost for the assembly wiring board 10 and the wiring board 10a.

Variant of First Embodiment

In a variant of the first embodiment according to the invention, there will be shown a method of manufacturing the assembly wiring board 10 and the wiring board 10a having the buildup wiring layer which is different from that in the first embodiment according to the invention. In the variant of the first embodiment according to the invention, the concave portion 13 is not formed on the upper surface of the support board 11 but a first wiring layer 17 is formed on the upper surface of the support board 11 which is flat. Since materials and thicknesses of the support board 11 and the peeling layer 15 are the same as those in the first embodiment according to the invention, description thereof will be omitted.

Figure 24:
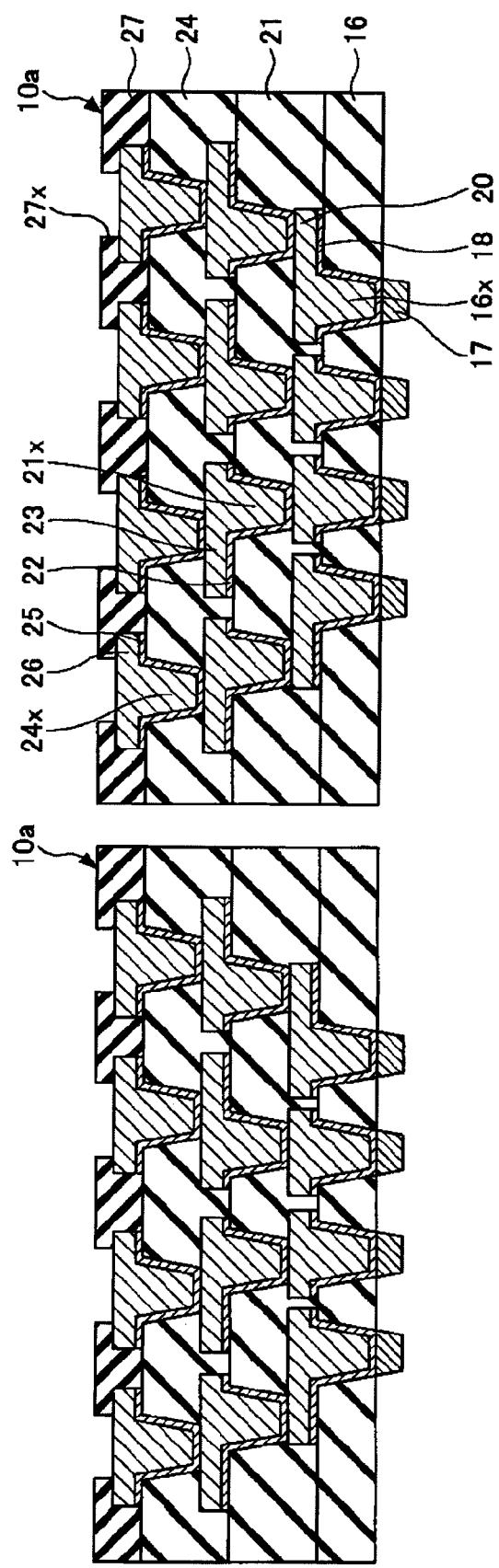
FIG. 24 is a view (No. 20) illustrating the process for manufacturing the assembly wiring board 10 and the wiring board 10a according to the first embodiment of the invention.
Figure 25:
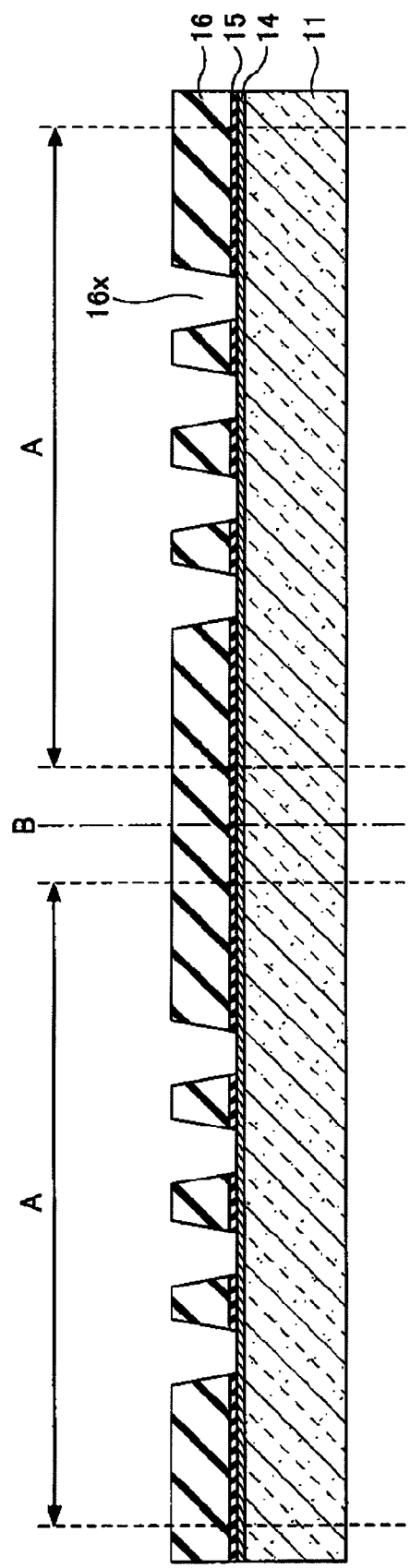
FIG. 25 is a view (No. 1) illustrating a process for manufacturing an assembly wiring board 10 and a wiring board 10a according to a variant of the first embodiment in accordance with the invention.
Figure 26:
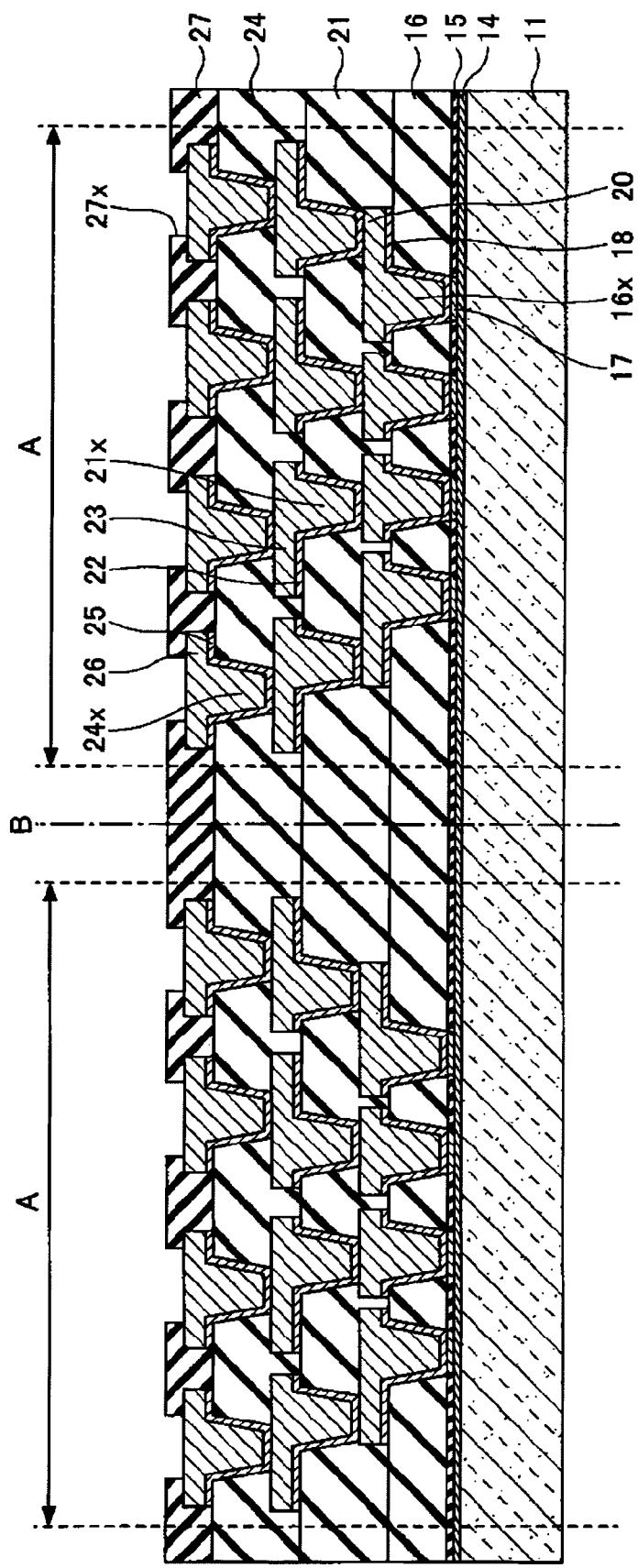
FIG. 26 is a view (No. 2) illustrating the process for manufacturing the assembly wiring board 10 and the wiring board 10a according to the variant of the first embodiment in accordance with the invention.
Figure 27:
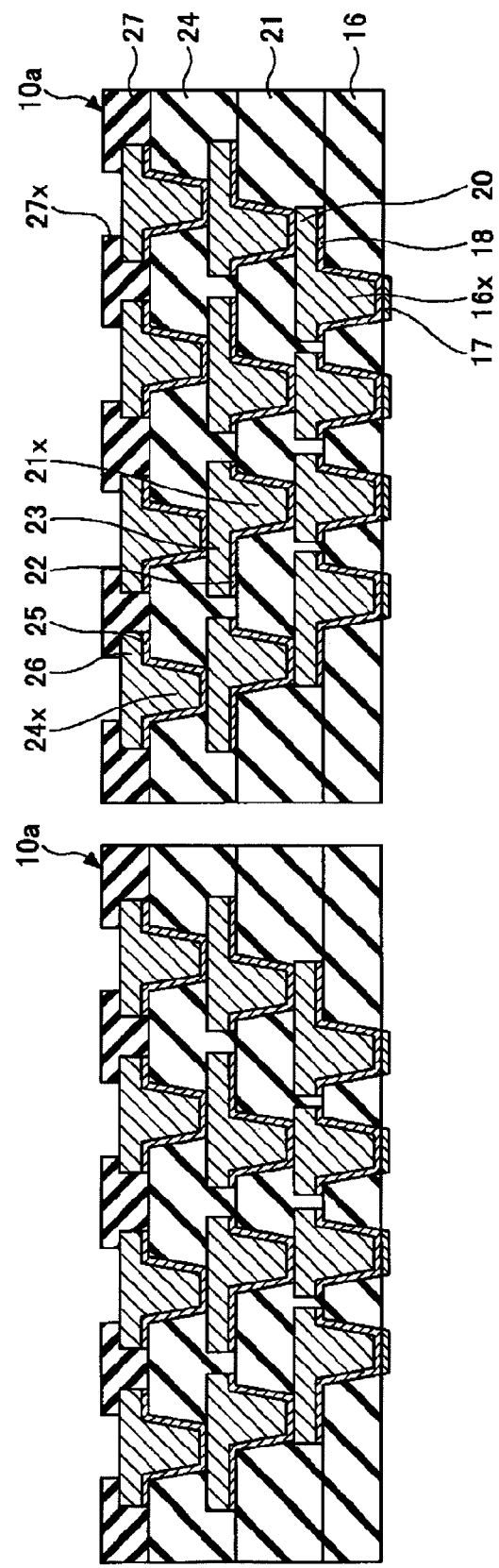
FIG. 27 is a view (No. 3) illustrating the process for manufacturing the assembly wiring board 10 and the wiring board 10a according to the variant of the first embodiment in accordance with the invention.
Figure 28:
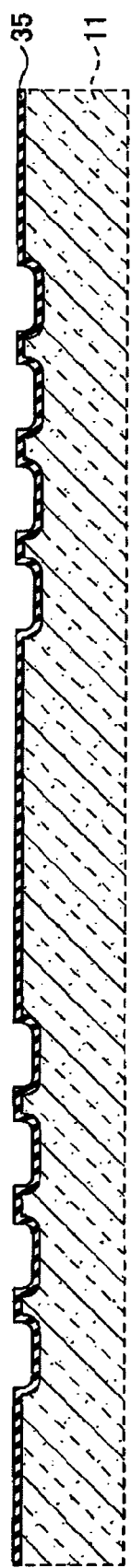
FIG. 28 is a view (No. 1) illustrating a process for manufacturing an assembly wiring board 30 and a wiring board 30a according to a second embodiment of the invention.

FIGS. 25 to 27 are views illustrating a process for manufacturing the assembly wiring board 10 and the wiring board 10a according to the variant of the first embodiment in accordance with the invention. In FIGS. 25 to 27, the same components as those in FIGS. 5 to 24 have the same reference numerals and description thereof will be omitted in some cases. First of all, the support board 11 is prepared and a first metal layer 14 and a peeling layer 15 are sequentially formed on the upper surface of the support board 11 at a step shown in FIG. 25.

Subsequently, a first insulating layer 16 is formed on the peeling layer 15 and a first via hole 16x to be a through hole penetrating the peeling layer 15 and the first insulating layer 16 is formed by using a laser processing method in such a manner that the first metal layer 14 in a corresponding position to a position in which the first wiring layer 17 is to be formed (see FIG. 26 which will be described below) is exposed. The first via hole 16x may be formed by a method of carrying out an imprint using the stamper 29 having a surface on which the convex shape 29a corresponding to the first via hole 16x is provided and transferring the convex shape 29a as shown in FIG. 14.

Through the same steps as those shown in FIGS. 4 to 21 according to the first embodiment of the invention, next, the first wiring layer 17 constituted by a surface plated layer and a first wiring layer body is formed on the first metal layer 14 exposed into the first via hole 16x by an electrolytic plating method utilizing the first metal layer 14 for a plated feeding layer (a seed layer), for example, and a buildup wiring layer is formed on the first wiring layer 17 as shown in FIG. 26. Although the buildup wiring layer having four layers (first to fourth wiring layers) is formed in the example, it is also possible to form a buildup wiring layer having n layers (n is an integer which is equal to or greater than one).

In the first wiring layer 17, the surface plated layer can have a structure in which a layer exposed to an outside is formed of Au in the completion of the assembly wiring board 10 and the wiring board 10a, for example, a structure in which only an Au film is formed on the first metal layer 14, a structure in which an Au film and an Ni film are sequentially laminated or a structure in which an Au film, a Pd film and an Ni film are sequentially laminated. The Au film constituting the surface plated layer can be set to have a thickness of 0.01 μm to 1 μm, for example. Subsequently, the first wiring layer body formed of Cu can be provided on the surface plated layer by plating. The first wiring layer 17 functions as an electrode pad to be electrically connected to the corresponding electrode of the semiconductor chip.

Through the same steps as those shown in FIGS. 22 to 24 according to the first embodiment of the invention, subsequently, the assembly wiring board 10 and the wiring board 10a according to the variant of the first embodiment in accordance with the invention are manufactured as shown in FIG. 27.

According to the assembly wiring board 10 and the wiring board 10a in accordance with the variant of the first embodiment of the invention, the first wiring layer 17 is provided on the upper surface of the support board 11 formed of silicon having a low coefficient of thermal expansion, and furthermore, the buildup wiring layer is provided. Even if heating and cooling are repeated in the process for manufacturing the assembly wiring board 10 and the wiring board 10a, consequently, a warpage or a distortion is caused by a thermal stress with difficulty over the buildup wiring layer supported on the support board 11 formed of the silicon having a low coefficient of thermal expansion. In the completion of the assembly wiring board 10 and the wiring board 10a, therefore, the pitch P3 of the first wiring layer 17 can be prevented from being greatly shifted from a desirable pitch.

Since the support board formed of Cu which is used in the process for manufacturing the wiring board 100 according to the related art is removed by wet etching at a final step, moreover, it can be used only once. However, the support board 11 formed of the silicon according to the invention is provided with the peeling layer 15. Consequently, the support board 11 can easily be removed even if the wet etching is not carried out. In the case in which the support board 11 is removed before the assembly wiring board 10 is cut into individual pieces by using the dicing blade, therefore, the support board 11 can be used repetitively. Consequently, it is possible to reduce a manufacturing cost for the assembly wiring board 10 and the wiring board 10a.

Second Embodiment

In a second embodiment according to the invention, description will be given to a manufacturing method which is different from the method of manufacturing the assembly wiring board 10 and the wiring board 10a having the buildup wiring layer according to the first embodiment of the invention. An assembly wiring board and a wiring board which are manufactured by the method according to the second embodiment of the invention are set to be an assembly wiring board 30 and a wiring board 30a for convenience. Although the assembly wiring board 10 and wiring board 10a and the assembly wiring board 30 and wiring board 30a are manufactured by different methods from each other, they are identical to each other.

FIGS. 28 to 32 are views illustrating a process for manufacturing the assembly wiring board 30 and the wiring board 30a according to the second embodiment of the invention. In FIGS. 28 to 32, the same components as those in FIGS. 5 to 24 have the same reference numerals and description thereof will be omitted in some cases. First of all, the structure shown in FIG. 9 is fabricated through the same steps as those illustrated in FIGS. 5 to 9 according to the first embodiment of the invention. At a step shown in FIG. 28, next, a peeling layer 35 is formed on an upper surface of a support board 11 by a CVD method or a thermal oxidation. As a material of the peeling layer 35, for example, it is possible to use $SiO_2$. The peeling layer 35 can be set to have a thickness of 0.5 μm to 10 μm, for example.

Figure 29:
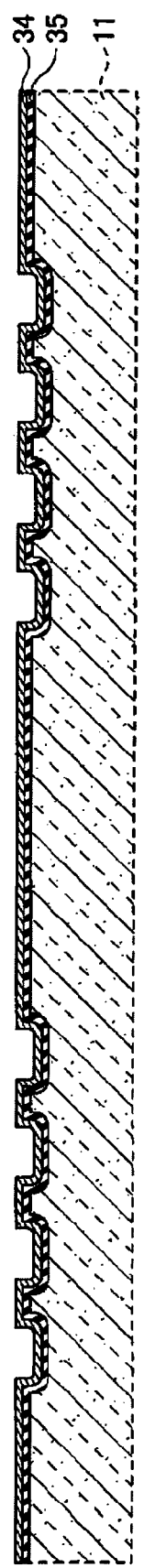
FIG. 29 is a view (No. 2) illustrating the process for manufacturing the assembly wiring board 30 and the wiring board 30a according to the second embodiment of the invention.

At a step shown in FIG. 29, subsequently, a first metal layer 34 is formed on the peeling layer 35 by a electroless plating method or a sputtering method. As a material of the first metal layer 34, for example, it is possible to use Ti or Ti/Cu (a structure in which a Cu layer is laminated on a Ti layer). In case of Ti, the first metal layer 34 can be set to have a thickness of 0.5 μm to 1.0 μm, for example. In case of Ti/Cu (a structure in which the Cu layer is laminated on the Ti layer), for example, Ti can be set to have a thickness of 0.1 μm to 1.0 μm and Cu can be set to have a thickness of 0.1 μm to 1.0 μm. As a material of the first metal layer 34, moreover, it is also possible to use Pt, Au, Cr, Cr/Au (a structure in which an Au layer is laminated on a Cr layer), and Ti/Au (a structure in which the Au layer is laminated on the Ti layer).

Through the same steps as those shown in FIGS. 12 to 21 according to the first embodiment of the invention, then, a buildup wiring layer is formed on the support board 11. Although a buildup wiring layer having four layers (first to fourth wiring layers) is formed in the example, it is also possible to form a buildup wiring layer having n layers (n is an integer which is equal to or greater than one).

Figure 30:
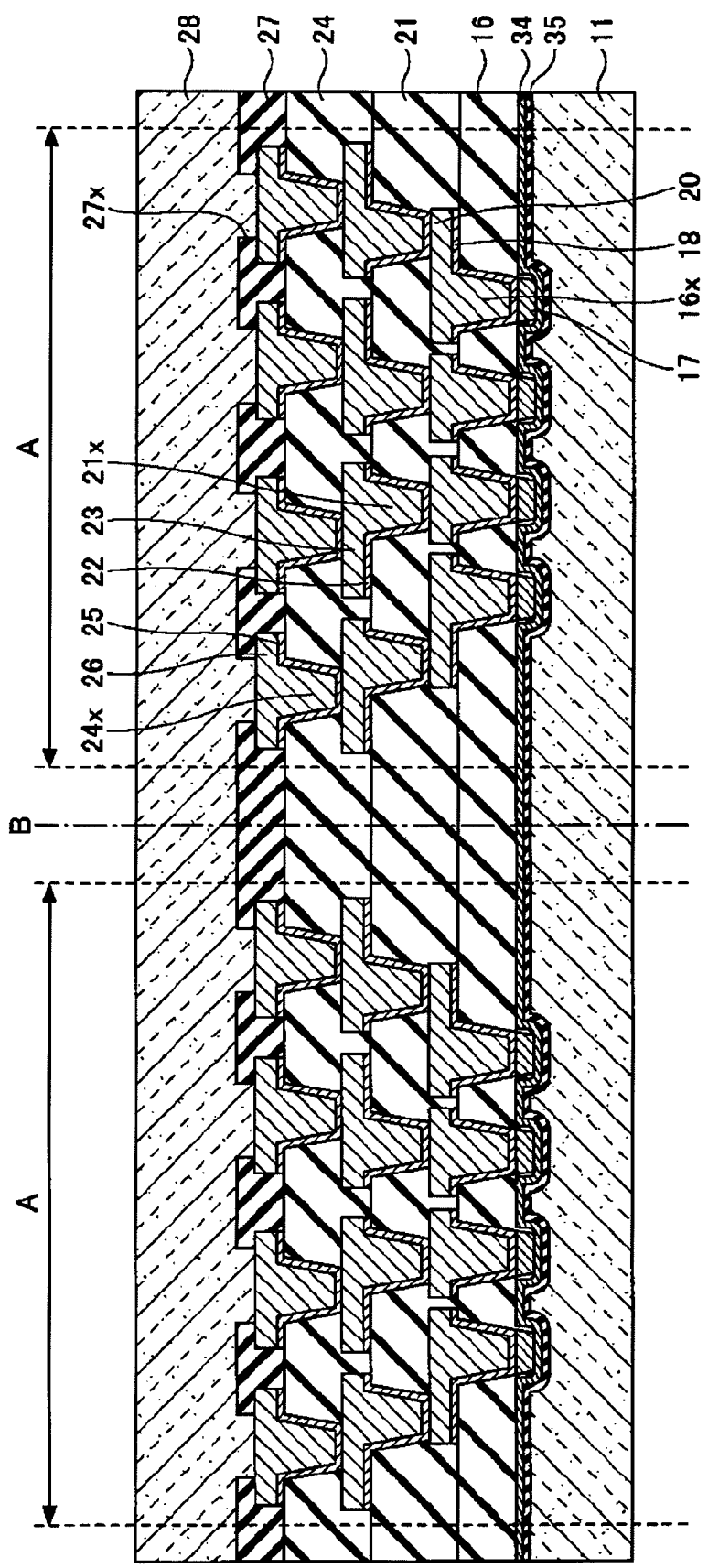
FIG. 30 is a view (No. 3) illustrating the process for manufacturing the assembly wiring board 30 and the wiring board 30a according to the second embodiment of the invention.

At a step shown in FIG. 30, next, an auxiliary board is provided on a solder resist 27 to be a surface at an opposite side to the surface on which the semiconductor chip is to be mounted. It is possible to provide the auxiliary board 28 by sticking with a pressure sensitive adhesive double coated tape, for example. For the pressure sensitive adhesive double coated tape, it is also possible to use a pressure sensitive adhesive double coated tape of a thermal foaming type or a pressure sensitive adhesive double coated tape of a UV (ultraviolet) foaming type.

Figure 31:
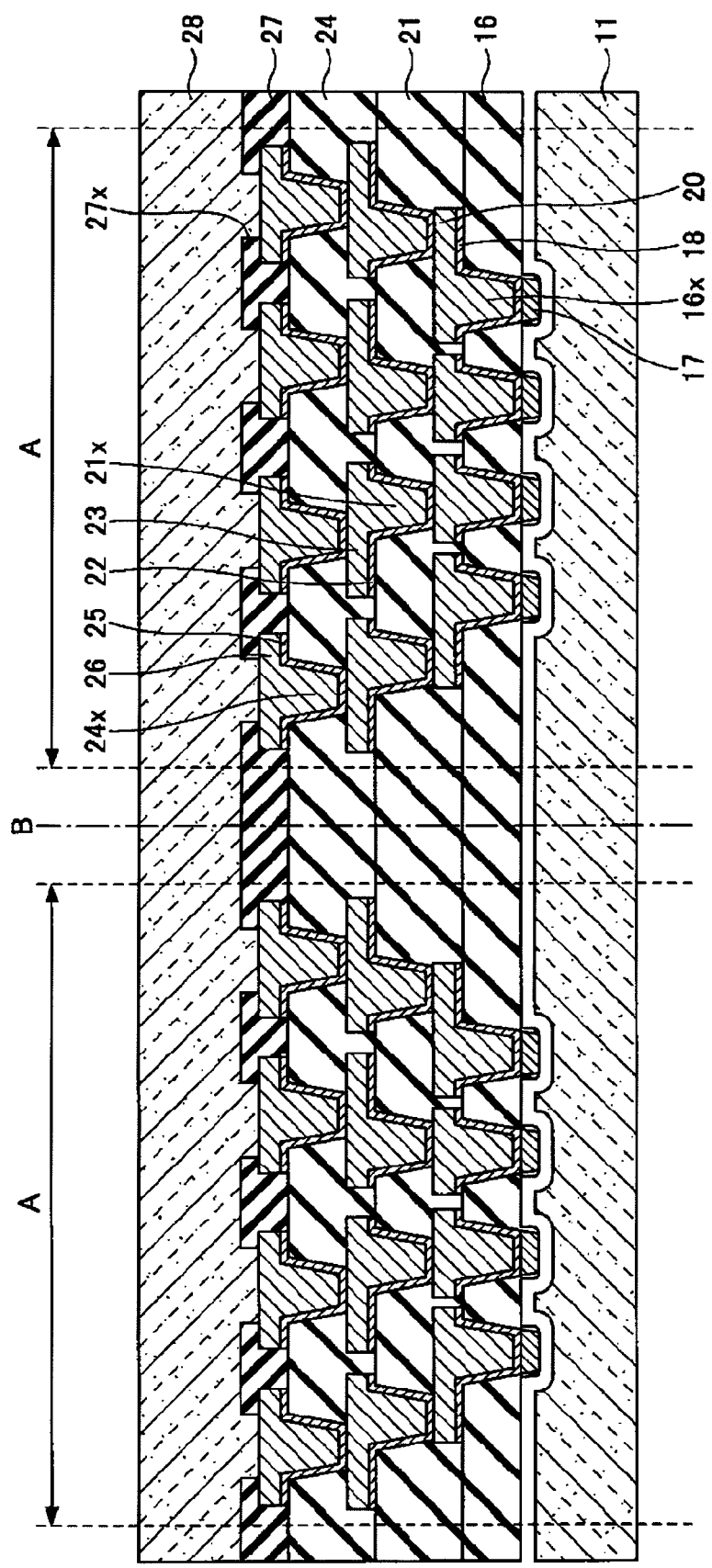
FIG. 31 is a view (No. 4) illustrating the process for manufacturing the assembly wiring board 30 and the wiring board 30a according to the second embodiment of the invention.

At a step shown in FIG. 31, then, a predetermined treatment is carried out over the first metal layer 34 and the peeling layer 35 shown in FIG. 30 so that the first metal layer 34 and the peeling layer 35 are removed. The predetermined treatment indicates a treatment for carrying out etching over the first metal layer 34 and the peeling layer 35 by using hydrofluoric acid steam. In the case in which the first metal layer 34 is constituted by Ti, the etching is carried out by using the hydrofluoric acid steam so that the first metal layer 34 is removed together with the peeling layer 35 constituted by $SiO_2$.

In the case in which the first metal layer 34 contains a material other than Ti, for example, the case in which the first metal layer 34 is constituted by Ti/Cu (a structure in which a Cu layer is laminated on a Ti layer), only Ti constituting the first metal layer 34 and $SiO_2$ constituting the peeling layer 35 are removed through the etching by using the hydrofluoric acid steam. In this case, a step of removing Cu constituting the first metal layer 34 is required separately.

Figure 32:
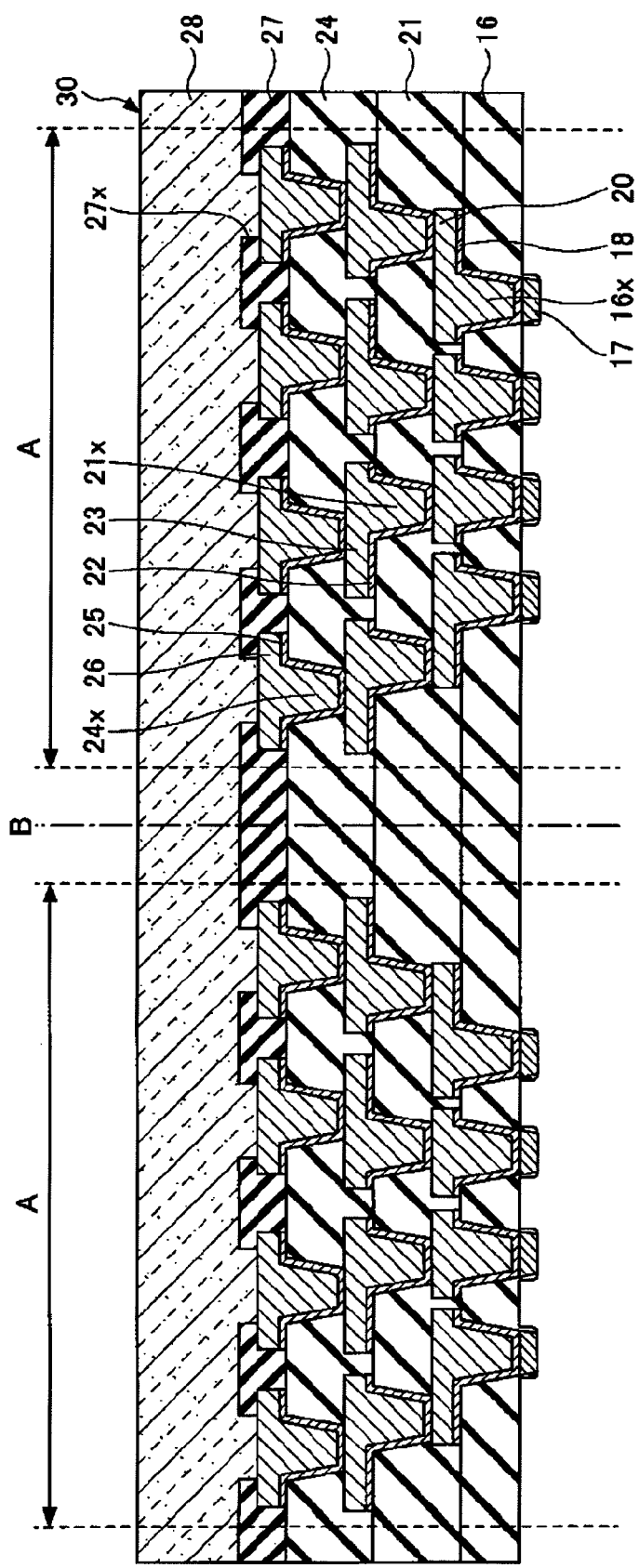
FIG. 32 is a view (No. 5) illustrating the process for manufacturing the assembly wiring board 30 and the wiring board 30a according to the second embodiment of the invention.

At a step shown in FIG. 32, thereafter, the support board 11 shown in FIG. 31 is removed so that the assembly wiring board 30 is completed. Through the same step as that shown in FIG. 24 according to the first embodiment of the invention, next, the assembly wiring board 30 illustrated in FIG. 32 is cut in a cutting position B by using a dicing blade so that the assembly wiring board 30 is divided into individual pieces. Next, the auxiliary board 28 is removed after the division into the individual pieces so that a plurality of wiring boards 30a is completed. It is also possible to cut the assembly wiring board 30 into individual pieces in the cutting position B by using the dicing blade after removing the auxiliary board 28 from the assembly wiring board 30 shown in FIG. 32, thereby fabricating the wiring boards 30a.

Thus, there are manufactured the assembly wiring board 30 and the wiring board 30a according to the second embodiment of the invention. Although the description has been given to the example in which the concave portion 13 is formed on the upper surface of the support board 11 and the first wiring layer 17 serving as the electrode pad to be electrically connected to the corresponding electrode of the semiconductor chip is formed in the concave portion 13 in the second embodiment according to the invention, it is also possible to employ a structure in which the concave portion 13 is not formed on the upper surface of the support board 11 but the first wiring layer 17 is formed on the upper surface of the support board 11 which is flat in the same manner as in the variant of the first embodiment according to the invention.

According to the assembly wiring board 30 and the wiring board 30a in accordance with the second embodiment of the invention, the concave portion 13 is provided on the upper surface of the support board 11 formed of silicon having a low coefficient of thermal expansion and the first wiring layer 17 serving as the electrode pad to be electrically connected to the corresponding electrode of the semiconductor chip is provided in the concave portion 13, and furthermore, the buildup wiring layer is provided in the same manner as the assembly wiring board 10 and the wiring board 10a according to the first embodiment of the invention. Even if heating and cooling are repeated in the process for manufacturing the assembly wiring board 30 and the wiring board 30a, consequently, a warpage or a distortion is caused by a thermal stress with difficulty over the buildup wiring layer supported on the support board 11 formed of the silicon having a low coefficient of thermal expansion. In the completion of the assembly wiring board 30 and the wiring board 30a, therefore, a pitch P3 of the first wiring layer 17 can be prevented from being greatly shifted from a desirable pitch.

Since the support board formed of Cu which is used in the process for manufacturing the wiring board 100 according to the related art is removed by wet etching at a final step, moreover, it can be used only once. However, the support board 11 formed of the silicon according to the invention is provided with the peeling layer 35. Consequently, the support board 11 can easily be removed even if the wet etching is not carried out. In the case in which the support board 11 is removed before the assembly wiring board 30 is cut into individual pieces by using the dicing blade, therefore, the support board 11 can be used repetitively. Thus, it is possible to reduce a manufacturing cost for the assembly wiring board 30 and the wiring board 30a.

Third Embodiment

In a third embodiment according to the invention, description will be given to a manufacturing method which is different from the method of manufacturing the assembly wiring board 10 and the wiring board 10a having the buildup wiring layer according to the first embodiment of the invention. An assembly wiring board and a wiring board which are manufactured by the method according to the third embodiment of the invention are set to be an assembly wiring board 40 and a wiring board 40a for convenience. Although the assembly wiring board 10 and wiring board 10a and the assembly wiring board 40 and wiring board 40a are manufactured by different methods from each other, they are identical to each other.

Figure 33:
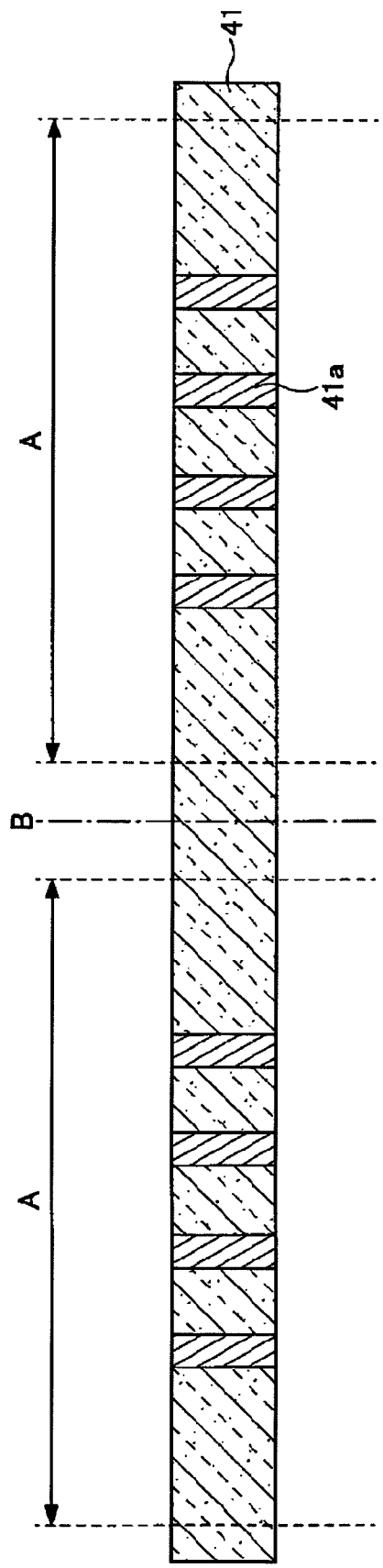
FIG. 33 is a view (No. 1) illustrating a process for manufacturing an assembly wiring board 40 and a wiring board 40a according to a third embodiment of the invention.
Figure 34:
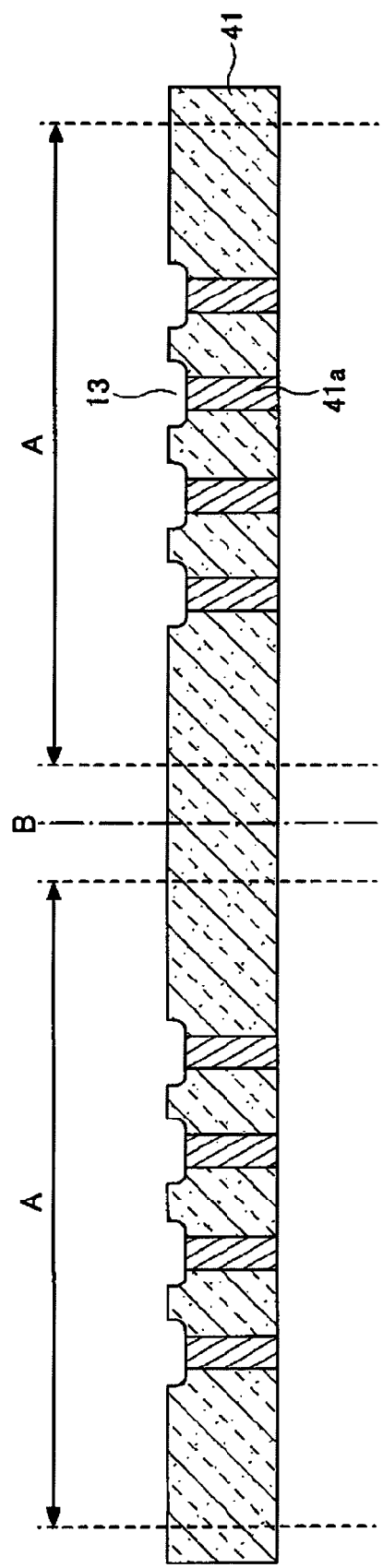
FIG. 34 is a view (No. 2) illustrating the process for manufacturing the assembly wiring board 40 and the wiring board 40a according to the third embodiment of the invention.
Figure 35:
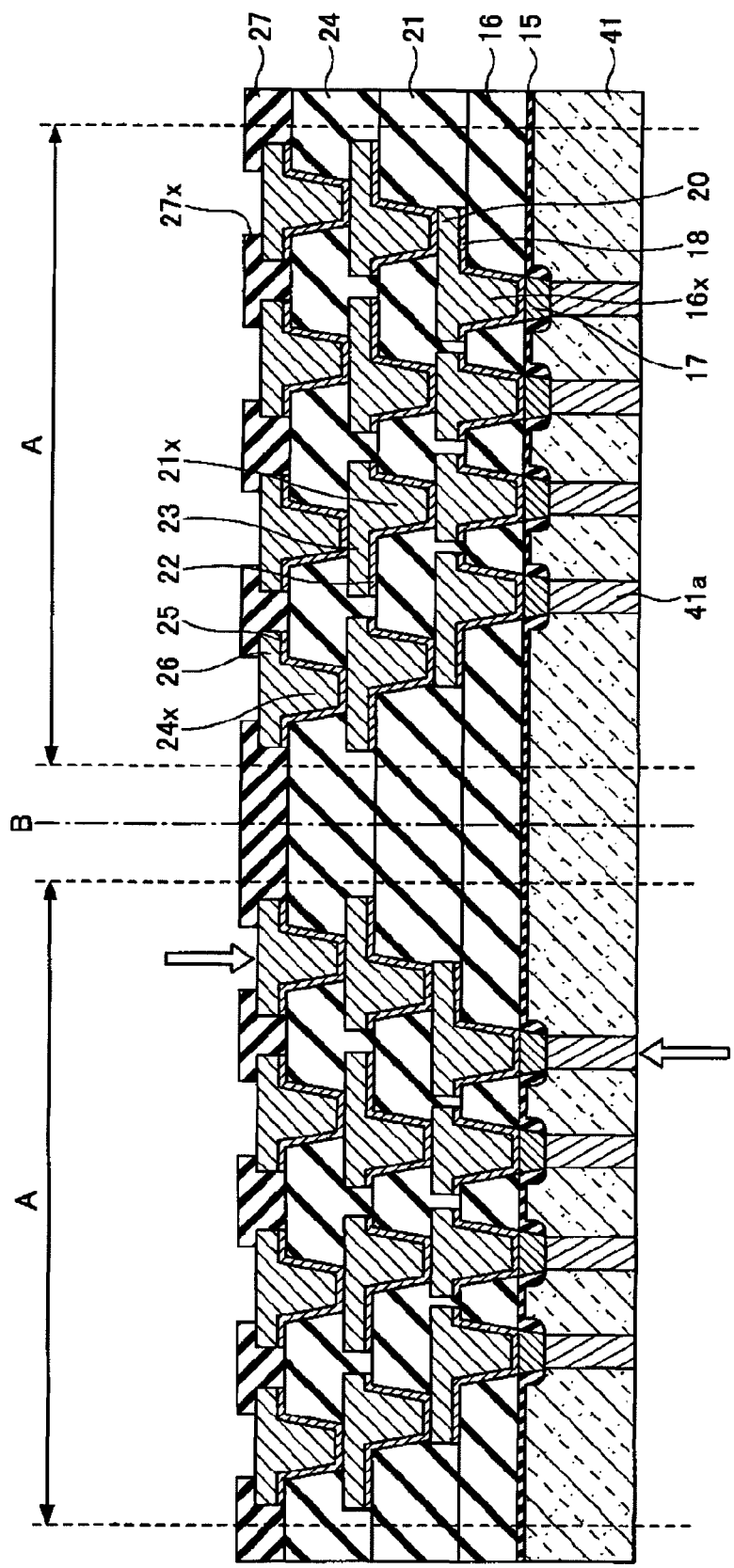
FIG. 35 is a view (No. 3) illustrating the process for manufacturing the assembly wiring board 40 and the wiring board 40a according to the third embodiment of the invention.

FIGS. 33 to 35 are views illustrating a process for manufacturing the assembly wiring board 40 and the wiring board 40a according to the third embodiment of the invention. In FIGS. 33 to 35, the same components as those in FIGS. 5 to 24 have the same reference numerals and description thereof will be omitted in some cases. First of all, a support board 41 having a through electrode 41a is prepared at a step shown in FIG. 33. The through electrode 41a penetrates a lower surface of the support board 41 from an upper surface thereof.

As the support board 41, for example, it is possible to use silicon (a coefficient of thermal expansion: approximately 3 to 4 ppm/° C.) or a material having a coefficient of thermal expansion which is equal to that of the silicon. A range of the coefficient of thermal expansion of the material which can be used as the support board 41 (a range of the coefficient of thermal expansion which is equal to that of the silicon constituting a semiconductor substrate) is 0 to 6 ppm/° C., and a suitable range of the coefficient of thermal expansion is 3 to 4 ppm/° C.

Moreover, a corresponding region to a semiconductor chip mounting region C (see FIG. 36 which will be described below) on which the semiconductor chip is to be mounted, that is, a part of the buildup wiring layer forming region A is constituted by the silicon or the material having the coefficient of thermal expansion which is equal to that of the silicon, and the other regions may be constituted by other materials.

In addition, the corresponding region to the semiconductor chip mounting region C (see FIG. 36 which will be described below) on which the semiconductor chip is to be mounted, that is, a part of the buildup wiring layer forming region A is constituted by the silicon and the other regions may be constituted by the materials having the coefficient of thermal expansion which is equal to that of the silicon.

As the material having the coefficient of thermal expansion which is equal to that of the silicon, for example, it is possible to use a borosilicate glass. The borosilicate glass contains boric acid ($B_2O_3$) and silicic acid ($SiO_2$) as main components and has a coefficient of thermal expansion of approximately 3 ppm/° C. A thickness of the support board 41 can be set to be 200 μm to 2000 μm, for example. The through electrode 41a is constituted by Cu, for example.

Through the same steps as those shown in FIGS. 6 and 7 according to the first embodiment of the invention, subsequently, a resist film is formed on the upper surface of the support board 41 and a patterning treatment such as an exposure is carried out over the resist film to form an opening portion on the through electrode 41a to be a corresponding part to a position in which a first wiring layer 17 is to be formed. At a step shown in FIG. 34, then, a concave portion 13 is formed by anisotropic dry etching or anisotropic wet etching in a corresponding position to the opening portion provided on the upper surface of the support board 41, and the resist film is removed. A depth of the concave portion 13 can be set to be 0.5 μm to 20 μm, for example. Moreover, the concave portion 13 takes an almost circular shape seen on a plane and can be set to have a diameter of 1 μm to 50 μm and a pitch of 2 μm to 100 μm, for example. The concave portion 13 is a dent for forming a first wiring layer 17.

Figure 10:
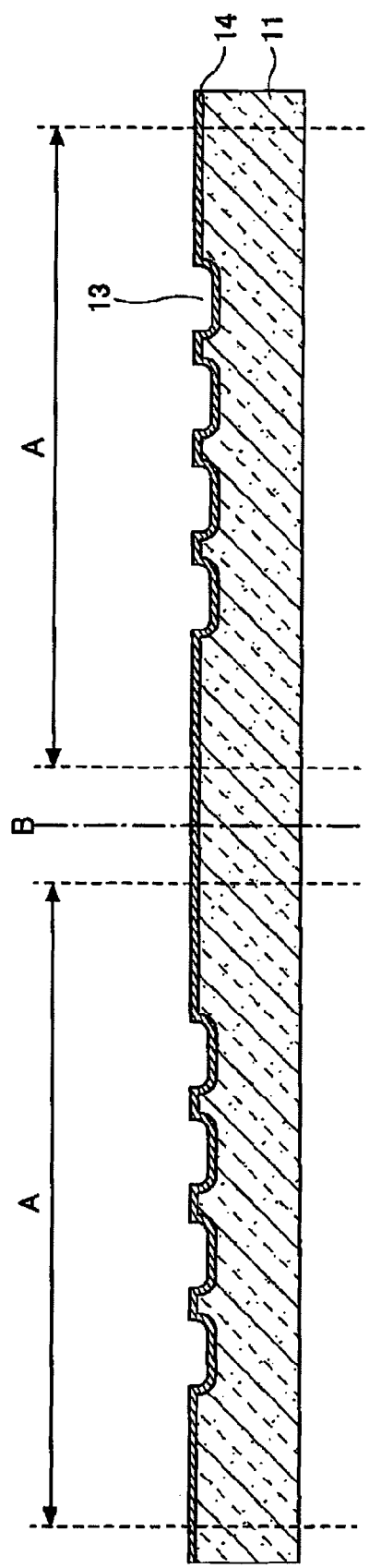
FIG. 10 is a view (No. 6) illustrating the process for manufacturing the assembly wiring board 10 and the wiring board 10*a* according to the first embodiment of the invention.

Through the same steps as those shown in FIGS. 11 to 21 according to the first embodiment of the invention, then, a buildup wiring layer shown in FIG. 35 is formed on the support board 41. Although a buildup wiring layer having four layers (first to fourth wiring layers) is formed in the example, it is also possible to form a buildup wiring having n layers (n is an integer which is equal to or greater than one). The support board 41 has the through electrode 41a. Therefore, it is possible to form the first wiring layer 17 by an electrolytic plating method utilizing the through electrode 41a for a plated feeding layer (a seed layer). Accordingly, the step of forming the first metal layer 14 shown in FIG. 10 is not required.

In a structure shown in FIG. 35, the support board 41 has the through electrode 41a. Therefore, it is possible to carry out a conduction check by causing a probe to come in contact with the predetermined through electrode 41a and a fourth wiring layer 26 connected electrically to the predetermined through electrode 41a as shown in an arrow of FIG. 35, for example.

Only a product decided to be excellent through the conduction check can be moved to a subsequent step. Therefore, it is possible to enhance a productivity of the assembly wiring board 40 and the wiring board 40a. Through the same steps as those shown in FIGS. 22 to 24 according to the first embodiment of the invention, then, there are manufactured the assembly wiring board 40 and the wiring board 40a according to the third embodiment of the invention.

Although the description has been given to the example in which the concave portion 13 is formed on the upper surface of the support board 41 and the first wiring layer 17 serving as an electrode pad to be electrically connected to a corresponding electrode of a semiconductor chip is formed in the concave portion 13 in the third embodiment according to the invention, it is also possible to employ a structure in which the concave portion 13 is not formed on the upper surface of the support board 41 but the first wiring layer 17 is formed on the upper surface of the support board 41 which is flat in the same manner as in the variant of the first embodiment according to the invention.

According to the assembly wiring board 40 and the wiring board 40a in accordance with the third embodiment of the invention, in the same manner as the assembly wiring board 10 and the wiring board 10a according to the first embodiment of the invention, the concave portion 13 is formed on the upper surface of the support board 41 formed of silicon having a low coefficient of thermal expansion and the first wiring layer 17 serving as the electrode pad to be electrically connected to the corresponding electrode of the semiconductor chip is provided in the concave portion 13, and furthermore, the buildup wiring layer is provided. Even if heating and cooling are repeated in the process for manufacturing the assembly wiring board 40 and the wiring board 40a, consequently, a warpage or a distortion is caused by a thermal stress with difficulty over the buildup wiring layer supported on the support board 41 formed of the silicon having a low coefficient of thermal expansion. In the completion of the assembly wiring board 40 and the wiring board 40a, therefore, a pitch P3 of the first wiring layer 17 can be prevented from being greatly shifted from a desirable pitch.

Since the support board formed of Cu which is used in the process for manufacturing the wiring board 100 according to the related art is removed by wet etching at a final step, moreover, it can be used only once. However, the support board 41 formed of the silicon according to the invention is provided with the peeling layer 15. Consequently, the support board 41 can easily be removed even if the wet etching is not carried out. In the case in which the support board 41 is removed before the assembly wiring board 40 is cut into individual pieces by using the dicing blade, therefore, the support board 41 can be used repetitively. Consequently, it is possible to reduce a manufacturing cost for the assembly wiring board 40 and the wiring board 40a.

By using the support board 41 having the through electrode 41a, moreover, it is possible to form the first wiring layer 17 by an electrolytic plating method utilizing the through electrode 41a as a plated feeding layer (a seed layer). Therefore, the step of forming the first metal layer 14 shown in FIG. 10 is not required so that a productivity of the assembly wiring board 40 and the wiring board 40a can be enhanced.

By using the support board 41 having the through electrode 41a, furthermore, it is possible to carry out the conduction check via the through electrode 41a at time of the formation of the buildup wiring layer. Therefore, only the object decided to be excellent through the conduction check can be moved to the subsequent step. Consequently, it is possible to enhance the productivity of the assembly wiring board 40 and the wiring board 40a.

Fourth Embodiment

Figure 36:
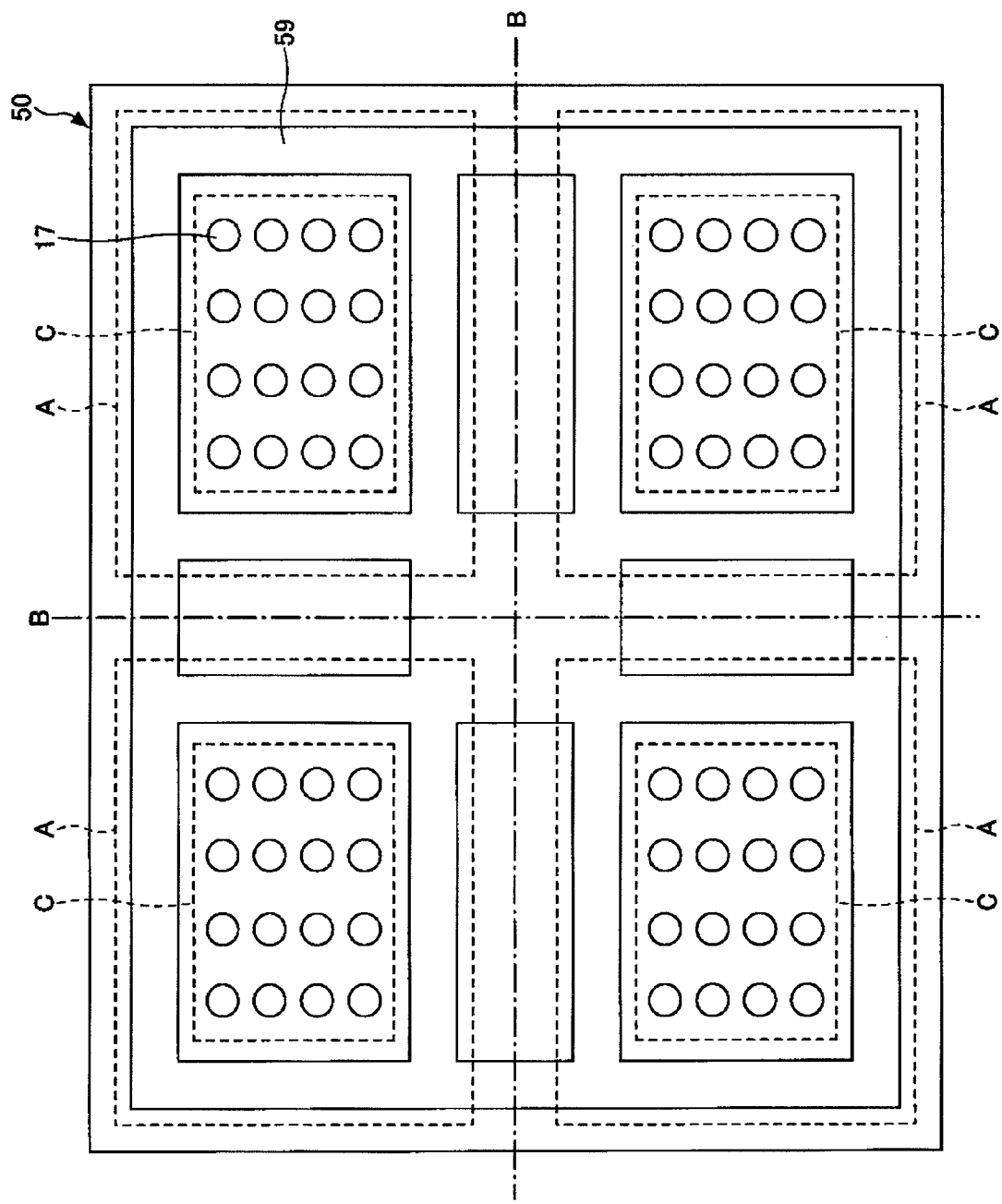
FIG. 36 is a bottom view illustrating an assembly wiring board 50 having a buildup wiring layer according to a fourth embodiment of the invention.
Figure 37:
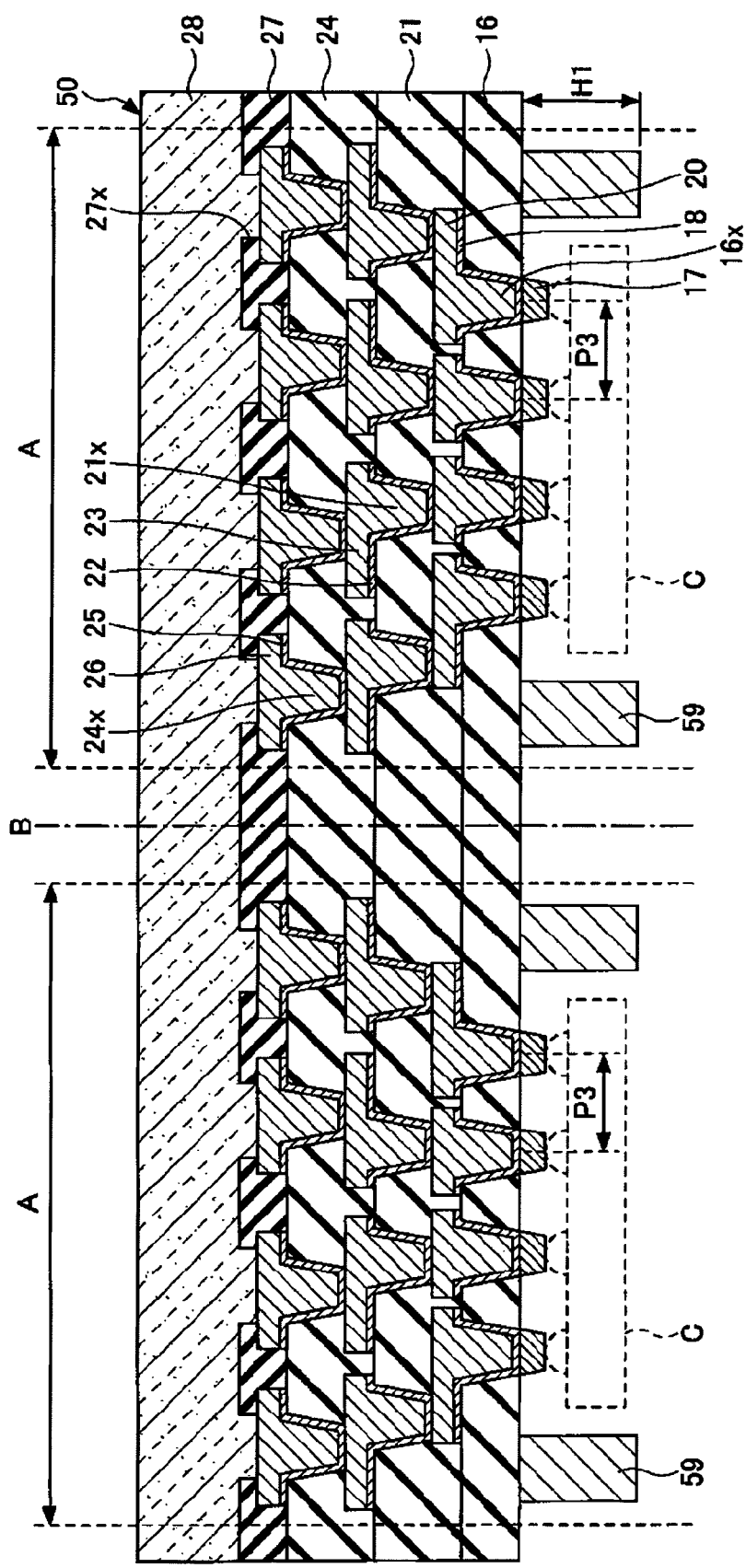
FIG. 37 is a sectional view illustrating the assembly wiring board 50 having the buildup wiring layer according to the fourth embodiment of the invention.

FIG. 36 is a bottom view illustrating an assembly wiring board 50 having a buildup wiring layer according to a fourth embodiment of the invention. FIG. 37 is a sectional view illustrating the assembly wiring board 50 having the buildup wiring layer according to the fourth embodiment of the invention. In FIGS. 36 and 37, the same components as those shown in FIGS. 3 and 4 have the same reference numerals and description thereof will be omitted in some cases. In FIGS. 36 and 37, 59 denotes a reinforcing frame and C denotes a region on which a semiconductor chip is to be mounted (which will be hereinafter referred to as a "semiconductor chip mounting region C").

With reference to FIGS. 36 and 37, the assembly wiring board 50 has the same structure as the assembly wiring board 10 having the buildup wiring layer according to the first embodiment of the invention except that the reinforcing frame 59 is provided in an outer edge part of the semiconductor chip mounting region C. The reinforcing frame 59 is provided for increasing mechanical strengths of the assembly wiring board 50 and a wiring board 50a obtained by cutting the wiring board 50 into individual pieces and preventing a deformation.

Moreover, the reinforcing frame 59 is provided to assist a radiation of heat generated in the semiconductor chip after the semiconductor chip is mounted on the assembly wiring board 50 or the wiring board 50a obtained by cutting the assembly wiring board 50 into individual pieces. As a material of the reinforcing frame 59, it is possible to use silicon, Cu or SUS. A height H1 of the reinforcing frame 59 is not particularly restricted but is preferably greater than a height of the semiconductor chip mounting region C in order to produce sufficient advantages.

Next, description will be given to a method of manufacturing the assembly wiring board 50 and the wiring board 50a. First of all, through the same steps as those shown in FIGS. 5 to 23 according to the first embodiment of the invention, the structure shown in FIG. 23 is fabricated. As shown in FIG. 37, subsequently, the reinforcing frame 59 is provided in an outer edge part of the semiconductor chip mounting region C of the structure shown in FIG. 23 so that the assembly wiring board 50 is completed. The reinforcing frame 59 can be fixed to a first insulating layer 16 by using an epoxy based thermosetting adhesive or a prepreg, for example. The prepreg is an intermediate material obtained by previously impregnating a glass fiber or a carbon fiber with a resin corresponding to an adhesive.

Through the same step as that shown in FIG. 24 according to the first embodiment of the invention, subsequently, the assembly wiring board 50 illustrated in FIG. 37 is cut in a cutting position B by using a dicing blade so that the assembly wiring board 50 is divided into individual pieces. Next, the auxiliary board 28 is removed after the division into the individual pieces so that a plurality of wiring boards 50a is completed. It is also possible to cut the assembly wiring board 50 shown in FIG. 37 into individual pieces in the cutting position B by using the dicing blade after removing the auxiliary board 28 from the assembly wiring board 50, thereby fabricating the wiring boards 50a. Thus, there are manufactured the assembly wiring board 50 and the wiring board 50a according to the fourth embodiment of the invention.

Although the description has been given to the example in which the concave portion 13 is formed on the upper surface of the support board 11 and the first wiring layer 17 serving as the electrode pad to be electrically connected to the corresponding electrode of the semiconductor chip is formed in the concave portion 13 in the fourth embodiment according to the invention, it is also possible to employ a structure in which the concave portion 13 is not formed on the upper surface of the support board 11 but the first wiring layer 17 is formed on the upper surface of the support board 11 which is flat in the same manner as in the variant of the first embodiment according to the invention.

According to the assembly wiring board 50 and the wiring board 50a in accordance with the fourth embodiment of the invention, in the same manner as the assembly wiring board 10 and the wiring board 10a according to the first embodiment of the invention, the concave portion 13 is provided on the upper surface of the support board 11 formed of silicon having a low coefficient of thermal expansion and the first wiring layer 17 serving as the electrode pad to be electrically connected to the corresponding electrode of the semiconductor chip is provided in the concave portion 13, and furthermore, the buildup wiring layer is provided. Even if heating and cooling are repeated in the process for manufacturing the assembly wiring board 50 and the wiring board 50a, consequently, a warpage or a distortion is caused by a thermal stress with difficulty over the buildup wiring layer supported on the support board 11 formed of the silicon having a low coefficient of thermal expansion. In the completion of the assembly wiring board 50 and the wiring board 50a, therefore, the pitch P3 of the first wiring layer 17 can be prevented from being greatly shifted from a desirable pitch.

Since the support board formed of Cu which is used in the process for manufacturing the wiring board 100 according to the related art is removed by wet etching at a final step, moreover, it can be used only once. However, the support board 11 formed of the silicon according to the invention is provided with the peeling layer 15. Consequently, the support board 11 can easily be removed even if the wet etching is not carried out. In the case in which the support board 11 is removed before the assembly wiring board 50 is cut into individual pieces by using the dicing blade, therefore, the support board 11 can be used repetitively. Thus, it is possible to reduce a manufacturing cost for the assembly wiring board 50 and the wiring board 50a.

By providing the reinforcing frame 59 in the outer edge part of the semiconductor chip mounting region C, furthermore, it is possible to increase the mechanical strengths of the assembly wiring board 50 and the wiring board 50a. Consequently, it is possible to prevent the deformation of the assembly wiring board 50 and the wiring board 50a. By providing the reinforcing frame 59, it is possible to maintain a high mechanical strength also after removing the auxiliary board 28. In addition, by providing the reinforcing frame 59 in the outer edge part of the semiconductor chip mounting region C, it is possible to enhance a radiating property of the heat generated in the semiconductor chip after mounting the semiconductor chip on the assembly wiring board 50 or the wiring board 50a.

Fifth Embodiment

Figure 38:
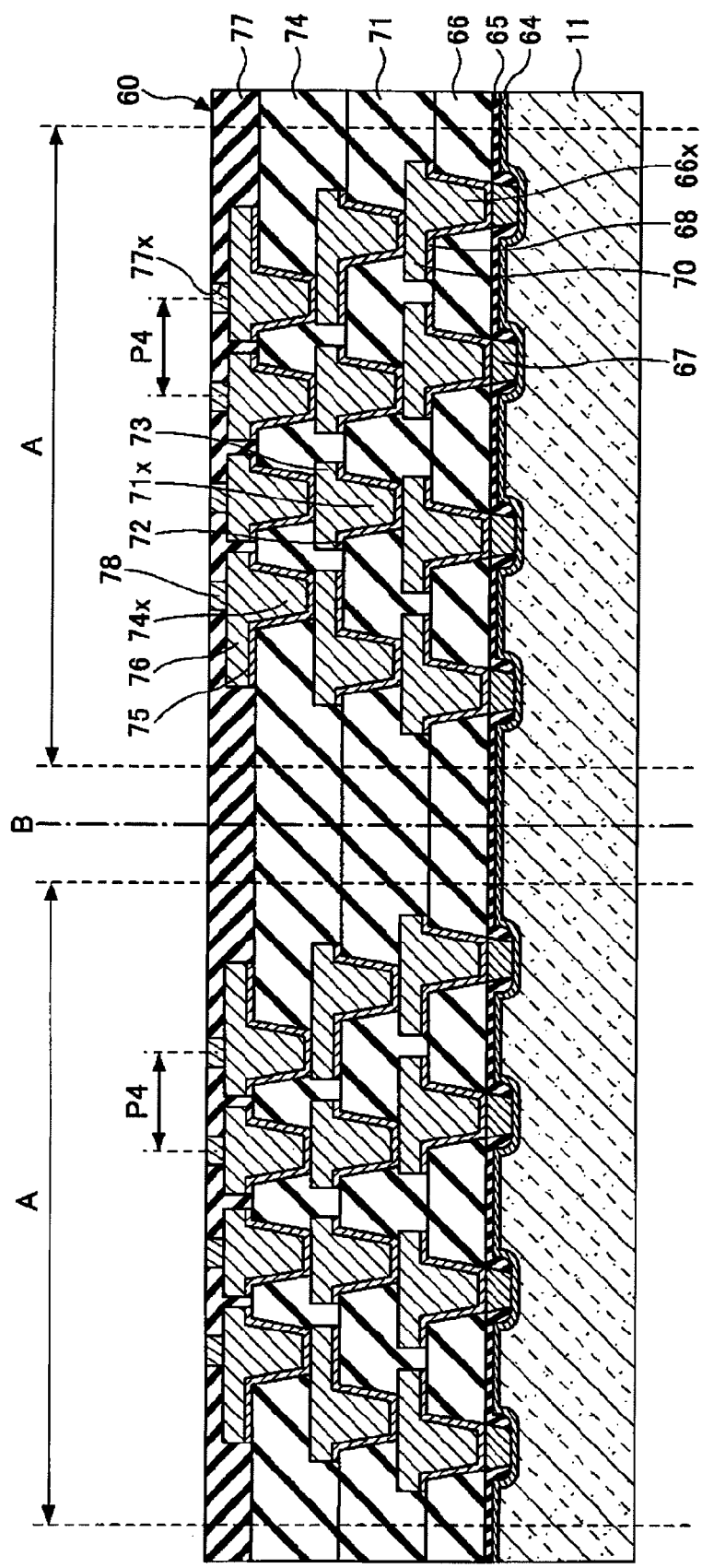
FIG. 38 is a sectional view illustrating an assembly wiring board 60 having a buildup wiring layer according to a fifth embodiment of the invention.

FIG. 38 is a sectional view illustrating an assembly wiring board 60 having a buildup wiring layer according to a fifth embodiment of the invention. Since a plan view illustrating the assembly wiring board 60 having the buildup wiring layer according to the fifth embodiment of the invention is identical to FIG. 3, illustration and description will be omitted. In the assembly wiring board 60, a support board 11, a first metal layer 64 and a peeling layer 65 may be removed.

With reference to FIG. 38, the assembly wiring board 60 has a buildup wiring layer constituted by the support board 11, the first metal layer 64, the peeling layer 65, a first insulating layer 66, a second insulating layer 71, a third insulating layer 74, a first wiring layer 67, a second wiring layer 70, a third wiring layer 73, a fourth wiring layer 76, a second metal layer 68, a third metal layer 72, a fourth metal layer 75, a solder resist 77 and a fifth metal layer 78. Since materials and thicknesses of the first metal layer 64, the peeling layer 65 and the first insulating layer 66 are the same as those of the first metal layer 14, the peeling layer 15 and the first insulating layer 16 according to the first embodiment of the invention, description thereof will be omitted.

The first metal layer 64, the peeling layer 65 and the first insulating layer 66 are formed on an upper surface of the support board 11. The first insulating layer 66 is provided with a first via hole 66x penetrating the peeling layer 65 and the first insulating layer 66 and exposing the first metal layer 64. The first wiring layer 67 is formed on the first metal layer 64 of the first via hole 66x.

The second metal layer 68 and the second wiring layer 70 are formed on the first insulating layer 66. Furthermore, the second insulating layer 71 is formed to cover the second wiring layer 70, and the third metal layer 72 and the third wiring layer 73 are formed on the second insulating layer 71. In addition, the third insulating layer 74 is formed to cover the third wiring layer 73, and the fourth metal layer 75 and the fourth wiring layer 76 are formed on the third insulating layer 74.

When a wiring board 60a obtained by cutting the assembly wiring board 60 into individual pieces is to be connected to a mother board, the support board 11, the first metal layer 64 and the peeling layer 65 are removed and the first wiring layer 67 is exposed from the first insulating layer 66. The first wiring layer 67 functions as an electrode pad to be electrically connected to the mother board, for example.

The first wiring layer 67 and the second metal layer 68 and second wiring layer 70 are electrically connected to each other through the first via hole 66x formed on the first insulating layer 66. Moreover, the second wiring layer 70 and the third metal layer 72 and third wiring layer 73 are electrically connected to each other through a second via hole 71x formed on the second insulating layer 71. Furthermore, the third wiring layer 73 and the fourth metal layer 75 and fourth wiring layer 76 are electrically connected to each other through a third via hole 74x formed on the third insulating layer 74.

The solder resist 77 having an opening portion 77x is formed to cover the fourth wiring layer 76. The fifth metal layer 78 is formed in a part on the fourth wiring layer 76 which corresponds to the opening portion 77x. A surface on which the fifth metal layer 78 is formed serves as a semiconductor chip mounting surface on which a semiconductor chip is to be mounted. The fifth metal layer 78 exposed into the opening portion 77x of the solder resist 77 functions as an electrode pad and is electrically connected to a corresponding electrode of the semiconductor chip. P4 denotes a pitch of the fifth metal layer 78. The assembly wiring board 60 is cut into individual pieces in a cutting position B so that a wiring board 60a is obtained.

Next, description will be given to a method of manufacturing the assembly wiring board 60 and the wiring board 60a. FIGS. 39 to 43 are views illustrating a process for manufacturing the assembly wiring board 60 and the wiring board 60a according to the fifth embodiment of the invention. In FIGS. 39 to 43, the same components as those shown in FIG. 38 have the same reference numerals and description thereof will be omitted in some cases.

Figure 6:
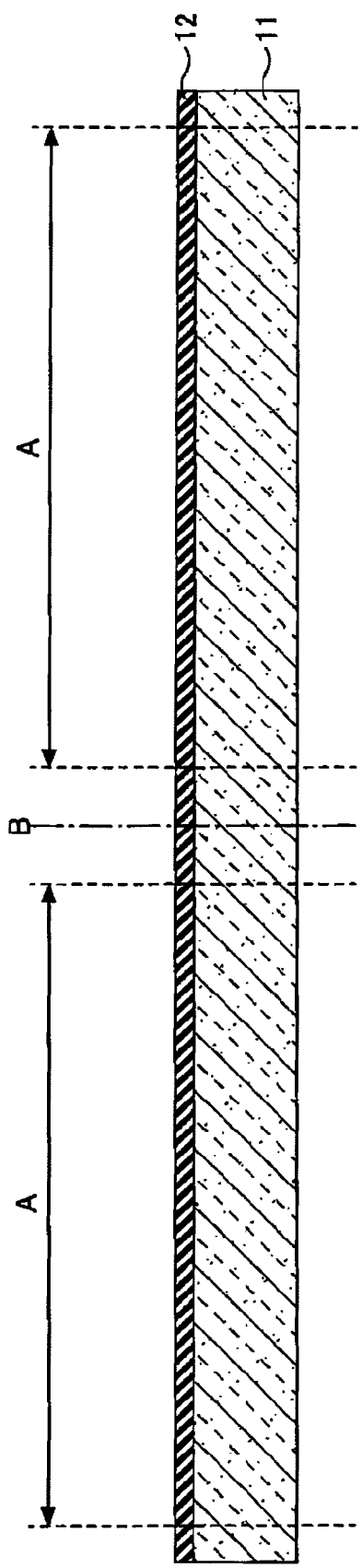
FIG. 6 is a view (No. 2) illustrating the process for manufacturing the assembly wiring board 10 and the wiring board 10*a* according to the first embodiment of the invention.
Figure 7:
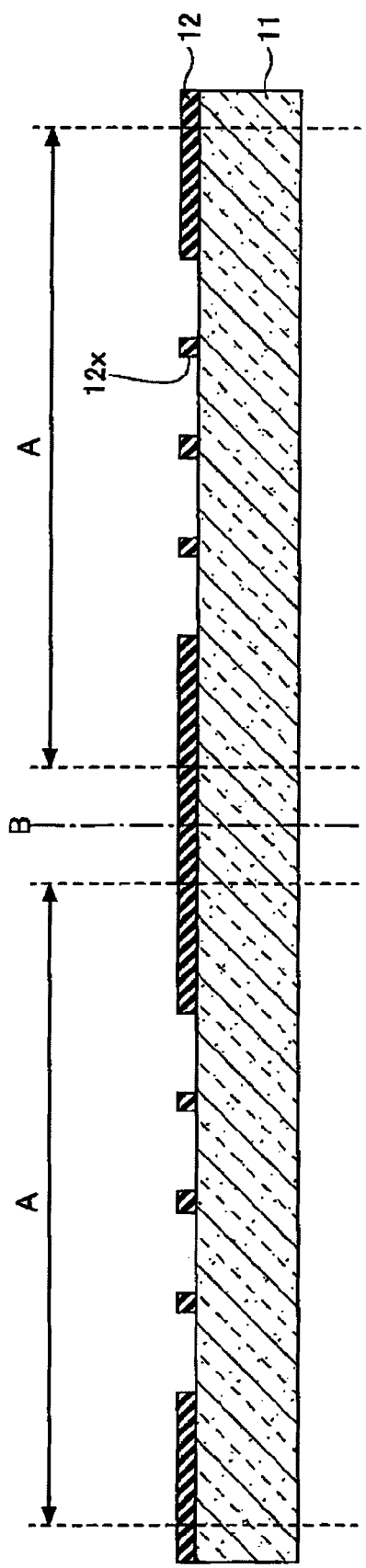
FIG. 7 is a view (No. 3) illustrating the process for manufacturing the assembly wiring board 10 and the wiring board 10*a* according to the first embodiment of the invention.

First of all, through the same steps as those shown in FIGS. 5 and 6 according to the first embodiment of the invention, a resist film 62 is formed on the upper surface of the support board 11. At a step shown in FIG. 39, subsequently, a patterning treatment such as an exposure is carried out over the resist film 62 to form an opening portion 62x in a corresponding part to a position in which the first wiring layer 67 is to be formed (see FIG. 41 which will be described below). It is also possible to previously form an opening portion 62x for the resist film 62 taking a shape of a dry film and to dispose, on the support board 11, the resist film 62 having the opening portion 62x formed thereon.

The first wiring layer 67 is an electrode pad which is not connected to the semiconductor chip but is connected to the mother board. Therefore, a pitch of the opening portion 62x corresponding to the position in which the first wiring layer 67 is to be formed is greater than the pitch of the opening portion 12x corresponding to the position in which the first wiring layer 17 is to be formed according to the first embodiment of the invention shown in FIG. 7.

Figure 39:
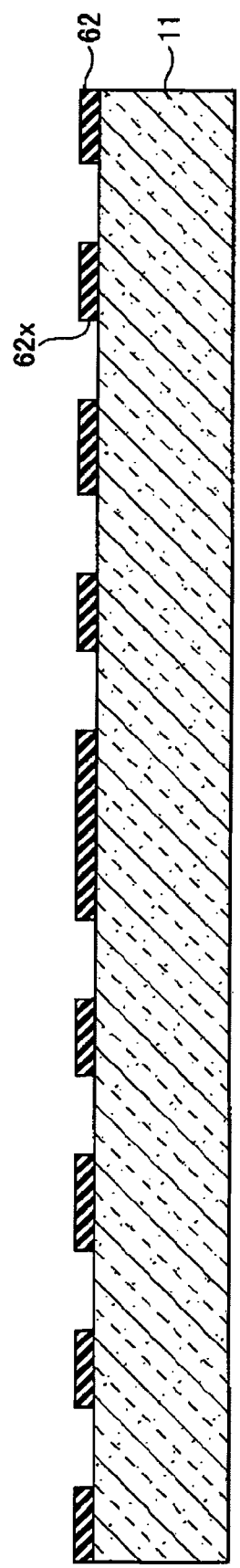
FIG. 39 is a view (No. 1) illustrating the process for manufacturing the assembly wiring board 60 and a wiring board 60a according to the fifth embodiment of the invention.
Figure 40:
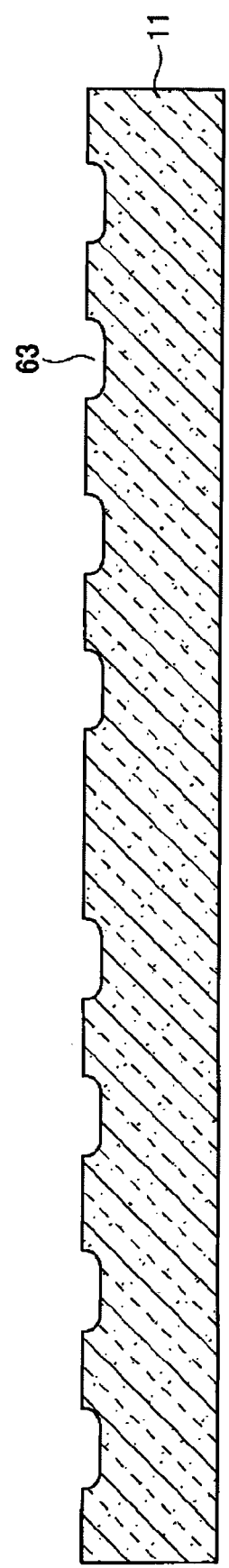
FIG. 40 is a view (No. 2) illustrating the process for manufacturing the assembly wiring board 60 and the wiring board 60a according to the fifth embodiment of the invention.

At a step shown in FIG. 40, then, a concave portion 63 is formed by anisotropic dry etching or anisotropic wet etching in a corresponding position to the opening portion 62x provided on the upper surface of the support board 11 and the resist film 62 shown in FIG. 39 is removed. A depth of the concave portion 63 can be set to be 0.5 μm to 20 μm, for example. Moreover, the concave portion 63 takes an almost circular shape seen on a plane and can be set to have a diameter of 100 μm to 200 μm and a pitch of 200 μm to 400 am, for example.

Figure 41:
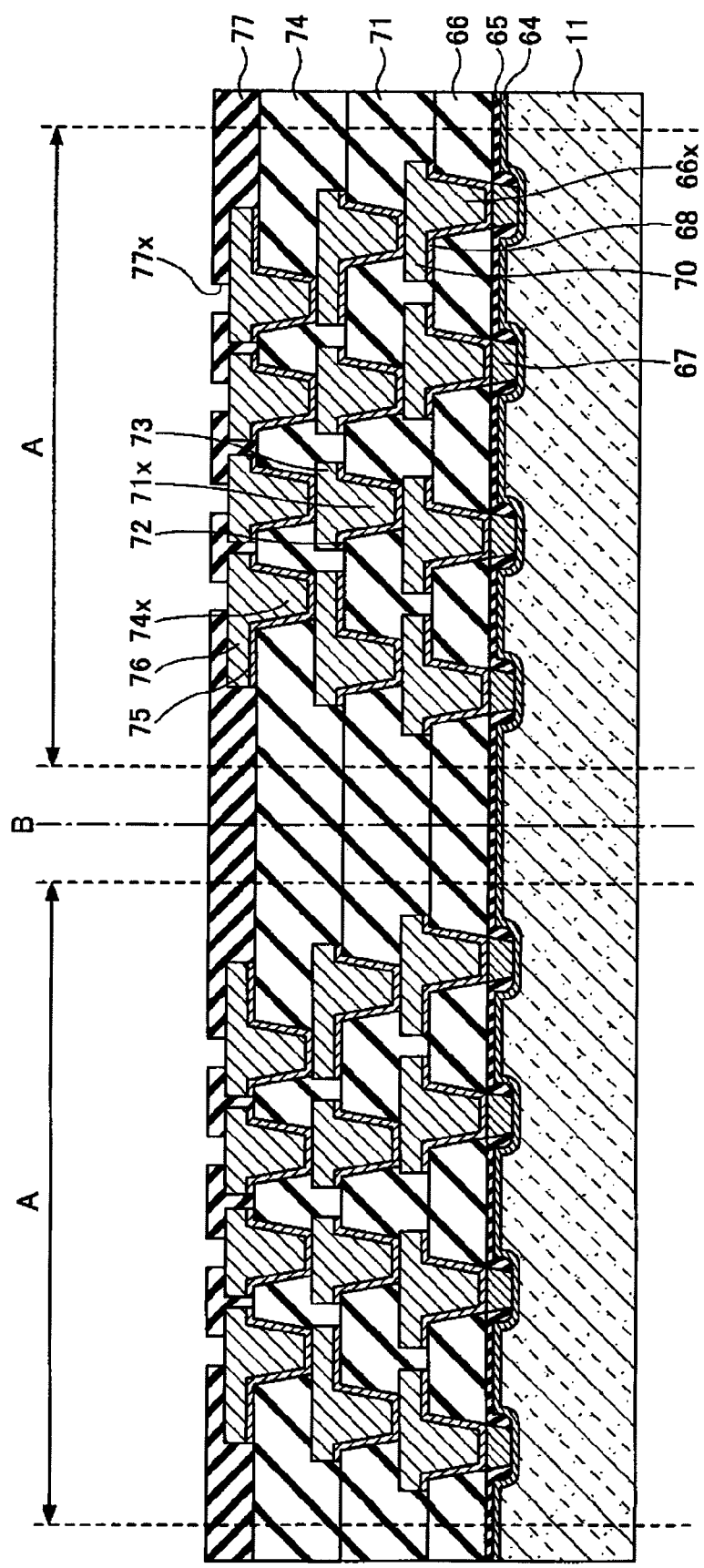
FIG. 41 is a view (No. 3) illustrating the process for manufacturing the assembly wiring board 60 and the wiring board 60a according to the fifth embodiment of the invention.

At a step shown in FIG. 41, then, a buildup wiring layer is formed on the support board 11 through the same steps as those shown in FIGS. 10 to 21 according to the first embodiment of the invention. Although a buildup wiring layer having four layers (first to fourth wiring layers) is formed in the example, it is also possible to form a buildup wiring layer having n layers (n is an integer which is equal to or greater than one)

Figure 42:
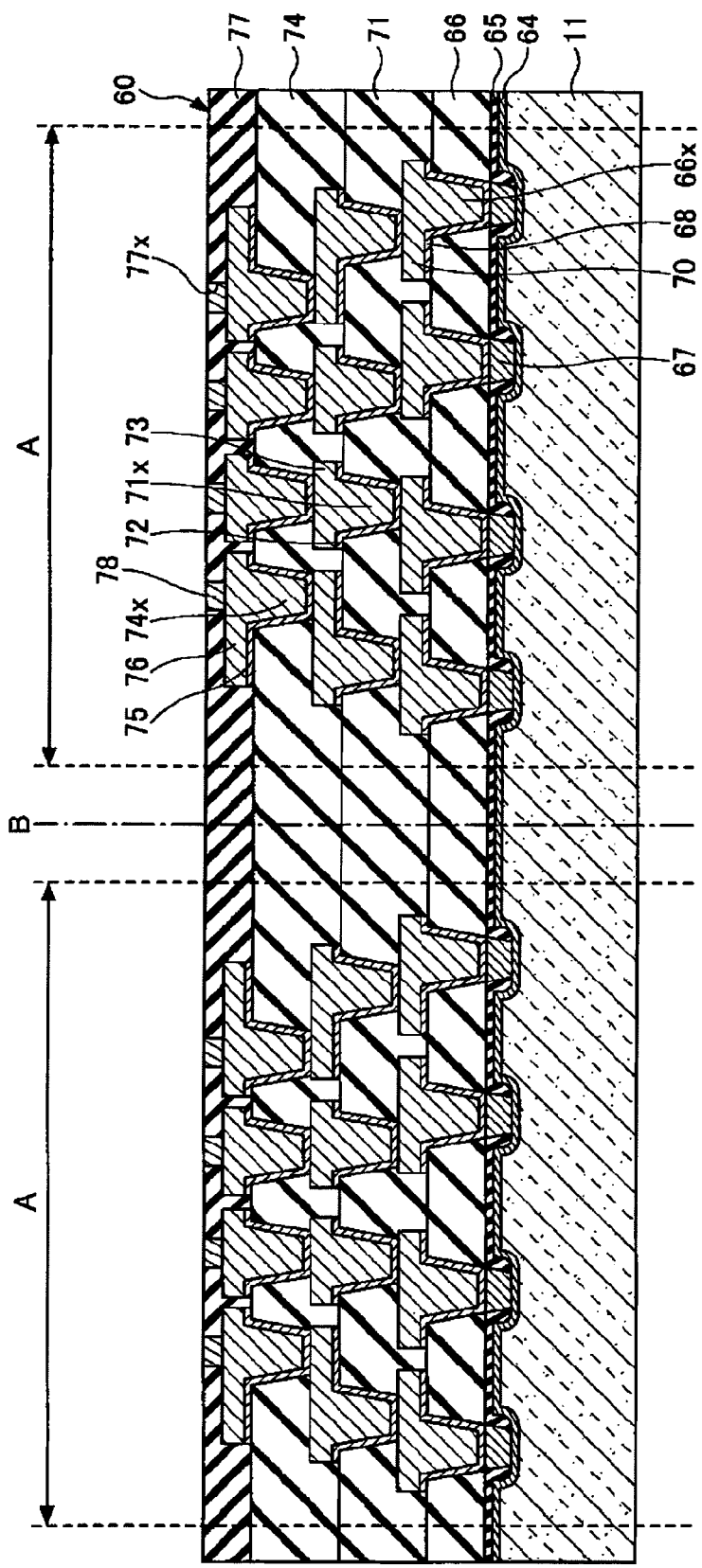
FIG. 42 is a view (No. 4) illustrating the process for manufacturing the assembly wiring board 60 and the wiring board 60a according to the fifth embodiment of the invention.

At a step shown in FIG. 42, thereafter, the fifth metal layer 78 is formed in the part on the fourth wiring layer 76 which corresponds to the opening portion 77x so that the assembly wiring board 60 is completed. The fifth metal layer 78 is obtained by directly forming an Au film on the fourth wiring layer 76 through an electrolytic plating method or a electroless plating method, for example. Moreover, it is also possible to employ a structure in which an Ni film and an Au film may be sequentially laminated on the fourth wiring layer 76, for example. Furthermore, it is also possible to employ a structure in which an Ni film, a Pd film and an Au film are sequentially laminated on the fourth wiring layer 76. The Au film constituting the fifth metal layer 78 can be set to have a thickness of 0.01 μm to 1 μm, for example.

A surface on which the fifth metal layer 78 is formed serves as the semiconductor chip mounting surface on which the semiconductor chip is to be mounted. The fifth metal layer 78 exposed into the opening portion 77x of the solder resist 77 functions as the electrode pad and is electrically connected to the corresponding electrode of the semiconductor chip.

In the structure shown in FIG. 42, the semiconductor chip mounting surface on which the fifth metal layer 78 is formed is provided on an opposite side to a surface placed in contact with the support board 11. Therefore, it is possible to mount the semiconductor chip without removing the support board 11. Accordingly, there is not required the step of providing the auxiliary board 28 in the structure shown in FIG. 42.

Figure 43:
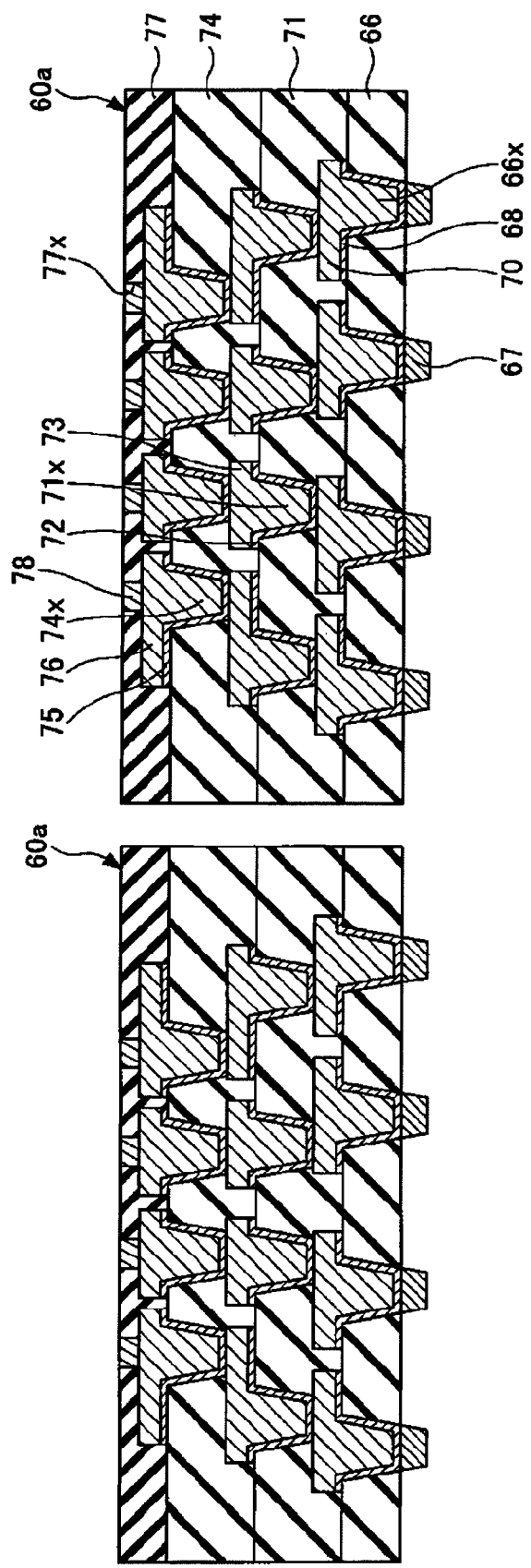
FIG. 43 is a view (No. 5) illustrating the process for manufacturing the assembly wiring board 60 and the wiring board 60a according to the fifth embodiment of the invention.

At a step shown in FIG. 43, subsequently, the assembly wiring board 60 shown in FIG. 42 is cut in the cutting position B by means of a dicing blade so that the assembly wiring board 60 is divided into individual pieces. Then, a predetermined treatment is carried out over a peeling layer 65 after the division into the individual pieces, and the support board 11, the first metal layer 64 and the peeling layer 65 are removed so that a plurality of wiring boards 60a is completed.

It is also possible to cut the assembly wiring board 60 shown in FIG. 42 in the cutting position B by means of the dicing blade, thereby dividing the assembly wiring board 60 into the individual pieces after removing the support board 11, the first metal layer 64 and the peeling layer 65 from the assembly wiring board 60, thereby fabricating the wiring boards 60a.

The predetermined treatment indicates a treatment for carrying out heating to a predetermined temperature (applying a thermal energy) in the case in which a pressure sensitive adhesive double coated tape of a thermal foaming type is stuck as the peeling layer 65, for example. In the case in which a pressure sensitive adhesive double coated tape of a UV (ultraviolet) foaming type is stuck as the peeling layer 65, for example, ultraviolet rays are irradiated (a light energy having a specific wavelength is applied). By the execution of the predetermined treatment, an adhesive strength of the peeling layer 65 is reduced. Consequently, it is possible to easily remove the support board 11, the first metal layer 64 and the peeling layer 65.

By the removal of the support board 11, the first metal layer 64 and the peeling layer 65, the first wiring layer 67 is exposed from the first insulating layer 66. The first wiring layer 67 functions as the electrode pad to be electrically connected to the mother board, for example. Thus, there are manufactured the assembly wiring board 60 and the wiring board 60*a* according to the fifth embodiment of the invention.

Although the description has been given to the example in which the concave portion 63 is formed on the upper surface of the support board 11 and the first wiring layer 67 serving as the electrode pad to be electrically connected to the mother board is formed in the concave portion 63 in the fifth embodiment according to the invention, it is also possible to employ a structure in which the concave portion 63 is not formed on the upper surface of the support board 11 but the first wiring layer 67 is formed on the upper surface of the support board 11 which is flat in the same manner as in the variant of the first embodiment according to the invention.

According to the assembly wiring board 60 and the wiring board 60*a* in accordance with the fifth embodiment of the invention, in the same manner as the assembly wiring board 10 and the wiring board 10*a* according to the first embodiment of the invention, the concave portion 63 is formed on the upper surface of the support board 11 formed of silicon having a low coefficient of thermal expansion and the first wiring layer 67 serving as the electrode pad to be electrically connected to the mother board is provided in the concave portion 63, and furthermore, the buildup wiring layer is provided. Differently from the case of the assembly wiring board 10 and the wiring board 10*a* according to the first embodiment of the invention, the fifth metal layer 78 to be electrically connected to the corresponding electrode of the semiconductor chip is not formed in the concave portion 63 provided on the upper surface of the support board 11 but is formed in a supporting state on the support board 11. Even if heating and cooling are repeated in the process for manufacturing the assembly wiring board 60 and the wiring board 60*a*, therefore, a warpage or a distortion is caused by a thermal stress with difficulty over the buildup wiring layer supported on the support board 11 formed of the silicon having a low coefficient of thermal expansion. In the completion of the assembly wiring board 60 and the wiring board 60*a*, consequently, the pitch P4 of the fifth metal layer 78 can be prevented from being greatly shifted from a desirable pitch.

Since the support board formed of Cu which is used in the process for manufacturing the wiring board 100 according to the related art is removed by wet etching at a final step, moreover, it can be used only once. However, the support board 11 formed of the silicon according to the invention is provided with the peeling layer 65. Consequently, the support board 11 can easily be removed even if the wet etching is not carried out. In the case in which the support board 11 is removed before the assembly wiring board 60 is cut into individual pieces by using the dicing blade, therefore, the support board 11 can be used repetitively. Consequently, it is possible to reduce a manufacturing cost for the assembly wiring board 60 and the wiring board 60*a*.

In the assembly wiring board 60 and the wiring board 60*a*, moreover, the surface on which the semiconductor chip is to be mounted is provided on the opposite side to the surface placed in contact with the support board 11. Therefore, it is possible to mount the semiconductor chip without removing the support board 11. Consequently, the step of providing the auxiliary board 28 is not required so that it is possible to enhance a productivity of the assembly wiring board 60 and the wiring board 60*a*.

Sixth Embodiment

In a sixth embodiment according to the invention, description will be given to a configuration of a semiconductor package in which a semiconductor chip is mounted on a wiring board according to the invention and a method of manufacturing the semiconductor package according to the invention.

Figure 44:
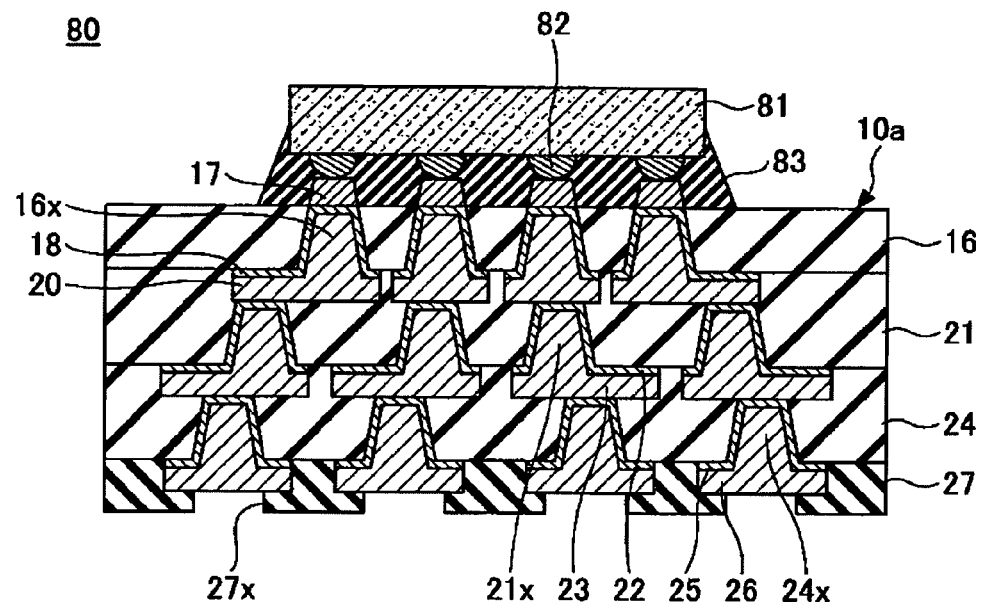
FIG. 44 is a sectional view illustrating a semiconductor package 80 according to the invention.

FIG. 44 is a sectional view illustrating a semiconductor package 80 according to the invention. In FIG. 44, the same components as those shown in FIG. 24 have the same reference numerals and description thereof will be omitted in some cases. With reference to FIG. 44, the semiconductor package 80 has the wiring board 10*a* shown in FIG. 24, a semiconductor chip 81, and an underfill resin 83. The wiring board 10*a* may be manufactured by the manufacturing method according to the first embodiment of the invention or the manufacturing method according to the variant of the first embodiment in accordance with the invention.

In the semiconductor chip 81, a semiconductor integrated circuit (not shown) and an electrode pad (not shown) are formed on a semiconductor substrate (not shown) formed of silicon and having a thickness reduced and a ball-shaped terminal 82 serving as an electrode is formed on the electrode pad (not shown). The ball-shaped terminal 82 of the semiconductor chip 81 is electrically connected to a first wiring layer 17 of the wiring board 10*a*. The underfill resin 83 is filled between the semiconductor chip 81 and a first insulating layer 16.

In the case in which both the ball-shaped terminal 82 of the semiconductor chip 81 and the first wiring layer 17 of the wiring board 10*a* are constituted by a solder, the ball-shaped terminal 82 and the first wiring layer 17 are fused to be an alloy in the mounting of the semiconductor chip 81 so that a single bump is formed.

In the semiconductor package 80 shown in FIG. 44, the wiring board 10*a* is manufactured by providing a concave portion 13 on an upper surface of a support board 11 formed of silicon (a coefficient of thermal expansion approximately 3 to 4 ppm/° C.), forming, in the concave portion 13, the first wiring layer 17 serving as an electrode pad to be electrically connected to a corresponding electrode of a semiconductor chip, and furthermore, forming a buildup wiring layer as described in the first embodiment according to the invention.

As a result, even if heating and cooling are repeated in a process for manufacturing the wiring board 10*a*, a warpage or a distortion is caused by a thermal stress with difficulty over the buildup wiring layer supported on the support board 11 formed of the silicon having a low coefficient of thermal expansion. In a completion of the wiring board 10*a*, therefore, a pitch of the first wiring layer 17 can be prevented from being greatly shifted from a desirable pitch.

On the other hand, in the case in which the silicon is used for the semiconductor substrate constituting the semiconductor chip 81 in the semiconductor package 80 shown in FIG. 44, the coefficient of thermal expansion is low, that is, an approximately 3 to 4 ppm/° C. and a pitch of the ball-shaped terminal 82 serving as the electrode can be prevented from being shifted greatly from a desirable pitch.

For example, also in the case in which the pitch of the first wiring layer 17 (which is equal to the pitch of the ball-shaped terminal 82) is smaller than 100 μm and the first wiring layer 17 and the ball-shaped terminal 82 have sizes reduced correspondingly, accordingly, the first wiring layer 17 of the wiring board 10a and the ball-shaped terminal 82 of the semiconductor chip 81 can be electrically connected to each other without causing a pitch shift.

Figure 45:
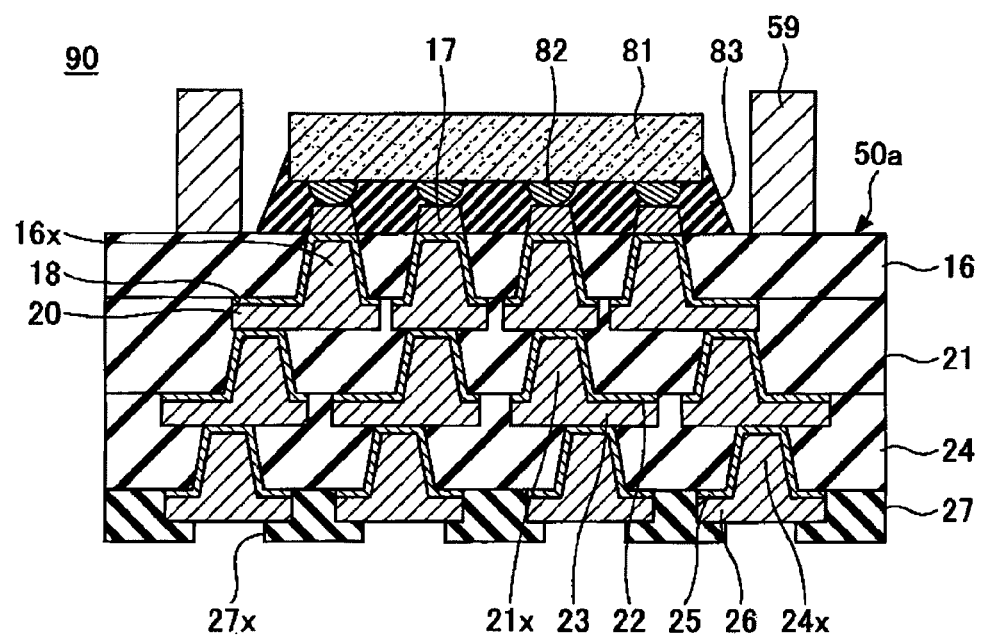
FIG. 45 is a sectional view illustrating a semiconductor package 90 according to the invention.

FIG. 45 is a sectional view illustrating a semiconductor package 90 according to the invention. In FIG. 45, the same components as those shown in FIGS. 37 and 44 have the same reference numerals and description thereof will be omitted in some cases. With reference to FIG. 45, the semiconductor package 90 has a wiring board 50a, a semiconductor chip 81 and an underfill resin 83. The wiring board 50a is obtained by removing an auxiliary board 28 after cutting the assembly wiring board 50 shown in FIG. 37 into individual pieces. The assembly wiring board 50 shown in FIG. 37 may be cut into the individual pieces after the auxiliary board 28 is removed from the assembly wiring board 50.

For the same reason as that in the case of the semiconductor package 80, also in the case in which a pitch of a first wiring layer 17 (which is equal to a pitch of a ball-shaped terminal 82) is smaller than 100 µm and the first wiring layer 17 and the ball-shaped terminal 82 have sizes reduced correspondingly in the semiconductor package 90, for example, the first wiring layer 17 of the wiring board 50a and the ball-shaped terminal 82 of the semiconductor chip 81 can be electrically connected to each other without causing a pitch shift. By providing a reinforcing frame 59 in an outer edge part of a region on which the semiconductor chip 81 is mounted, moreover, it is possible to increase a mechanical strength of the semiconductor package 90.

Figure 46:
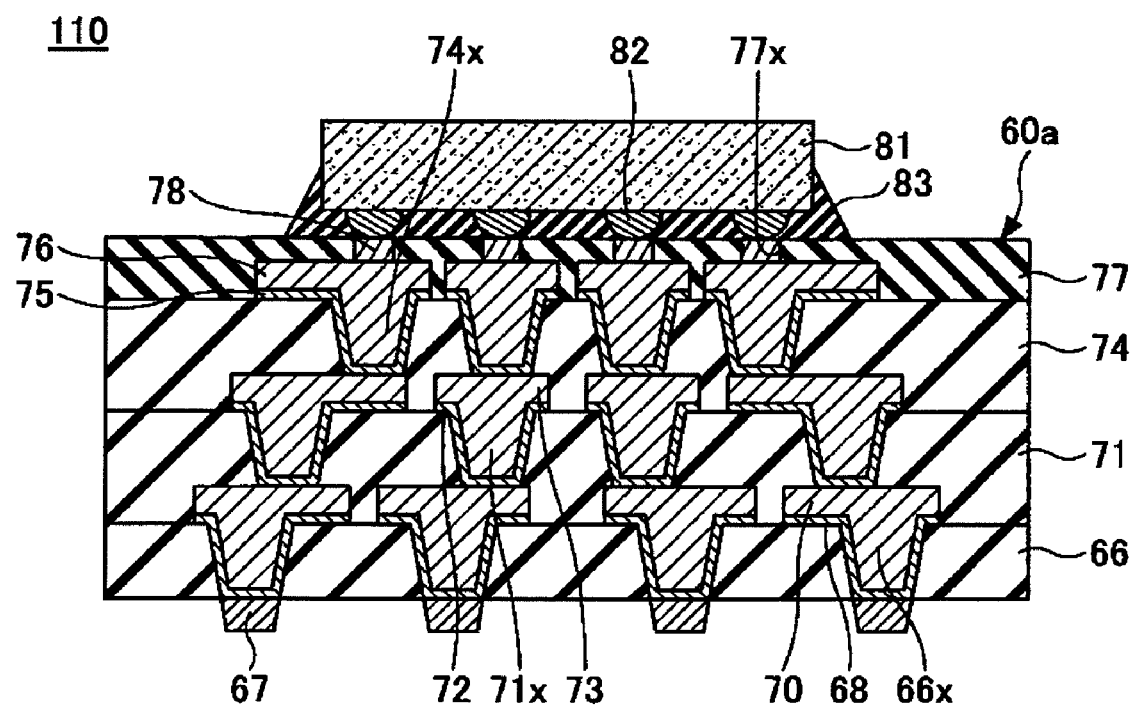
FIG. 46 is a sectional view illustrating a semiconductor package 110 according to the invention.

FIG. 46 is a sectional view illustrating a semiconductor package 110 according to the invention. In FIG. 46, the same components as those shown in FIGS. 43 and 44 have the same reference numerals and description thereof will be omitted in some cases. With reference to FIG. 46, the semiconductor package 110 has the wiring board 60a shown in FIG. 43, a semiconductor chip 81 and an underfill resin 83. A presolder (not shown) is formed on a fifth wiring layer 78 by a solder paste application.

For the same reason as that in the case of the semiconductor package 80, also in the case in which a pitch of the fifth wiring layer 78 (which is equal to a pitch of a ball-shaped terminal 82) is smaller than 100 µm and the fifth wiring layer 78 and the ball-shaped terminal 82 have sizes reduced correspondingly in the semiconductor package 110, for example, the fifth wiring layer 78 of the wiring board 60a and the ball-shaped terminal 82 of the semiconductor chip 81 can be electrically connected to each other without causing a pitch shift.

Although the description has been given to the configurations of the semiconductor packages 80, 90 and 110, a manufacturing method will be described by taking the semiconductor package 80 as an example. FIGS. 47 to 50 are views illustrating a process for manufacturing the semiconductor package 80 according to the invention. In FIGS. 47 to 50, the same components as those shown in FIG. 44 have the same reference numerals and description thereof will be omitted in some cases.

While the assembly wiring board 10 shown in FIG. 23 is prepared, a semiconductor chip 81 is mounted on the assembly wiring board 10 and a division into individual pieces is then carried out to remove an auxiliary board 28 at steps shown in FIGS. 47 to 50, it is also possible to prepare the wiring board 10a shown in FIG. 24 in which the assembly wiring board 10 is cut into the individual pieces and the auxiliary board 28 is removed and to mount the semiconductor chip 81 on the wiring board 10a.

Figure 47:
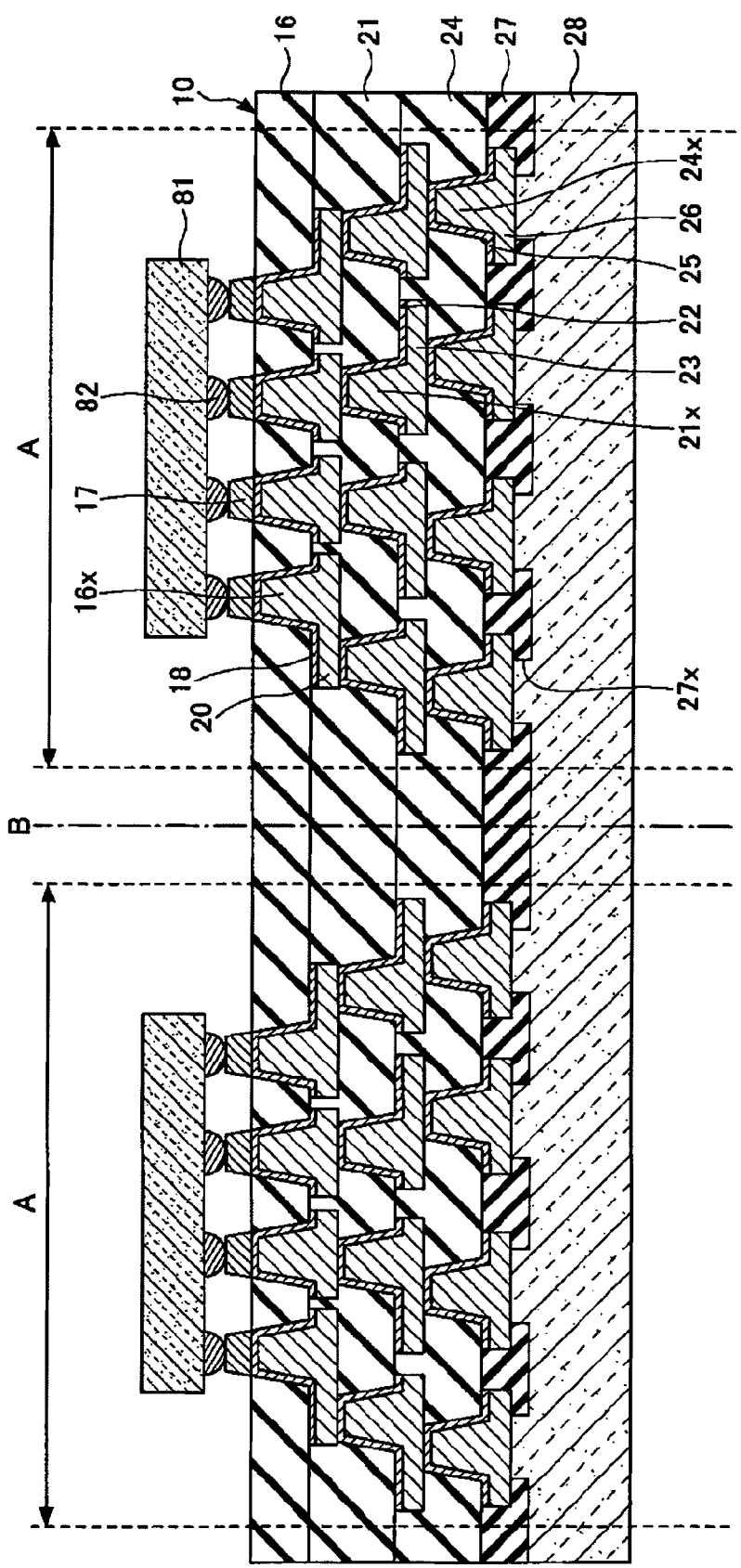
FIG. 47 is a view (No. 1) illustrating a process for manufacturing the semiconductor package 80 according to the invention.

First of all, at the step shown in FIG. 47, the assembly wiring board 10 shown in FIG. 23 is prepared, and the ball-shaped terminal 82 of the semiconductor chip 81 and a first wiring layer 17 of the assembly wiring board 10 are electrically connected to each other. In the case in which both the ball-shaped terminal 82 of the semiconductor chip 81 and the first wiring layer 17 of the assembly wiring board 10 are constituted by a solder, the ball-shaped terminal 82 and the first wiring layer 17 are fused to be an alloy in the mounting of the semiconductor chip 81 so that a single bump is formed.

In the case in which the first wiring layer 17 is not constituted by the solder but a surface plated layer formed of Au and a first wiring layer body formed of Cu, for example, a solder bump (a bonding metal) is formed on the first wiring layer 17. The solder bump is obtained by applying a solder paste to the first wiring layer 17, thereby carrying out a reflow treatment. Moreover, a solder ball may be mounted on the first wiring layer 17.

Figure 48:
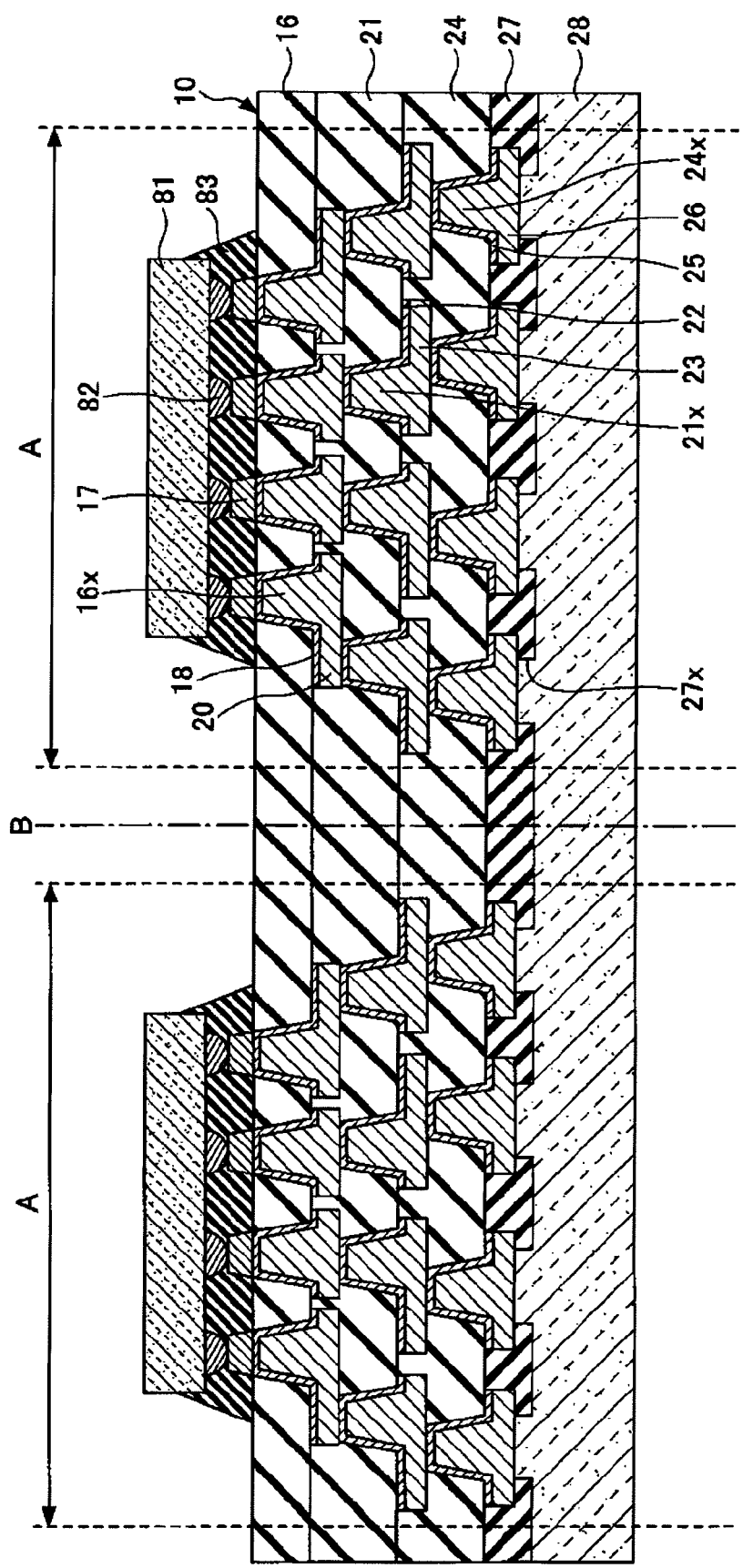
FIG. 48 is a view (No. 2) illustrating the process for manufacturing the semiconductor package 80 according to the invention.

The electrical connection of the ball-shaped terminal 82 of the semiconductor chip 81 and the first wiring layer 17 of the assembly wiring board 10 is carried out by heating to 230° C. to fuse the solder, for example. At the step shown in FIG. 48, subsequently, an underfill resin 83 is filled between the semiconductor chip 81 and a first insulating layer 16. At the step shown in FIG. 49, next, the assembly wiring board 10 shown in FIG. 48 is cut in a cutting position B by means of a dicing blade so that the assembly wiring board 10 is divided into individual pieces to obtain a plurality of wiring boards 10a.

Figure 49:
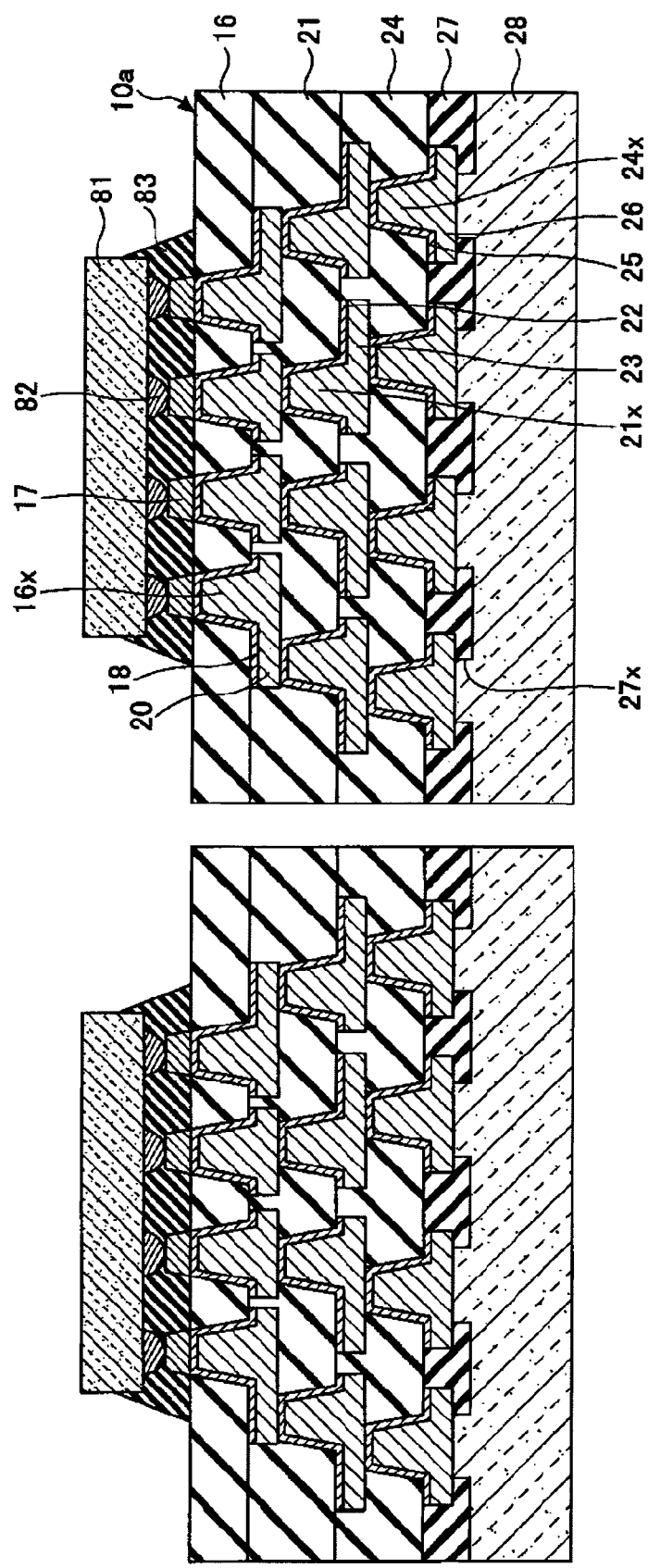
FIG. 49 is a view (No. 3) illustrating the process for manufacturing the semiconductor package 80 according to the invention.
Figure 50:
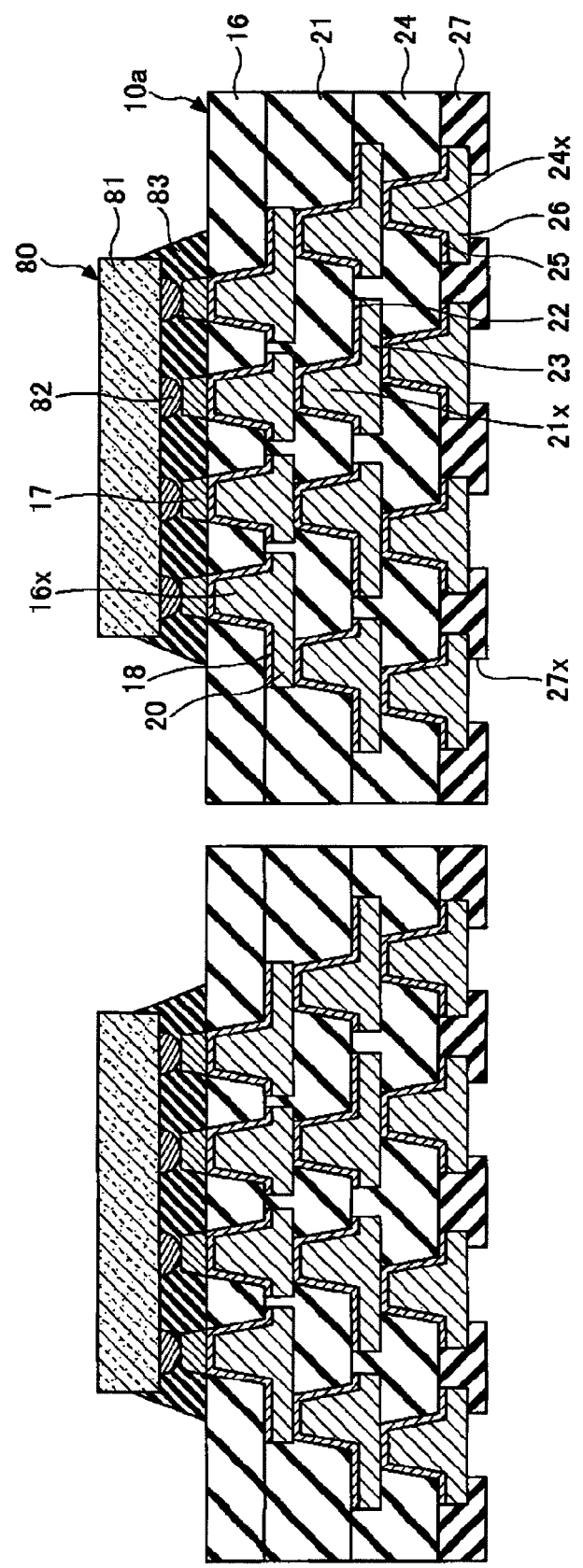
FIG. 50 is a view (No. 4) illustrating the process for manufacturing the semiconductor package 80 according to the invention.

At the step shown in FIG. 50, then, the auxiliary board 28 shown in FIG. 49 is removed so that the semiconductor package 80 is completed. It is also possible to cut the assembly wiring board 10 shown in FIG. 48 in the cutting position B by means of the dicing blade to divide the assembly wiring board 10 into individual pieces after removing the auxiliary board 28 from the assembly wiring board 10, thereby fabricating the semiconductor package 80.

Thus, the semiconductor package 80 is manufactured. The semiconductor packages 90 and 110 are also manufactured by almost the same process as the process for the semiconductor package 80. The semiconductor package 110 shown in FIG. 46 may be manufactured by mounting the semiconductor chip 81 on the assembly wiring board 60 shown in FIG. 38 and then carrying out a predetermined treatment over the peeling layer 65 to remove the support board 11, the first metal layer 64 and the peeling layer 65, and thereafter cutting the assembly wiring board 60 in the cutting position B by means of the dicing blade.

According to the sixth embodiment of the invention, there are used the assembly wiring boards 10, 50 and 60 or the wiring boards 10a, 50a and 60a according to the invention in which the first wiring layer 17 or the fifth wiring layer 78 which serves as the electrode pad to be electrically connected to the corresponding electrode of the semiconductor chip is formed without a great shift from a desirable pitch. For example, also in the case in which the pitch of the first wiring layer 17 or the fifth wiring layer 78 (which is equal to the pitch of the ball-shaped terminal 82) is smaller than 100 µm and the first wiring layer 17 or the fifth wiring layer 78 and the ball-shaped terminal 82 have the sizes reduced correspondingly, therefore, the first wiring layer 17 or the fifth wiring layer 78 and the ball-shaped terminal 82 of the semiconductor chip 81 in the assembly wiring boards 10, 50 and 60 or the wiring boards 10a, 50a and 60a can be electrically connected to each other without causing a pitch shift.

While the preferred embodiments according to the invention have been described above in detail, the invention is not restricted to the embodiments but various modifications and changes can be made to the embodiments without departing from the scope of the invention.

Although the example in which the wiring layer is formed by the semiadditive method has been described in the embodiments, for instance, the wiring layer can be formed by using various methods such as a subtractive method in addition to the semiadditive method.

What is claimed is:

1. A method of manufacturing a wiring board having a semiconductor chip mounting surface for mounting a semiconductor chip thereon, the method comprising:
- a peeling layer forming step of forming a peeling layer on a support board formed by a material having a coefficient of thermal expansion which is equal to that of a semiconductor substrate constituting the semiconductor chip;
- a wiring layer and insulating layer forming step of forming a wiring layer and an insulating layer on the support board; and
- a support board removing step of removing the support board by carrying out a treatment over the peeling layer.

2. The method of manufacturing a wiring board according to claim 1,
- wherein the peeling layer forming step has a first step of forming a concave portion on an upper surface of the support board,
- a second step of forming a metal layer on the upper surface of the support board provided with the concave portion, and
- a third step of forming the peeling layer on the metal layer.

3. The method of manufacturing a wiring board according to claim 1,
- wherein the peeling layer forming step has a first step of forming a concave portion on an upper surface of the support board, and
- a second step of forming the peeling layer on the upper surface of the support board provided with the concave portion.

4. The method of manufacturing a wiring board according to claim 1,
- wherein the support board has a through electrode penetrating a lower surface of the support board from an upper surface thereof, and
- wherein the peeling layer forming step has a first step of forming a concave portion in a corresponding position to the through electrode provided on the upper surface of the support board, and
- a second step of forming the peeling layer on the upper surface of the support board provided with the concave portion.

5. The method of manufacturing a wiring board according to claim 1,
- wherein the peeling layer forming step has a first step of forming a metal layer on an upper surface of the support board, and
- a second step of forming the peeling layer on the metal layer.

6. The method of manufacturing a wiring board according to claim 2, further comprising:
- a first insulating layer forming step of forming a first insulating layer on the peeling layer;
- a through hole forming step of forming a through hole penetrating the peeling layer and the first insulating layer in such a manner that the metal layer in a corresponding position to the concave portion is exposed; and
- a first wiring layer forming step of forming a first wiring layer on the metal layer exposed into the through hole by using the metal layer as a seed layer,
- wherein in the wiring layer and insulating layer forming step, the wiring layer and the insulating layer are formed on the first wiring layer and the first insulating layer.

7. The method of manufacturing a wiring board according to claim 3, further comprising:
- a metal layer forming step of forming a metal layer on the peeling layer;
- a first insulating layer forming step of forming a first insulating layer on the metal layer;
- a through hole forming step of forming a through hole penetrating the first insulating layer in such a manner that the metal layer in a corresponding position to the concave portion is exposed; and
- a first wiring layer forming step of forming a first wiring layer on the metal layer exposed into the through hole by using the metal layer as a seed layer,
- wherein in the wiring layer and insulating layer forming step, the wiring layer and the insulating layer are formed on the first wiring layer and the first insulating layer.

8. The method of manufacturing a wiring board according to claim 4, further comprising:
- a first insulating layer forming step of forming a first insulating layer on the peeling layer;
- a through hole forming step of forming a through hole penetrating the peeling layer and the first insulating layer in such a manner that the through electrode in a corresponding position to the concave portion is exposed; and
- a first wiring layer forming step of forming a first wiring layer on the through electrode exposed into the through hole by using the through electrode as a seed layer,
- wherein in the wiring layer and insulating layer forming step, the wiring layer and the insulating layer are formed on the first wiring layer and the first insulating layer.

9. The method of manufacturing a wiring board according to claim 5, further comprising:
- a first insulating layer forming step of forming a first insulating layer on the peeling layer;
- a through hole forming step of forming a through hole penetrating the peeling layer and the first insulating layer in such a manner that the metal layer in a corresponding position to a position in which the first wiring layer is to be formed is exposed; and
- a first wiring layer forming step of forming a first wiring layer on the metal layer exposed into the through hole by using the metal layer as a seed layer,
- wherein in the wiring layer and insulating layer forming step, the wiring layer and the insulating layer are formed on the first wiring layer and the first insulating layer.

10. The method of manufacturing a wiring board according to claim 6,
- wherein the through hole is formed by transferring a convex shape corresponding to the through hole by using a stamper having a surface on which the convex shape is formed.

11. The method of manufacturing a wiring board according to claim 6,
- wherein the first wiring layer functions as an electrode pad to be electrically connected to a corresponding electrode of the semiconductor chip.

12. The method of manufacturing a wiring board according to claim 1,
- wherein the peeling layer is formed by sticking a member having an adhesive strength reduced with an application of a thermal energy and,
- wherein the treatment indicates a treatment for applying the thermal energy.

13. The method of manufacturing a wiring board according to claim 1,
   wherein the peeling layer is formed by sticking a member having an adhesive strength reduced with an application of a light energy and,
   wherein the treatment indicates a treatment for applying the light energy.

14. The method of manufacturing a wiring board according to claim 1,
   wherein the peeling layer is formed by sticking a member having an adhesive strength reduced with a dissolution into a solvent and,
   wherein the treatment indicates a treatment for carrying out the dissolution into the solvent.

15. The method of manufacturing a wiring board according to claim 1,
   wherein the peeling layer is constituted by $SiO_2$ and,
   wherein the treatment indicates a treatment for removing the $SiO_2$ by etching.

16. The method of manufacturing a wiring board according to claim 1, further comprising:
   an auxiliary board providing step of providing an auxiliary board on a surface at an opposite side to the semiconductor chip mounting surface before the support board removing step.

17. The method of manufacturing a wiring board according to claim 1, further comprising:
   a reinforcing frame providing step of providing a reinforcing frame in an outer edge part of a region of the semiconductor chip mounting surface on which the semiconductor chip is to be mounted.

18. The method of manufacturing a wiring board according to claim 1,
   wherein at least a region of the support board corresponding to a region of the semiconductor chip mounting surface on which the semiconductor chip is to be mounted is constituted by silicon.

19. The method of manufacturing a wiring board according to claim 1,
   wherein at least a region of the support board corresponding to a region of the semiconductor chip mounting surface on which the semiconductor chip is to be mounted is constituted by a borosilicate glass.

20. A method of manufacturing a semiconductor package comprising:
   a semiconductor chip mounting step of mounting a semiconductor chip on a semiconductor chip mounting surface in a wiring board manufactured by the manufacturing method according to claim 1; and
   a resin filling step of filling a resin between the semiconductor chip mounting surface and the semiconductor chip.

* * * * *